United States Patent
Kido et al.

(10) Patent No.: US 11,798,962 B2
(45) Date of Patent: Oct. 24, 2023

(54) SOLID-STATE IMAGING DEVICE WITH A PIXEL HAVING A PARTIALLY SHIELDED PHOTOELECTRIC CONVERSION UNIT REGION FOR HOLDING CHARGE

(71) Applicant: SONY CORPORATION, Tokyo (JP)

(72) Inventors: Hideo Kido, Kanagawa (JP); Masahiro Tada, Kanagawa (JP); Takahiro Toyoshima, Kanagawa (JP); Yasushi Tateshita, Kanagawa (JP); Hikaru Iwata, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 121 days.

(21) Appl. No.: 17/174,640

(22) Filed: Feb. 12, 2021

(65) Prior Publication Data

US 2021/0242256 A1 Aug. 5, 2021

Related U.S. Application Data

(63) Continuation of application No. 16/087,131, filed as application No. PCT/JP2017/010301 on Mar. 15, 2017, now Pat. No. 10,998,357.

(30) Foreign Application Priority Data

Mar. 29, 2016 (JP) ................. 2016-065606

(51) Int. Cl.
H01L 27/146 (2006.01)
H04N 25/585 (2023.01)
(Continued)

(52) U.S. Cl.
CPC .... *H01L 27/14607* (2013.01); *H01L 27/1461* (2013.01); *H01L 27/1463* (2013.01);
(Continued)

(58) Field of Classification Search
CPC .............. H04N 5/35563; H04N 25/585; H01L 27/14605–14607; H01L 27/1461;
(Continued)

(56) References Cited

U.S. PATENT DOCUMENTS 9,590,005 B1 3/2017 Qian et al.
2005/0040440 A1 2/2005 Murakami
(Continued)

FOREIGN PATENT DOCUMENTS

CN 101120285 A 2/2008
CN 102244084 A 11/2011
(Continued)

OTHER PUBLICATIONS

Office Action for JP Patent Application No. 2018-508979, dated Jun. 15, 2021, 03 pages of Office Action and 02 pages of English Translation.

(Continued)

*Primary Examiner* — Younes Boulghassoul
(74) *Attorney, Agent, or Firm* — CHIP LAW GROUP

(57) ABSTRACT

The present technology relates to a solid-state imaging device and an electronic device that can expand a dynamic range in a pixel having a high-sensitivity pixel and a low-sensitivity pixel. The solid-state imaging device includes a pixel array unit in which a plurality of pixels is arranged in a two-dimensional manner, in which the pixel includes a first photoelectric conversion unit and a second photoelectric conversion unit having lower sensitivity than the first photoelectric conversion unit, and a size of the second photoelectric conversion unit in an optical axis direction in which light enters is smaller than a size of the first photoelectric conversion unit in the optical axis direction. The present technology can be applied to a backside-illumination CMOS image sensor, for example.

2 Claims, 52 Drawing Sheets

(51) Int. Cl.
  *H04N 25/621* (2023.01)
  *H04N 25/70* (2023.01)
(52) U.S. Cl.
  CPC .... *H01L 27/1464* (2013.01); *H01L 27/14605* (2013.01); *H01L 27/14609* (2013.01); *H01L 27/14614* (2013.01); *H01L 27/14616* (2013.01); *H01L 27/14623* (2013.01); *H01L 27/14627* (2013.01); *H01L 27/14638* (2013.01); *H01L 27/14641* (2013.01); *H04N 25/585* (2023.01); *H04N 25/621* (2023.01); *H04N 25/70* (2023.01); *H01L 27/14645* (2013.01)
(58) Field of Classification Search
  CPC ......... H01L 27/14812; H01L 27/14623; H01L 27/1463; H01L 27/14818
  See application file for complete search history.

(56) References Cited

U.S. PATENT DOCUMENTS

| | | | |
|---|---|---|---|
| 2005/0062863 | A1 | 3/2005 | Takeuchi et al. |
| 2005/0092894 | A1 | 5/2005 | Fossum |
| 2008/0297609 | A1 | 12/2008 | Song et al. |
| 2010/0328479 | A1 | 12/2010 | Sambongi |
| 2011/0140182 | A1* | 6/2011 | Tanaka ............... H04N 5/37457 257/292 |
| 2011/0141333 | A1* | 6/2011 | Naruse ............... H01L 27/1463 257/E31.127 |
| 2011/0175981 | A1* | 7/2011 | Lai ...................... H04N 13/254 348/46 |
| 2012/0008030 | A1 | 1/2012 | Kono et al. |
| 2013/0076953 | A1 | 3/2013 | Sekine |
| 2013/0175652 | A1 | 7/2013 | Yamazaki et al. |
| 2015/0054997 | A1 | 2/2015 | Hynecek |
| 2015/0130010 | A1 | 5/2015 | Li et al. |
| 2015/0341577 | A1* | 11/2015 | Nakagawara ........ H04N 5/3572 348/250 |
| 2016/0156862 | A1 | 6/2016 | Yoshimura et al. |
| 2016/0234446 | A1* | 8/2016 | Numata ................ H04N 5/378 |
| 2016/0269658 | A1* | 9/2016 | Choi .................. H01L 27/14621 |
| 2016/0343752 | A1 | 11/2016 | Tsai et al. |
| 2016/0372507 | A1* | 12/2016 | Yang ................... H01L 27/1464 |
| 2017/0034466 | A1* | 2/2017 | Numata ............ H01L 27/14621 |
| 2017/0221947 | A1* | 8/2017 | Shishido ................ H04N 5/378 |
| 2018/0115727 | A1 | 4/2018 | Yanagita et al. |
| 2018/0308883 | A1* | 10/2018 | Yanagita ............. H01L 27/1463 |
| 2019/0019820 | A1 | 1/2019 | Takizawa et al. |

FOREIGN PATENT DOCUMENTS

| | | |
|---|---|---|
| CN | 103081457 A | 5/2013 |
| CN | 103247642 A | 8/2013 |
| CN | 105308748 A | 2/2016 |
| EP | 1517374 A2 | 3/2005 |
| JP | 2005-072097 A | 3/2005 |
| JP | 2005-117008 A | 4/2005 |
| JP | 2007-066962 A | 3/2007 |
| JP | 2007-281875 A | 10/2007 |
| JP | 2011-061522 A | 3/2011 |
| JP | 2011238781 A | 11/2011 |
| JP | 2012-034350 A | 2/2012 |
| JP | 2012-079861 A | 4/2012 |
| JP | 2013-033864 A | 2/2013 |
| JP | 2014-175992 A | 9/2014 |
| JP | 2014-229810 A | 12/2014 |
| JP | 2014-232988 A | 12/2014 |
| JP | 2015-026675 A | 2/2015 |
| JP | 2015-029054 A | 2/2015 |
| WO | 2012/042782 A1 | 4/2012 |
| WO | 2015/012098 A1 | 1/2015 |
| WO | WO-2015120983 A1 | 8/2015 |

OTHER PUBLICATIONS

Office Action for JP Patent Application No. 2021-112200, dated Aug. 2, 2022, 04 pages of English Translation and 04 pages of Office Action.

International Search Report and Written Opinion of PCT Application No. PCT/JP2017/010301, dated May 30, 2017, 12 pages of English Translation and 09 pages of ISRWO.

International Preliminary Report on Patentability of PCT Application No. PCT/JP2017/010301, dated Oct. 11, 2018, 12 pages of English Translation and 06 pages of IPRP.

Non-Final Office Action for U.S. Appl. No. 16/087,131, dated May 21, 2020, 09 pages.

Non-Final Office Action for U.S. Appl. No. 16/087,131, dated Nov. 5, 2020, 12 pages.

* cited by examiner

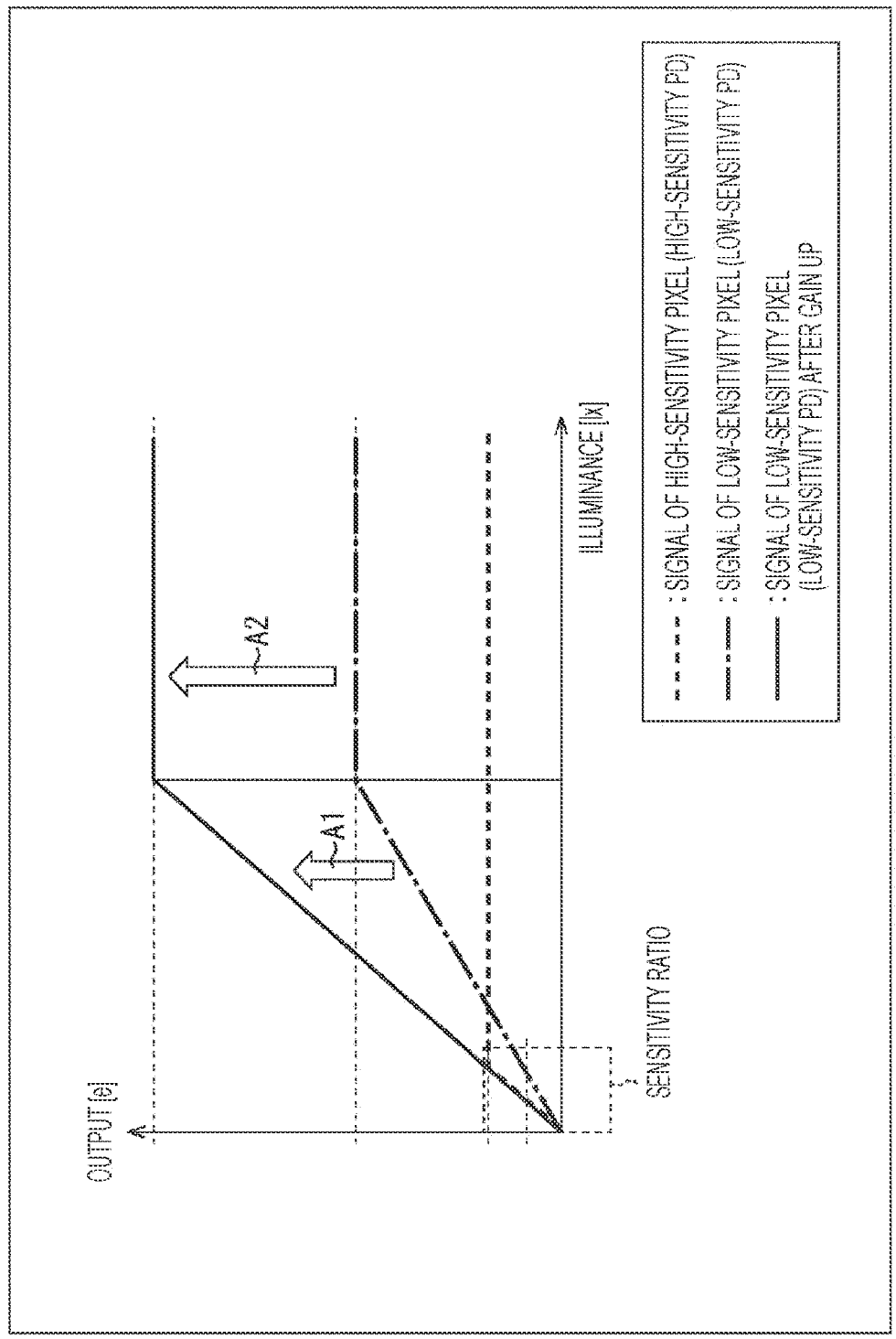

FIG. 6A  WIRING SIDE
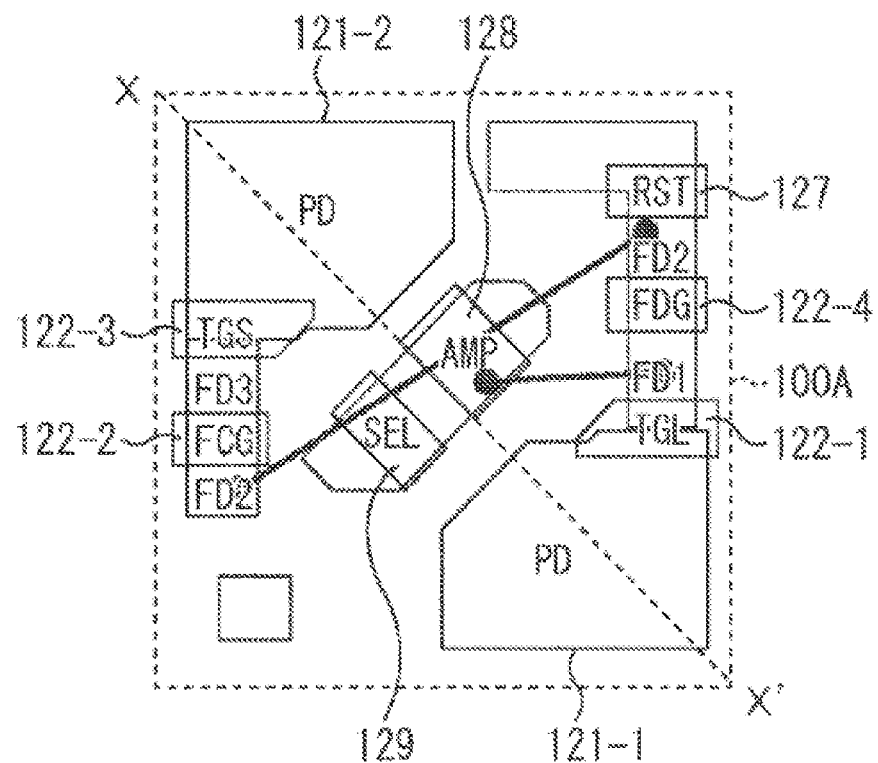
FIG. 6B  LIGHT INCIDENT SIDE
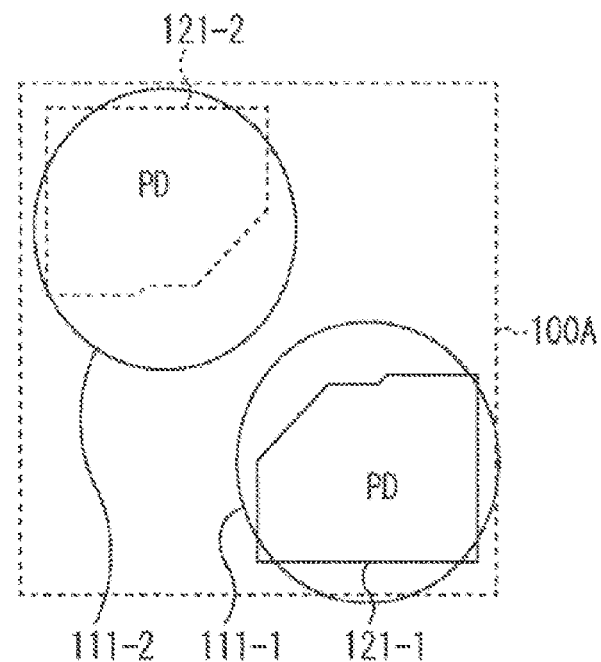

FIG. 8A  WIRING SIDE
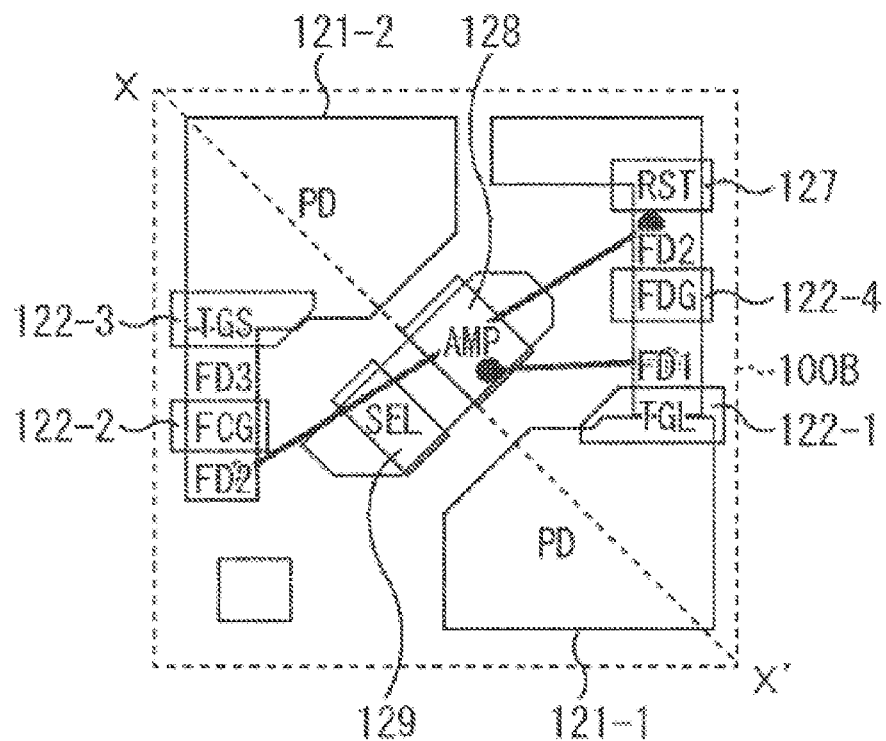
FIG. 8B  LIGHT INCIDENT SIDE
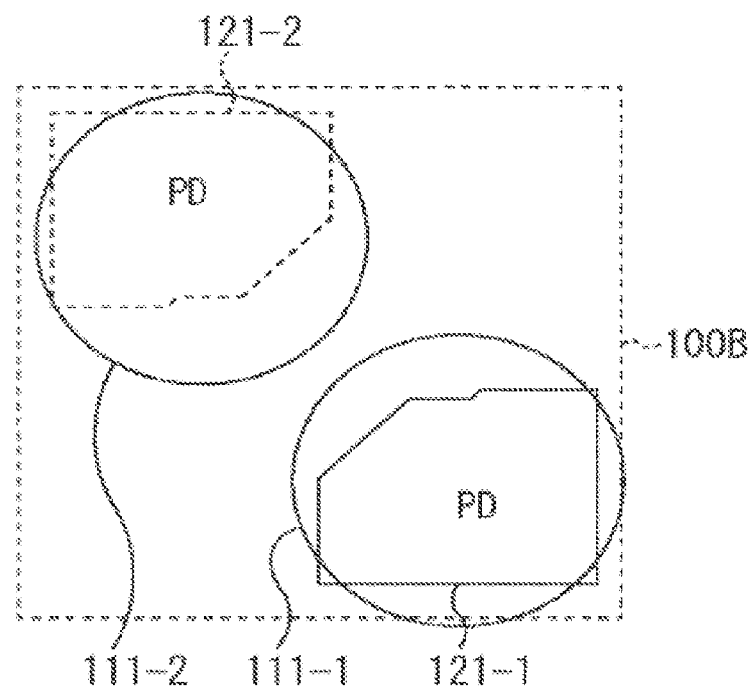

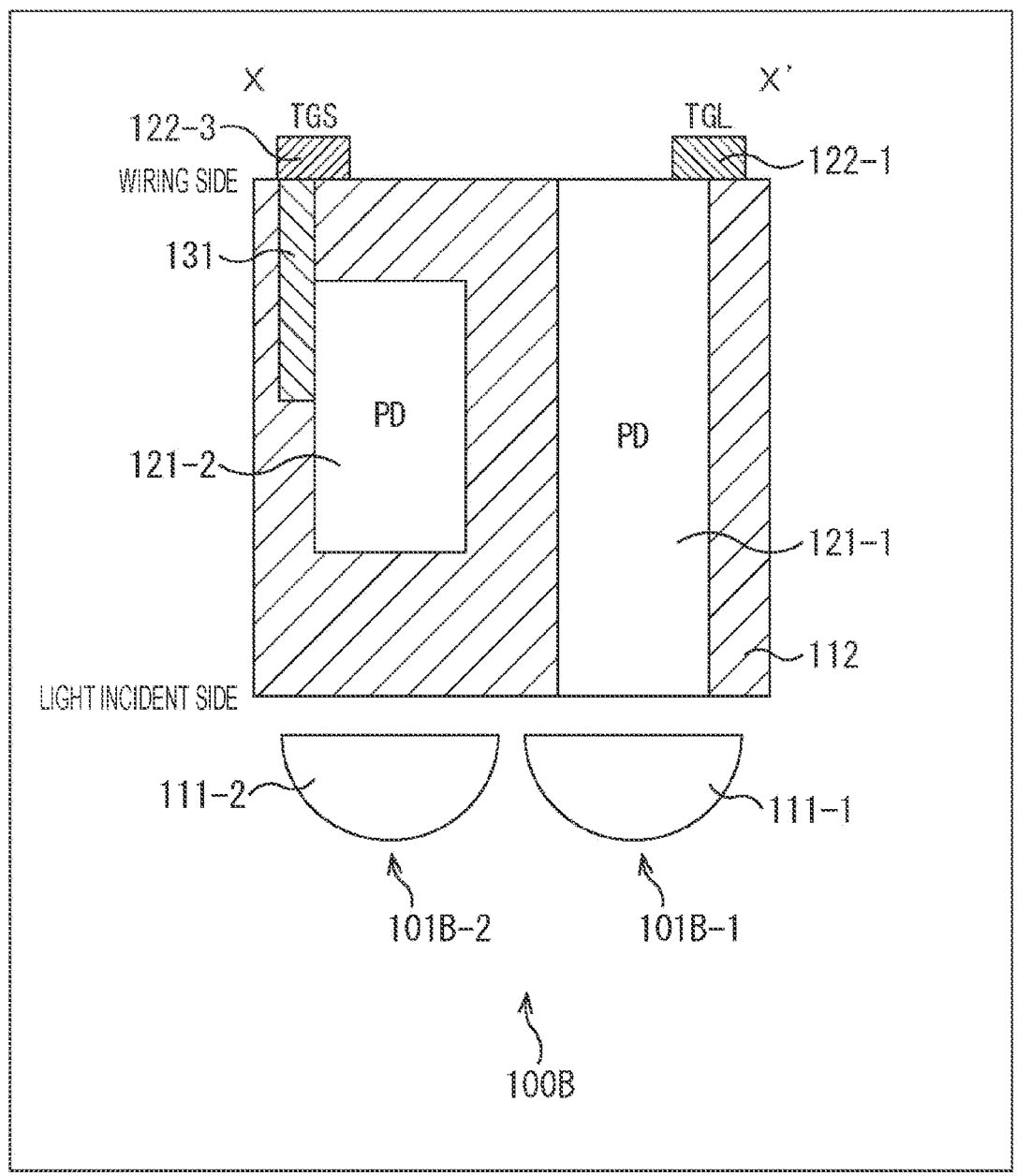

FIG. 10A  WIRING SIDE
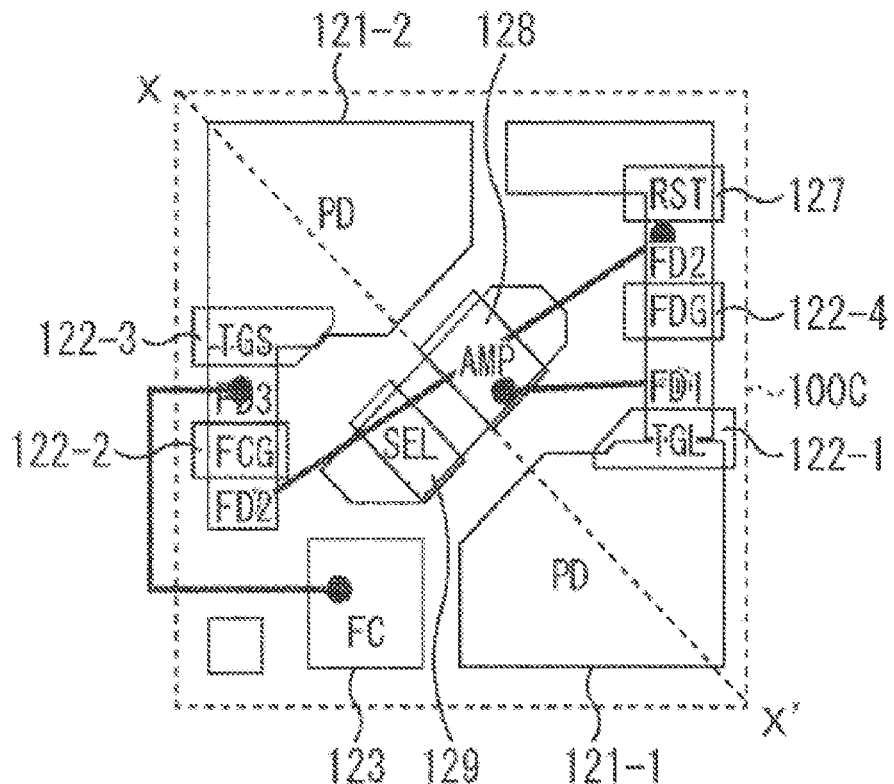
FIG. 10B  LIGHT INCIDENT SIDE
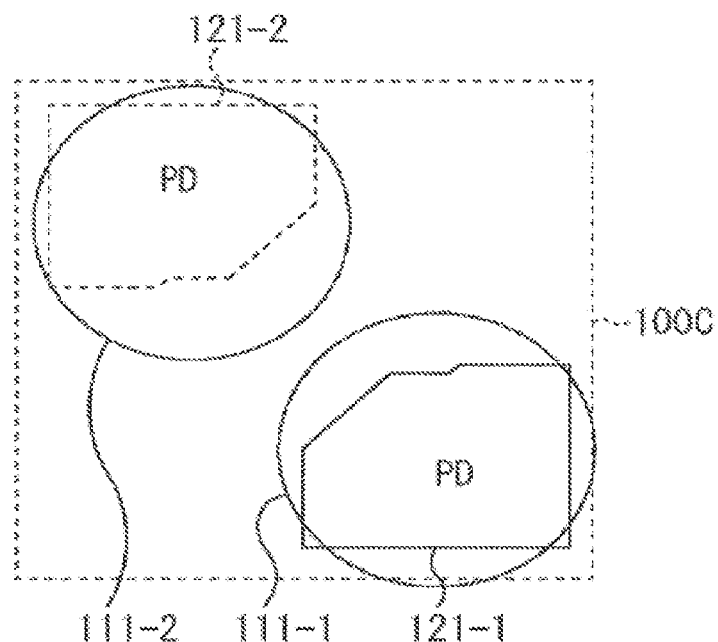

FIG. 12A  WIRING SIDE
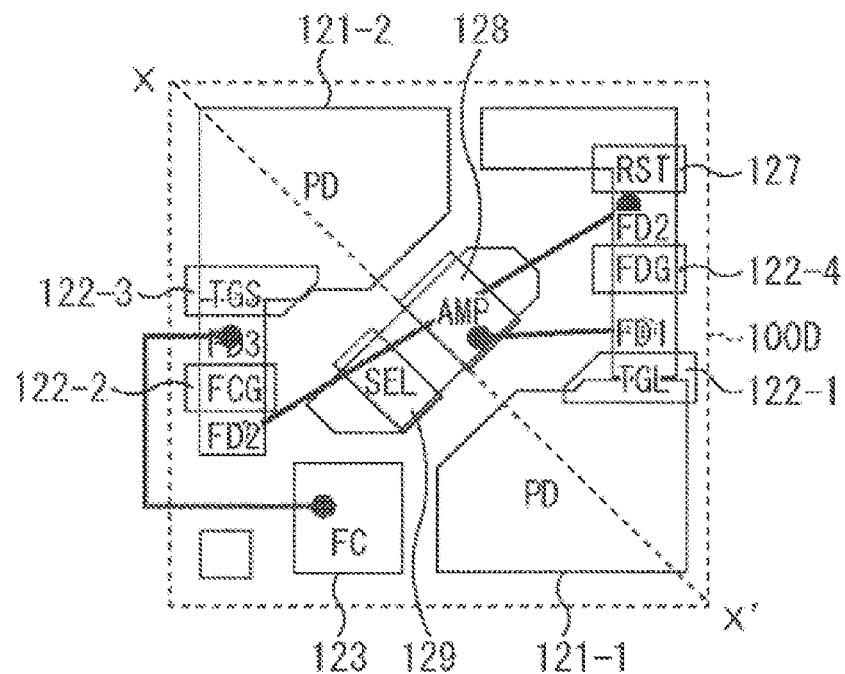
FIG. 12B  LIGHT INCIDENT SIDE
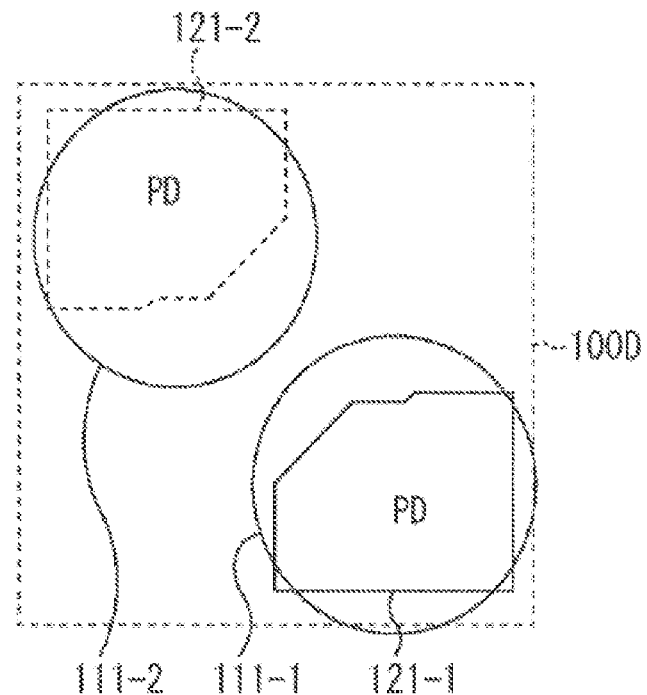

FIG. 14A   WIRING SIDE
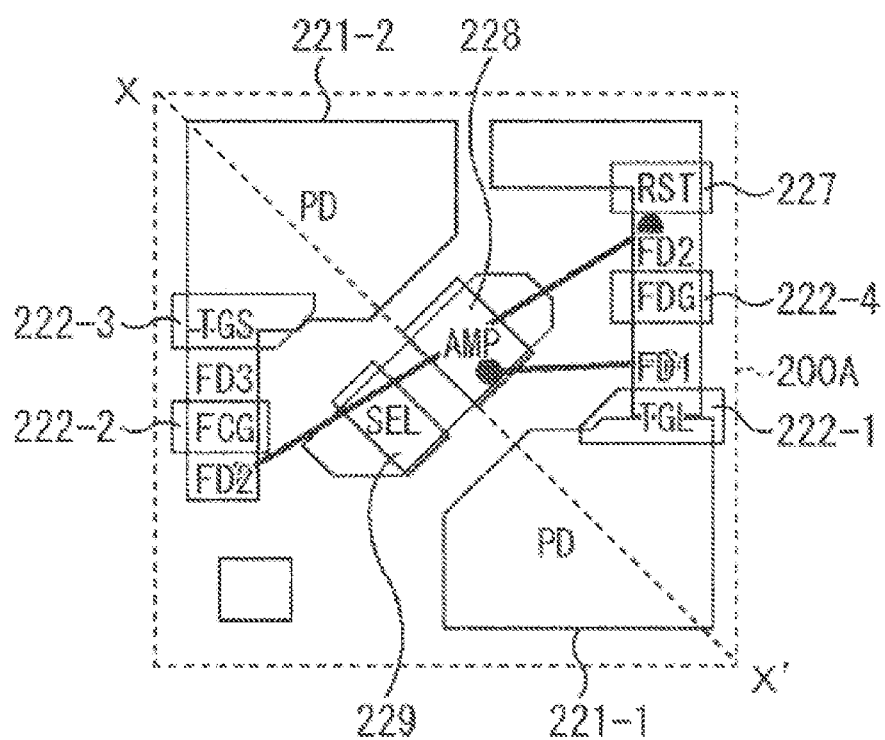
FIG. 14B   LIGHT INCIDENT SIDE
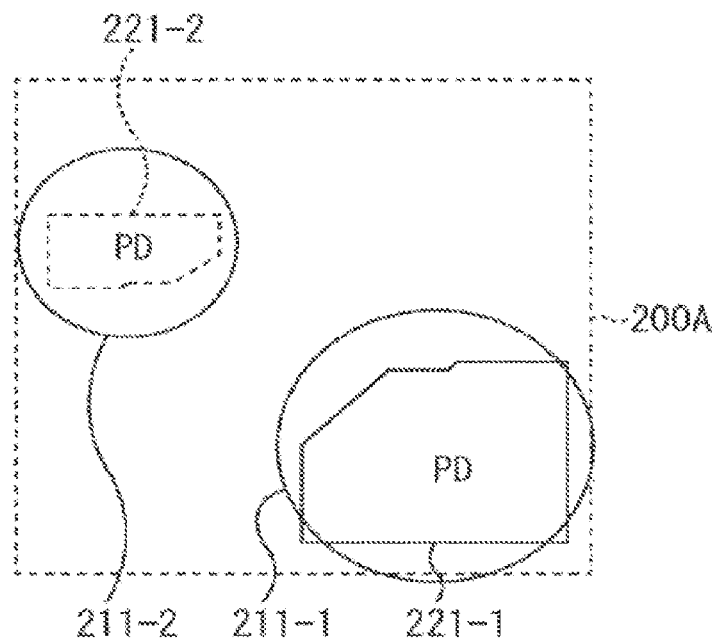

FIG. 16A  WIRING SIDE
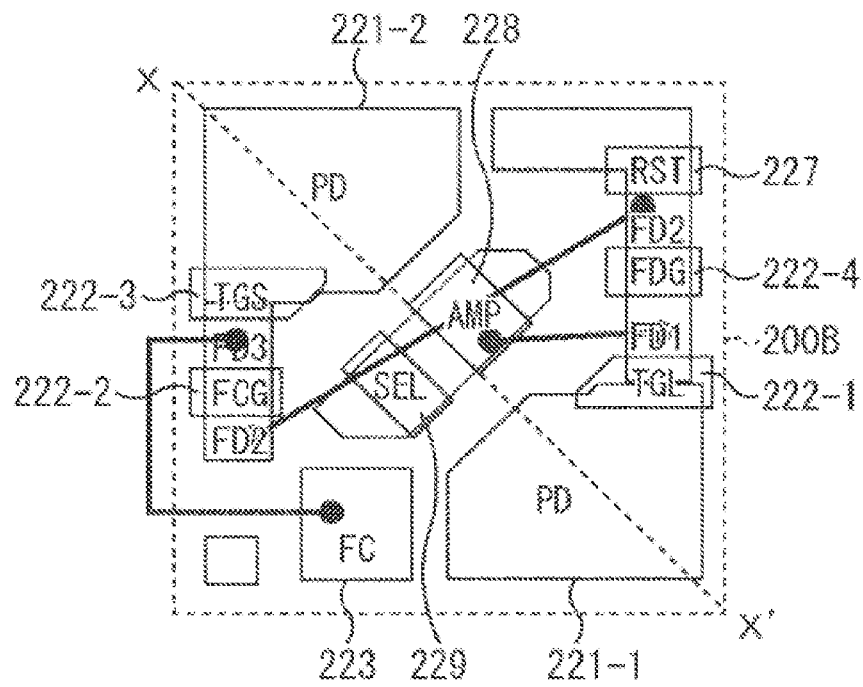
FIG. 16B  LIGHT INCIDENT SIDE
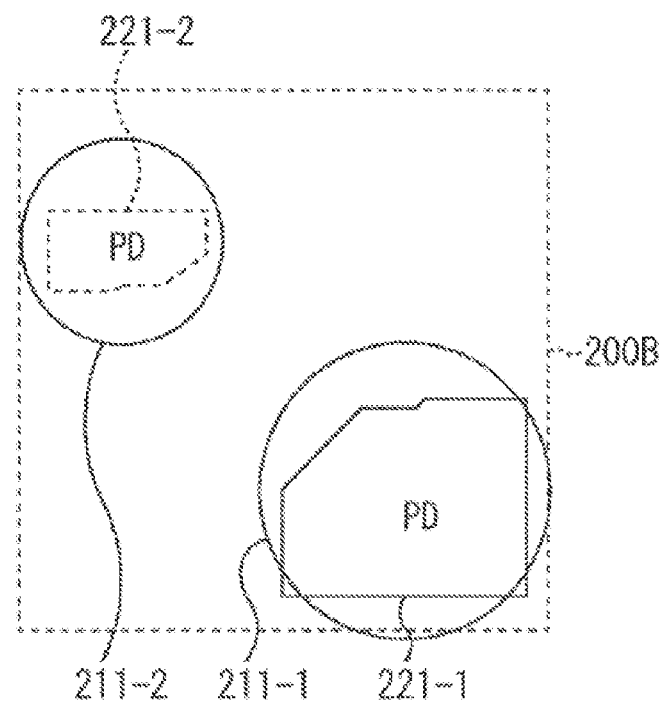

FIG. 18A    WIRING SIDE
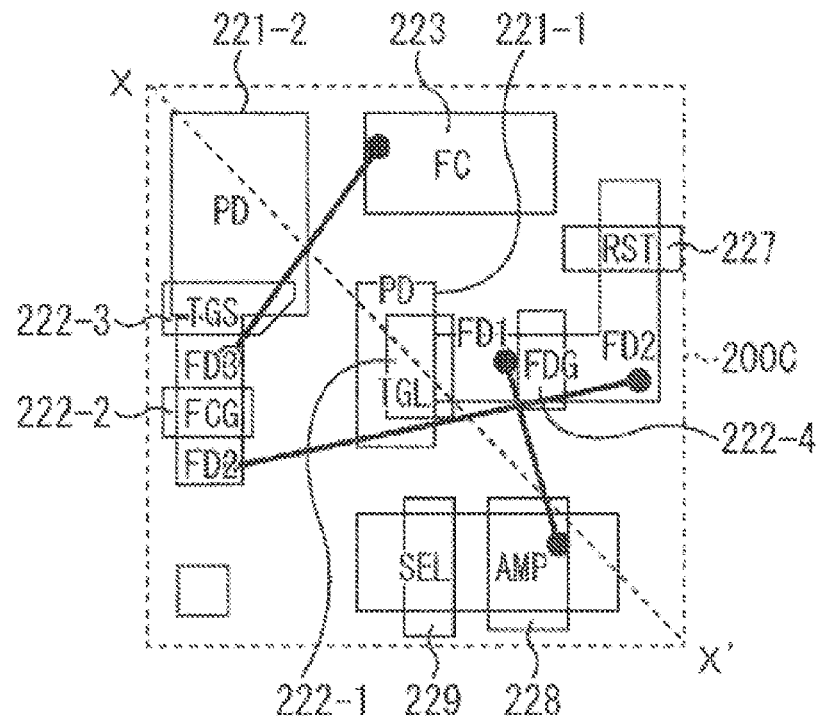
FIG. 18B    LIGHT INCIDENT SIDE
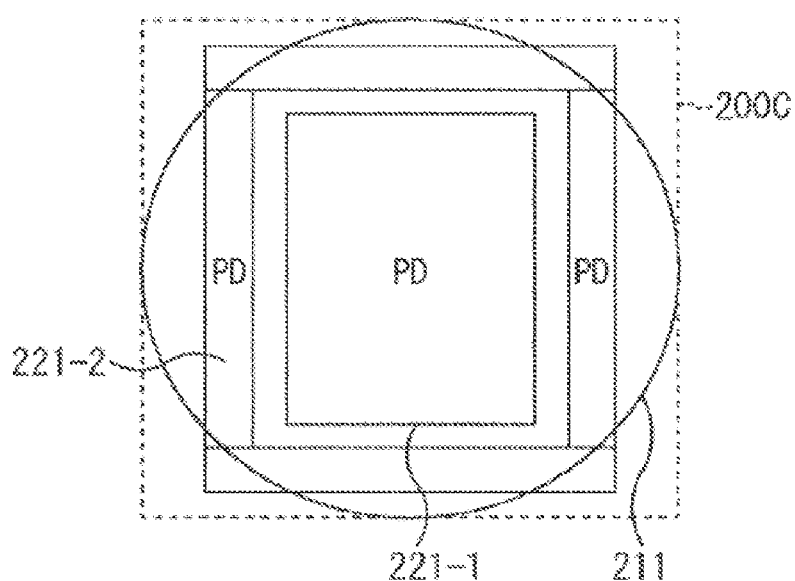

FIG. 20A  WIRING SIDE
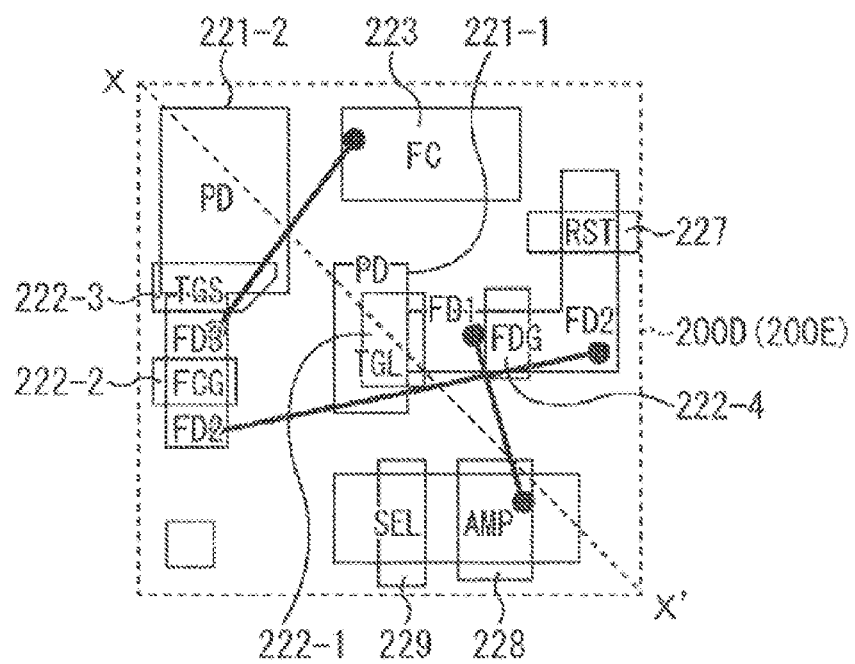
FIG. 20B  LIGHT INCIDENT SIDE
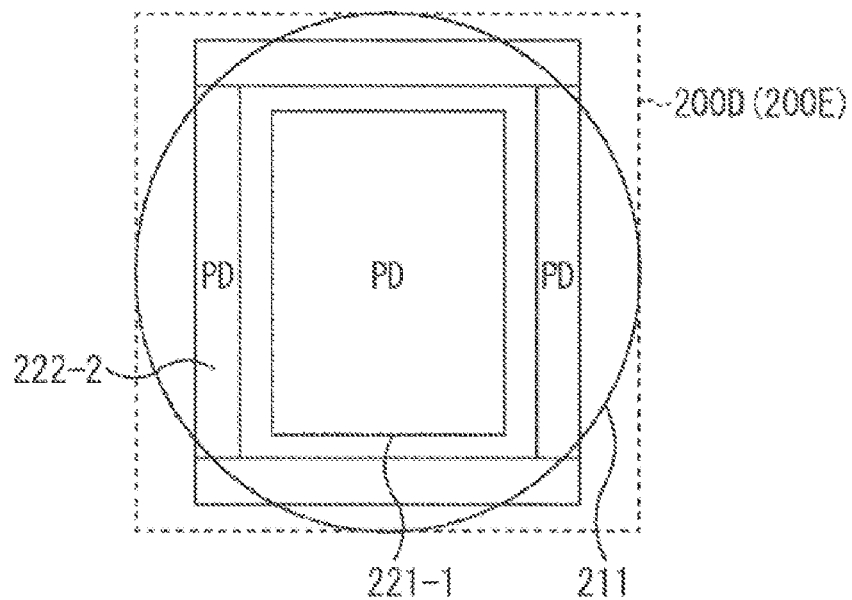

SOLID-STATE IMAGING DEVICE WITH A PIXEL HAVING A PARTIALLY SHIELDED PHOTOELECTRIC CONVERSION UNIT REGION FOR HOLDING CHARGE

CROSS REFERENCE TO RELATED APPLICATIONS

This is a continuation application of U.S. patent application Ser. No. 16/087,131, filed Sep. 21, 2018, which is a U.S. National Phase of International Patent Application No. PCT/JP2017/010301 filed Mar. 15, 2017, which claims priority benefit of Japanese Patent Application No. JP 2016-065606 filed in the Japan Patent Office on Mar. 29, 2016. Each of the above referenced applications is hereby incorporated by reference in its entirety.

TECHNICAL FIELD

The present technology relates to a solid-state imaging device and an electronic device, and in particular to a solid-state imaging device and an electronic device that can expand a dynamic range in a pixel including a high-sensitivity pixel and a low-sensitivity pixel.

BACKGROUND ART

A solid-state imaging device such as a complementary metal oxide semiconductor (CMOS) image sensor is used in an electronic device such as an imaging device such as a digital still camera or a video camera, or a mobile terminal device having an imaging function, for example.

The CMOS image sensor desirably has high sensitivity so that an imaging signal can be acquired at low illuminance. Furthermore, a photodiode is desirably less easily saturated so that the dynamic range becomes large. However, the sensitivity being high and the photodiode being less easily saturated are in a trade-off relationship, and expanding the dynamic range while maintaining the sensitivity is difficult.

Therefore, a CMOS image sensor including both a high-sensitivity pixel and a low-sensitivity pixel, and which expands the dynamic range by the low-sensitivity pixel while maintaining high sensitivity by the high-sensitivity pixel has been proposed (for example, see Patent Document 1).

CITATION LIST

Patent Document

Patent Document 1: WO 2015/012098 A1

SUMMARY OF THE INVENTION

Problems to be Solved by the Invention

By the way, to expand the dynamic range using a difference in sensitivity between the high-sensitivity pixel and the low-sensitivity pixel, further expansion of the dynamic range is required, but at present, such a technology method has not been established yet. Therefore, a technology for further expanding the dynamic range in the pixel including the high-sensitivity pixel and the low-sensitivity pixel has been demanded.

The present technology has been made in view of the foregoing, and enables further expansion of the dynamic range in the pixel including the high-sensitivity pixel and the low-sensitivity pixel.

Solutions to Problems

A solid-state imaging device of a first aspect of the present technology is a solid-state imaging device including a pixel array unit in which a plurality of pixels is arranged in a two-dimensional manner, in which the pixel includes a first photoelectric conversion unit, and a second photoelectric conversion unit having lower sensitivity than the first photoelectric conversion unit, and a size of the second photoelectric conversion unit in an optical axis direction in which light enters is smaller than a size of the first photoelectric conversion unit in the optical axis direction.

A solid-state imaging device of a second aspect of the present technology is a solid-state imaging device including a pixel array unit in which a plurality of pixels is arranged in a two-dimensional manner, in which the pixel includes a first photoelectric conversion unit, and a second photoelectric conversion unit having lower sensitivity than the first photoelectric conversion unit, and a size of the second photoelectric conversion unit in an optical axis direction in which light enters is smaller than a size of the first photoelectric conversion unit in the optical axis direction, and a size of the second photoelectric conversion unit in a plane direction orthogonal to an optical axis on an opposite side of a light incident side is larger than a size of the second photoelectric conversion unit in the plane direction on the light incident side.

A solid-state imaging device of a third aspect of the present technology is a solid-state imaging device including a pixel array unit in which a plurality of pixels is arranged in a two-dimensional manner, in which the pixel includes a first photoelectric conversion unit, a second photoelectric conversion unit having lower sensitivity than the first photoelectric conversion unit, and an in-pixel capacitor that accumulates a charge overflowing from the second photoelectric conversion unit, a size of the second photoelectric conversion unit in an optical axis direction in which light enters is smaller than a size of the first photoelectric conversion unit in the optical axis direction, the second photoelectric conversion unit and the in-pixel capacitor are stacked to cause the second photoelectric conversion unit to be on a light incident side, and a region of the first photoelectric conversion unit is extended to a region securable by causing the second photoelectric conversion unit and the in-pixel capacitor to form a stacked structure.

A solid-state imaging device of a fourth aspect of the present technology is a solid-state imaging device including a pixel array unit in which a plurality of pixels is arranged in a two-dimensional manner, in which the pixel includes a first photoelectric conversion unit, and a second photoelectric conversion unit having lower sensitivity than the first photoelectric conversion unit, and a fine uneven structure is formed on a light incident side of the first photoelectric conversion unit.

A solid-state imaging device of a fifth aspect of the present technology is a solid-state imaging device including a pixel array unit in which a plurality of pixels is arranged in a two-dimensional manner, in which the pixel includes a first photoelectric conversion unit, and a second photoelectric conversion unit having lower sensitivity than the first photoelectric conversion unit, and the second photoelectric conversion unit is formed to surround a periphery of the first photoelectric conversion unit.

An electronic device of a sixth aspect of the present technology is an electronic device including a solid-state imaging device including a pixel array unit in which a plurality of pixels is arranged in a two-dimensional manner, in which the pixel includes a first photoelectric conversion unit, and a second photoelectric conversion unit having lower sensitivity than the first photoelectric conversion unit, and a size of the second photoelectric conversion unit in an optical axis direction in which light enters is smaller than a size of the first photoelectric conversion unit in the optical axis direction.

Effects of the Invention

According to the first to sixth aspects of the present technology, the dynamic range in the pixel including the high-sensitivity pixel and the low-sensitivity pixel can be further expanded.

Note that the effects described here are not necessarily limited and may be any of the effects described in the present disclosure.

BRIEF DESCRIPTION OF DRAWINGS

FIG. 5 is a diagram illustrating a method of expanding a dynamic range of a pixel including a high-sensitivity pixel and a low-sensitivity pixel.

FIGS. 6A and 6B are plan views illustrating a structure of a pixel 100A of a second embodiment.

FIGS. 8A and 8B are plan views illustrating a structure of a pixel 100B of the second embodiment.

FIG. 9 is a cross-sectional view illustrating a structure of the pixel 100B of the second embodiment.

FIGS. 10A and 10B are plan views illustrating a structure of a pixel 100C of the second embodiment.

FIGS. 12A and 12B are plan views illustrating a structure of a pixel 100D of the second embodiment.

FIGS. 14A and 14B are plan views illustrating a structure of a pixel 200A of a third embodiment.

FIGS. 16A and 16B are plan views illustrating a structure of a pixel 200B of the third embodiment.

FIGS. 18A and 18B are plan views illustrating a structure of a pixel 200C of the third embodiment.

FIGS. 20A and 20B are plan views illustrating a structure of a pixel 200D of the third embodiment.

MODE FOR CARRYING OUT THE INVENTION

Hereinafter, embodiments of the present technology will be described with reference to the drawings. Note that the description will be made in the following order.
1. System Configuration
2. First Embodiment: Structure Including Overflow Path in Pixel
3. Second Embodiment: Structure Having Limited Size in Depth Direction of Low-Sensitivity PD
4. Third Embodiment: Structure Having Different Sizes in Plane Direction on Incident Light Side and on Wiring Side of Low-Sensitivity PD
5. Fourth Embodiment: Structure in Which Low-Sensitivity PD, In-Pixel Capacitor, and the Like Are Stacked
6. Fifth Embodiment: Structure Using Moth-Eye Structure for High-Sensitivity PD
7. Sixth Embodiment: Structure in Which Low-Sensitivity PD Surrounds Periphery of High-Sensitivity PD
8. Modification
9. Configuration of Electronic Device
10. Use Example of Solid-State Imaging Device

1. System Configuration (Configuration Example of Solid-State Imaging Device)

Figure 1:
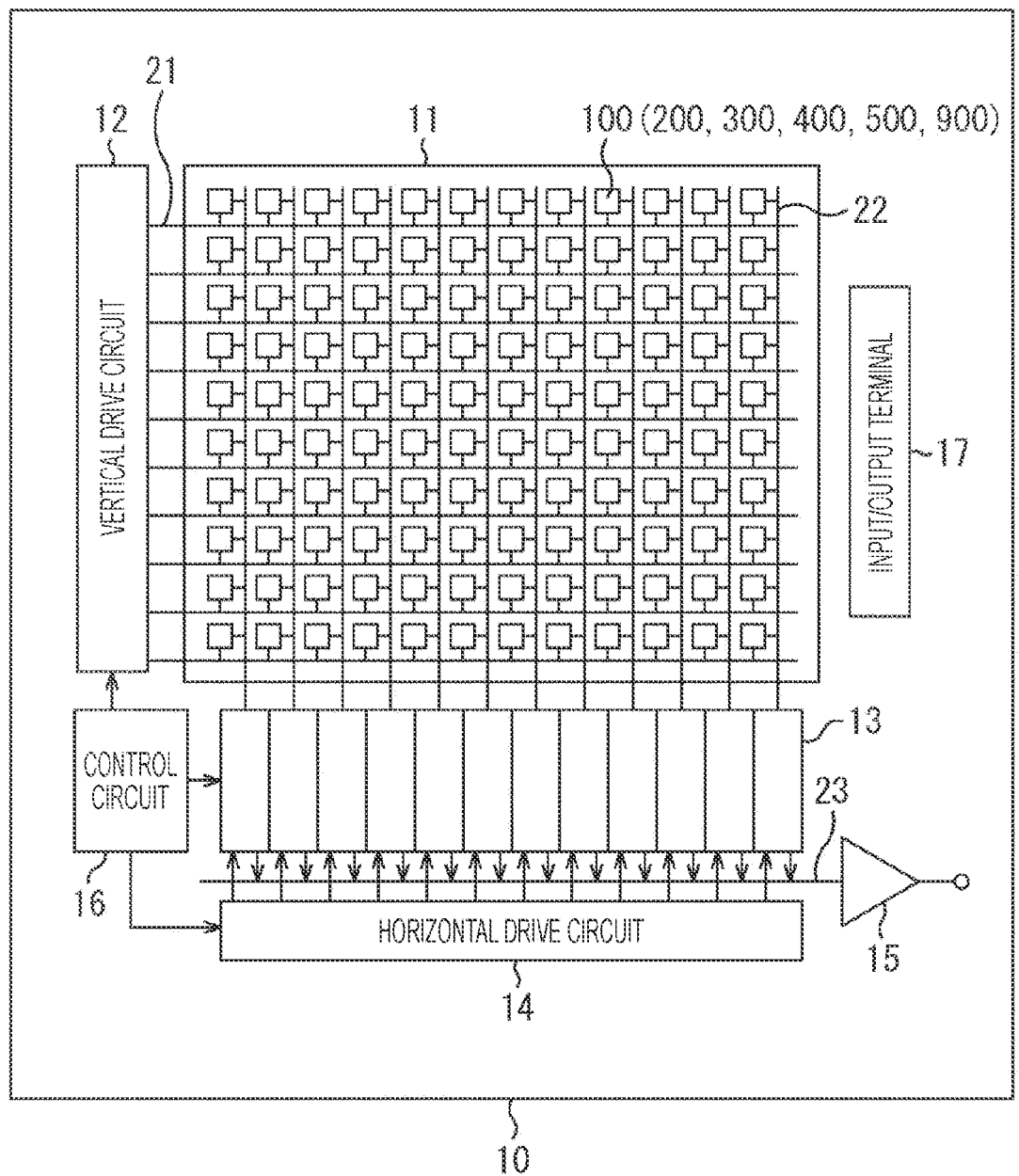
FIG. 1 is a diagram illustrating an embodiment of a solid-state imaging device to which present technology is applied.

FIG. 1 is a diagram illustrating an embodiment of a solid-state imaging device to which present technology is applied.

A CMOS image sensor 10 in FIG. 1 is a solid-state imaging device using a complementary metal oxide semiconductor (CMOS). The CMOS image sensor 10 takes in incident light (image light) from an object via an optical lens system (not illustrated), converts an amount of the incident light imaged on an imaging surface into an electrical signal on a pixel basis, and outputs the electrical signal as a pixel signal.

In FIG. 1, the CMOS image sensor 10 includes a pixel array unit 11, a vertical drive circuit 12, a column signal processing circuit 13, a horizontal drive circuit 14, an output circuit 15, a control circuit 16, and an input/output terminal 17.

The pixel array unit 11 has a plurality of pixels 100 arrayed in a two-dimensional manner. The pixel 100 includes a photodiode as a photoelectric conversion element and a plurality of pixel transistors.

The vertical drive circuit 12 is configured by a shift resistor, for example, and selects a predetermined pixel drive line 21, supplies a pulse for driving the pixels 100 to the selected pixel drive line 21, and drives the pixels 100 on a row basis. In other words, the vertical drive circuit 12 sequentially selectively scans the pixels 100 of the pixel array unit 11 in a vertical direction on a row basis, and supplies a pixel signal based on a signal charge generated according to the amount of received light in the photodiode of each pixel 100 to the column signal processing circuit 13 via the vertical signal line 22.

The column signal processing circuit 13 is arranged in each column of the pixels 100, and performs signal processing such as noise removal for signals output from the pixels 100 of one row for each pixel column. For example, the column signal processing circuit 13 performs signal processing such as correlated double sampling (CDS) for removing a fixed pattern noise unique to a pixel, and analog/digital (A/D) conversion.

The horizontal drive circuit 14 is configured by a shift resistor, for example, and selects each of the column signal processing circuits 13 in turn by sequentially output horizontal scanning pulses, and causes the each of the column signal processing circuits 13 to output the pixel signal to a horizontal signal line 23.

The output circuit 15 performs signal processing for the signals sequentially supplied from the column signal processing circuits 13 through the horizontal signal line 23, and outputs the signals. Note that the output circuit 15 may perform, for example, buffering only or may perform various types of digital signal processing such as black level adjustment and column variation correction.

The control circuit 16 controls the operation of each part of the CMOS image sensor 10. For example, the control circuit 16 receives an input clock signal, data for instructing an operation mode, and the like, and further outputs data such as internal information of the CMOS image sensor 10. In other words, the control circuit 16 generates clock signals and control signals serving as references of the operations of the vertical drive circuit 12, the column signal processing circuit 13, the horizontal drive circuit 14, and the like on the basis of a vertical synchronization signal, a horizontal synchronization signal, and a master clock signal. The control circuit 16 outputs the generated clock signals and control signals to the vertical drive circuit 12, the column signal processing circuit 13, the horizontal drive circuit 14, and the like.

The input/output terminal 17 exchanges signals with an outside.

The CMOS image sensor 10 in FIG. 1 configured as described above is a CMOS image sensor in which the column signal processing circuit 13 that performs the CDS processing and the A/D conversion processing is arranged in each pixel column, which is called column AD system. Furthermore, the CMOS image sensor 10 in FIG. 1 can be a backside-illumination CMOS image sensor.

(Circuit Configuration of Pixel)

Figure 2:
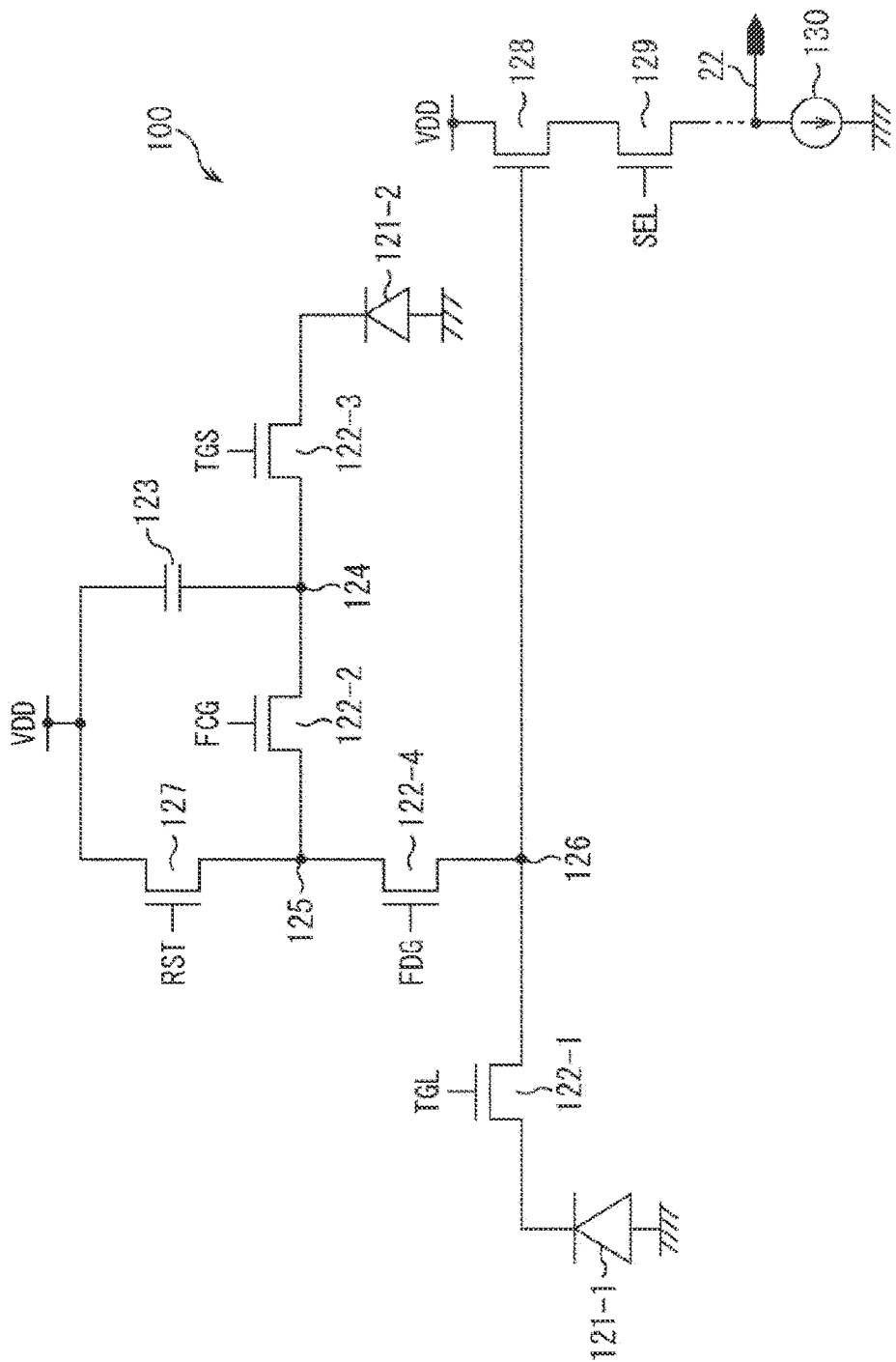
FIG. 2 is a diagram illustrating a circuit configuration example of a pixel.

FIG. 2 is a diagram illustrating a circuit configuration example of the pixel 100 in FIG. 1.

The pixel 100 includes a high-sensitivity photodiode 121-1, a low-sensitivity photodiode 121-2, a first transfer transistor 122-1, a second transfer transistor 122-2, a third transfer transistor 122-3, a fourth transfer transistor 122-4, a charge accumulation unit 123, a floating diffusion (FD) portion 126, a reset transistor 127, an amplifier transistor 128, and a selection transistor 129.

Furthermore, a plurality of drive lines is wired, for example, in each pixel row in the pixel 100, as the pixel drive lines 21 (FIG. 1). Then, various drive signals TGL, TGS, FCG, FDG, RST, and SEL are supplied from the vertical drive circuit 12 (FIG. 1) via the plurality of drive lines. Since the transistors of the pixel 100 are NMOS transistors, these drive signals are pulse signals in which a high-level state (for example, a power supply VDD) is an active state, and a low-level state (for example, a negative potential) becomes an inactive state.

The high-sensitivity photodiode 121-1 is a photoelectric conversion unit including a PN-junction photodiode (PD), for example. The high-sensitivity photodiode 121-1 generates and accumulates a charge according to the amount of received light.

The low-sensitivity photodiode 121-2 is a photoelectric conversion unit including a PN-junction photodiode (PD), for example. The low-sensitivity photodiode 121-2 generates and accumulates a charge according to the amount of received light.

Here, when comparing the high-sensitivity photodiode 121-1 and the low-sensitivity photodiode 121-2, the high-sensitivity photodiode 121-1 has a larger total amount of charges (signal charges) generated per unit illuminance in unit time than the low-sensitivity photodiode 121-2. Accordingly, the high-sensitivity photodiode 121-1 has higher sensitivity, and the low-sensitivity photodiode 121-2 has lower sensitivity.

The first transfer transistor 122-1 is connected between the high-sensitivity photodiode 121-1 and the FD unit 126. The drive signal TGL is applied to a gate electrode of the first transfer transistor 122-1. When the drive signal TGL becomes the active state, a transfer gate of the first transfer transistor 122-1 becomes a conductive state, and the charge accumulated in the high-sensitivity photodiode 121-1 is transferred to the FD unit 126 via the first transfer transistor 122-1.

The second transfer transistor 122-2 is connected between an FD unit 124 and an FD unit 125. The drive signal FCG is applied to a gate electrode of the second transfer transistor 122-2. When the drive signal FCG becomes the active state, a transfer gate of the second transfer transistor 122-2 becomes a conductive state and potentials of the FD unit 124 and the FD unit 125 are coupled.

The third transfer transistor 122-3 is connected between the low-sensitivity photodiode 121-2 and the FD unit 124. The drive signal TGS is applied to a gate electrode of the third transfer transistor 122-3. When the drive signal TGS becomes the active state, a transfer gate of the third transfer transistor 122-3 becomes the conductive state and the charge accumulated in the low-sensitivity photodiode 121-2 is transferred to the charge accumulation unit 123 or a region where the potentials of the FD unit 124 and the FD unit 125 are coupled via the third transfer transistor 122-3.

Note that an overflow path is provided in a channel region of the third transfer transistor 122-3. Therefore, even when the drive signal TGS is in the inactive state, the amount of charges generated as a result of a photoelectric conversion operation in the low-sensitivity photodiode 121-2 exceeds a saturation charge amount (Qs) of the low-sensitivity photodiode 121-2, the charge overflows to the charge accumulation unit 123 via the overflow path provided in the third transfer transistor 122-3.

The fourth transfer transistor 122-4 is connected between the FD unit 125 among the second transfer transistor 122-2, the fourth transfer transistor 122-4, and the reset transistor 127, and the FD unit 126. The drive signal FDG is applied to a gate electrode of the fourth transfer transistor 122-4. When the drive signal FDG becomes the active state, a transfer gate of the fourth transfer transistor 122-4 becomes a conductive state, and potentials of the FD unit 125 among the second transfer transistor 122-2, the reset transistor 127, and the fourth transfer transistor 122-4, and the FD unit 126 are coupled.

The charge accumulation unit 123 includes a capacitor and is connected to the FD unit 124 between the second transfer transistor 122-2 and the third transfer transistor 122-3. A counter electrode of the charge accumulation unit 123 is connected between the power supplies VDD that supply the power supply VDD. The charge accumulation unit 123 accumulates charges transferred or overflowing from the low-sensitivity photodiode 121-2. Note that the charge accumulation unit 123 corresponds to an in-pixel capacitor (floating capacitor: FC) (for example, an in-pixel capacitor 123 in FIGS. 10A and 10B) described below.

The FD unit 126 is a floating diffusion (FD), and converts a charge into a voltage signal and outputs the voltage signal. Note that the FD unit 126 corresponds to "FD1" in a plan view (for example, the plan view of FIG. 6A or the like) described below. Furthermore, the FD unit 125 corresponds to "FD2" in a plan view described below, and the FD unit 124 corresponds to "FD3" in a plan view described below.

The reset transistor 127 is connected between the power supply VDD and the FD unit 125. The drive signal RST and the drive signal FDG are applied to a gate electrode of the reset transistor 127. When the drive signal RST becomes the active state, a reset gate of the reset transistor 127 becomes a conductive state, and the potential of the FD unit 126 is reset to the level of the power supply VDD.

The amplifier transistor 128 has a gate electrode connected to the FD unit 126 and a drain electrode connected to the power supply VDD, and serves as an input unit of a readout circuit for reading the voltage signal held in the FD unit 126, a so-called source follower circuit. In other words, the amplifier transistor 128 has the source electrode connected to the vertical signal line 22 (FIG. 1) via the selection transistor 129, thereby to constitute a source follower circuit with a constant current supply 130 connected to one end of the vertical signal line 22.

The selection transistor 129 is connected between the source electrode of the amplifier transistor 128 and the vertical signal line 22. The drive signal SEL is applied to a gate electrode of the selection transistor 129. When the drive signal SEL becomes the active state, the selection transistor 129 becomes a conductive state, and the pixel 100 becomes a selected state. As a result, the pixel signal output from the amplifier transistor 128 is output to the vertical signal line 22 (FIG. 1) via the selection transistor 129.

The pixel 100 is configured as described above.

Note that, in the following description, a high-sensitivity imaging unit including the high-sensitivity photodiode 121-1, an on-chip lens for allowing light to enter the high-sensitivity photodiode 121-1, and the transfer transistor for transferring the charge generated in the high-sensitivity photodiode 121-1, which is included in the pixel 100 in FIG. 2, is also referred to as "high-sensitivity pixel (high-sensitivity pixel unit)". Furthermore, a low-sensitivity imaging unit including the low-sensitivity photodiode 121-2, an on-chip lens for allowing light to enter the low-sensitivity photodiode 121-2, and the transfer transistor for transferring the charge generated in the low-sensitivity photodiode 121-2, which is included in the pixel 100 in FIG. 2, is also referred to as "low-sensitivity pixel (low-sensitivity pixel unit)".

Furthermore, the pixel 100 illustrated in FIG. 2 can accumulate the charge overflowing from the low-sensitivity photodiode 121-2 by being provided with the charge accumulation unit 123. However, a configuration without the charge accumulation unit 123 can be adopted. Therefore, in embodiments described below, both a structure with the charge accumulation unit 123 and a structure without the charge accumulation unit 123 exist for the low-sensitivity photodiode 121-2.

By the way, the CMOS image sensor 10 can expand the dynamic range, using the different sensitivity between the high-sensitivity pixel including the high-sensitivity photodiode 121-1 and the low-sensitivity pixel including the low-sensitivity photodiode 121-2, and can adopt a plurality of configurations as the configuration. Therefore, hereinafter, first to sixth embodiments according to configurations of a plurality of pixels 100 arranged in a two-dimensional manner in the pixel array unit 11 of the CMOS image sensor 10 will be described.

Note that, in the following description, a pixel of a first embodiment will be described as a pixel 900 for convenience of description and distinguished from pixels of other embodiments. Similarly, the pixels of second to sixth embodiments are described as a pixel 100, a pixel 200, a pixel 300, a pixel 400, and a pixel 500, respectively, and these pixels remain arranged in the pixel array unit 11 of the CMOS image sensor 10 (FIG. 1) in a two-dimensional manner.

2. First Embodiment: Structure Including Overflow Path in Pixel

First, a first embodiment will be described with reference to FIGS. 3 to 5. Note that, in a first embodiment, pixels 900 are provided as the pixels 100 arranged in the pixel array unit 11 of the CMOS image sensor 10 (FIG. 1) in a two-dimensional manner.

(Structure of Pixel)

Figure 3:
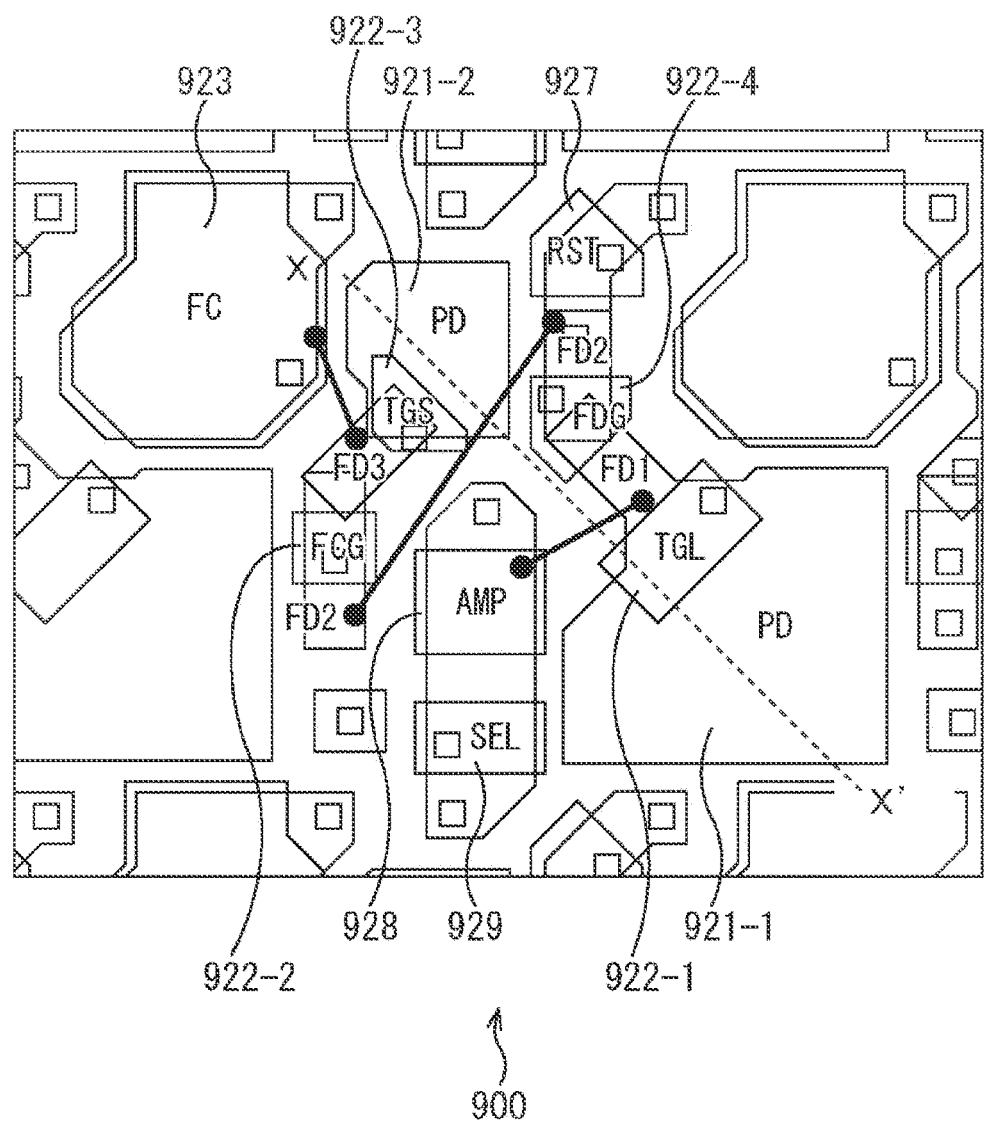
FIG. 3 is a plan view illustrating a structure of a pixel of a first embodiment.

FIG. 3 is a plan view illustrating a structure of the pixel 900 of the first embodiment. Note that FIG. 3 illustrates a plan view of a case where one of the pixels 900 arranged in a two-dimensional manner in the pixel array unit 11 of the backside-illumination CMOS image sensor 10 (FIG. 1) is viewed from a wiring side. Note that the pixel 900 illustrated in FIG. 3 has a similar configuration to the pixel 100 illustrated in FIG. 2.

In FIG. 3, the pixel 900 includes a high-sensitivity photodiode 921-1 and a low-sensitivity photodiode 921-2. Furthermore, in the pixel 900, a first transfer transistor 922-1 to a selection transistor 929 correspond to the first transfer transistor 122-1 to the selection transistor 129 of the pixel 100 in FIG. 2. Moreover, in the pixel 900, an in-pixel capacitor (floating capacitor: FC) 923 corresponds to the charge accumulation unit 123 of the pixel 100 in FIG. 2. A MOS capacitor can be used as an example of the in-pixel capacitor 923.

Figure 4:
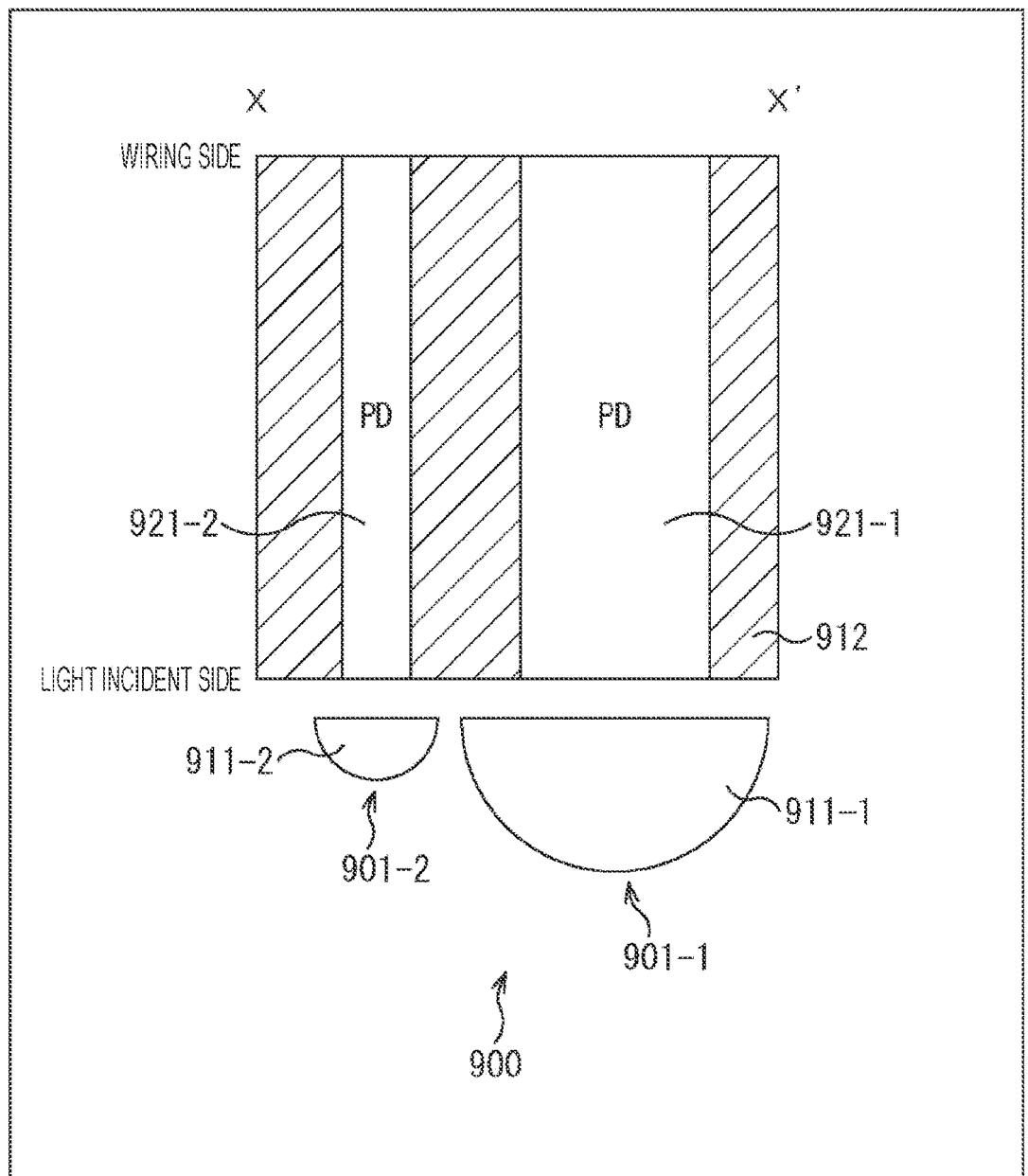
FIG. 4 is a cross-sectional view illustrating a configuration of the pixel of the first embodiment.

Furthermore, when illustrating the cross section of the dotted line XX' on the pixel 900 in FIG. 3, the structure illustrated in the cross-sectional view in FIG. 4 is obtained. In FIG. 4, the high-sensitivity photodiode (PD) 921-1 and the low-sensitivity photodiode (PD) 921-2 are formed on a semiconductor substrate 912.

The high-sensitivity photodiode 921-1 generates and accumulates a charge according to the amount of light entering via an on-chip lens 911-1. The charge accumulated in the high-sensitivity photodiode 921-1 is read out by a pixel circuit. In other words, the on-chip lens 911-1, the high-sensitivity photodiode 921-1, and the pixel circuit constitute a high-sensitivity pixel 901-1.

The low-sensitivity photodiode 921-2 generates and accumulates a charge according to the amount of light entering via an on-chip lens 911-2. The charge accumulated in the low-sensitivity photodiode 921-2 is read out by a pixel circuit. In other words, the on-chip lens 911-2, the low-sensitivity photodiode 921-2, and the pixel circuit constitute a low-sensitivity pixel 901-2.

Here, when comparing the high-sensitivity pixel 901-1 and the low-sensitivity pixel 901-2, the sizes in a depth direction of silicon (Si) (hereinafter, simply referred to as depth direction) of the semiconductor substrate 912 between the high-sensitivity photodiode 921-1 and the low-sensitivity photodiode 921-2 are equal but the sizes in a plane direction (areas of light receiving surfaces) are different.

Specifically, the size in the plane direction (the area of the light receiving surface) of the low-sensitivity photodiode 921-2 is smaller than the size in the plane direction (the area of the light receiving surface) of the high-sensitivity photodiode 921-1. Here, in a photodiode, the amount of charges generated as a result of photoelectric conversion is roughly proportional to the size (thickness) in the depth direction of the photodiode. Furthermore, the amount of charges generated as a result of photoelectric conversion in the photodiode is roughly proportional to the area of the light receiving surface of the photodiode.

In FIG. 4, the sizes (thicknesses) in the depth direction of the photodiodes are equal between the high-sensitivity photodiode 921-1 and the low-sensitivity photodiode 921-2. Therefore, the amounts of charges (signal charges) generated per unit area of the photodiodes under unit time and unit illuminance are equal between the high-sensitivity photodiode 921-1 and the low-sensitivity photodiode 921-2.

On the other hand, the size in the plane direction (the area of the light receiving surface) of the photodiode is smaller in the low-sensitivity photodiode 921-2 than in the high-sensitivity photodiode 921-1. Therefore, a total amount of charges (signal charges) generated in the photodiode under unit time and unit illuminance is smaller in the low-sensitivity photodiode 921-2 than in the high-sensitivity photodiode 921-1. More specifically, the total amount of changes becomes small in proportion to the area of the light receiving surface of the photodiode. Accordingly, the sensitivity is different between the high-sensitivity photodiode 921-1 and the low-sensitivity photodiode 921-2, and the low-sensitivity photodiode 921-2 has lower sensitivity than the high-sensitivity photodiode 921-1.

Further, the saturation charge amount (Qs) of the photodiode is roughly proportional to the size in the plane direction (the area of the light receiving surface) of the photodiode. Since both the amount of charges generated as a result of photoelectric conversion in the photodiode and the saturation charge amount (Qs) of the photodiode are roughly proportional to the area of the light receiving surface of the photodiode, the high-sensitivity photodiode 921-1 and the low-sensitivity photodiode 921-2 are saturated at the same illuminance when the illuminance is increased while both the high-sensitivity photodiode 921-1 and the low-sensitivity photodiode 921-2 are irradiated with light of the same illuminance. In other words, the amount of charges generated in each photodiode has reached the saturation charge amount (Qs) of each photodiode at the same illuminance.

Then, when the illuminance is further increased, the low-sensitivity photodiode 921-2 can allow the charge generated according to the illuminance to overflow to the in-pixel capacitor 923 and accumulates the charge, and can output the charge as the signal charge even when the amount of charges generated as a result of photoelectric conversion exceeds the saturation charge amount (Qs) of the low-sensitivity photodiode 921-2. Meanwhile, the high-sensitivity photodiode 921-1 allows the generated charge to overflow to a P well layer that is a P-type impurity region around the high-sensitivity photodiode 921-1 when the amount of charges generated as a result of photoelectric conversion exceeds the saturation charge amount (Qs) of the high-sensitivity photodiode 921-1. In this manner, the charge overflowing to the P well layer is absorbed in a drain region of the NMOS transistor provided in the pixel 900 having the same structure as the pixel 100 illustrated in FIG. 2, and is not used as the signal charge.

Such characteristics are illustrated in FIG. 5. FIG. 5 illustrates input/output characteristics in the low-sensitivity pixel unit (low-sensitivity pixel 901-2) provided with the in-pixel capacitor 923 and the low-sensitivity photodiode 921-2 and the high-sensitivity pixel unit (high-sensitivity pixel 901-1) provided with the high-sensitivity photodiode 921-1. In FIG. 5, the horizontal axis represents the illuminance of light radiated to each photodiode, and the vertical axis represents the amount of charges output from each photodiode. Furthermore, the dotted line in FIG. 5 illustrates the input/output characteristic of the high-sensitivity pixel unit (high-sensitivity pixel 901-1), and the one dot chain line in FIG. 5 illustrates the input/output characteristic of the low-sensitivity pixel unit (low-sensitivity pixel 901-2).

In FIG. 5, in the high-sensitivity pixel unit, the charge generated as a result of photoelectric conversion reaches the saturation charge amount (Qs) and the output is saturated at the illuminance lower than the low-sensitivity pixel unit. Meanwhile, the low-sensitivity pixel unit outputs the signal charge corresponding to the illuminance even at the illuminance where the output of the high-sensitivity pixel unit is saturated. In other words, in the input/output characteristics illustrated in FIG. 5, the low-sensitivity pixel unit has a wider input range (a wider illuminance range in which the output according to the illuminance can be obtained) than the high-sensitivity pixel unit, and thus has a wider output range (a wider range of the amount of charges to be output) accordingly. In other words, it can be said that the low-sensitivity pixel unit has a wider dynamic range than the high-sensitivity pixel unit.

Here, as illustrated in FIG. 1, the CMOS image sensor 10 provided with the pixel 900 includes an amplifier that multiplies the output of the low-sensitivity pixel unit by a gain. As an example, the column signal processing circuit 13 illustrated in FIG. 1 includes the amplifier, for example. Hereinafter, an operation of the amplifier will be described with reference to FIG. 5.

As described above, the high-sensitivity pixel unit has higher sensitivity than the low-sensitivity pixel in the illuminance region where the output is not saturated. Therefore, in the illuminance region where the output (the dotted line) of the high-sensitivity pixel unit is not saturated in (the dotted line of a "sensitivity ratio" of) FIG. 5, the slope of the high-sensitivity pixel unit is larger than the slope of the output (the one dot chain line) of the low-sensitivity pixel unit. In other words, in the illuminance region, the high-sensitivity pixel unit has a larger signal output than the low-sensitivity pixel unit, and thus understandably has a larger signal-to-noise ratio (S/N ratio, hereinafter referred to as S/N) than the low-sensitivity pixel unit.

Furthermore, in (the outside of the dotted line of the "sensitivity ratio" in) FIG. 5, the output according to the illuminance can be obtained from the low-sensitivity pixel unit in the region where the output of the high-sensitivity pixel unit is saturated. However, the slope of the low-sensitivity pixel unit is smaller than the slope of the output before the high-sensitivity pixel unit is saturated. Therefore, the CMOS image sensor 10 (FIG. 1) provided with the pixel 900 amplifies the output obtained from the low-sensitivity pixel unit by the gain using the amplifier described above (for example, the amplifier provided in the column signal processing circuit 13 in FIG. 1).

More specifically, in FIG. 5, the output of the low-sensitivity pixel unit is multiplied by the gain so that the slope of the output of the high-sensitivity pixel unit before saturation, and the slope of the output after so-called gain up, which is obtained by multiplying the output of the low-sensitivity pixel unit before saturation by the gain become the same. The solid line in FIG. 5 illustrates the output of the low-sensitivity pixel unit after the gain up (the arrows A1 and A2 in FIG. 5).

With the configuration, a linear output (a linear amount of charges output from the photodiode) with respect to the input (the illuminance of light radiated to the photodiode) can be obtained from the illuminance range where the high-sensitivity pixel unit outputs the charge according to the illuminance to the illuminance range where the low-sensitivity pixel unit outputs the charge according to the illuminance.

Furthermore, as described above, the output before saturation of the high-sensitivity pixel unit illustrated by the dotted line in FIG. 5 has a higher S/N ratio than the output before saturation of the low-sensitivity pixel unit illustrated by the one dot chain line in FIG. 5. In other words, the output of the low-sensitivity pixel unit has a lower S/N ratio than the output of the high-sensitivity pixel unit.

Therefore, the CMOS image sensor 10 (FIG. 1) provided with the pixel 900 can output data based on the output of the high-sensitivity pixel unit as pixel data of an imaging result in the illuminance range where the high-sensitivity pixel unit in FIG. 5 outputs the charge according to the illuminance, and can output data based on the output of the low-sensitivity pixel unit after gain up as pixel data of an imaging result in the illuminance range exceeding the aforementioned illuminance range.

As a result, the CMOS image sensor 10 (FIG. 1) provided with the pixel 900 can obtain a wider dynamic range in the direction of high illuminance than the conventional technology and a favorable S/N characteristic in the low-illuminance region.

Note that, as a modification of the first embodiment, the CMOS image sensor 10 (FIG. 1) provided with the pixel 900 may output data based on the output of the low-sensitivity pixel unit without being amplified by the gain, as the pixel data of an imaging result, without providing the amplifier for multiplication by the gain. In this case, it is desirable to multiply the data based on the output of the low-sensitivity pixel unit by the gain on a device side that receives the output of the CMOS image sensor 10.

3. Second Embodiment: Structure Having Limited Size in Depth Direction of Low-Sensitivity PD Next, a second embodiment will be described with reference to FIGS. 6A, 6B, 7, 8A, 8B, 9, 10A, 10B, 11, 12A, 12B, and 13.

By the way, in the first embodiment, the size in the plane direction of the low-sensitivity photodiode of the low-sensitivity pixel is formed to be smaller than the size in the plane direction of the high-sensitivity photodiode of the high-sensitivity pixel. In the second embodiment, the size in a depth direction of a low-sensitivity photodiode of a low-sensitivity pixel is limited to reduce the amount of charges generated as a result of photoelectric conversion. As a result, the size in a plane direction of the low-sensitivity photodiode of the low-sensitivity pixel can be made equal to or larger than the size in the plane direction of the high-sensitivity photodiode.

Note that in the second embodiment, pixels 100A to 100D will be described as pixels 100 arranged in a pixel array unit 11 of a CMOS image sensor 10 (FIG. 1) in a two-dimensional manner. The pixels 100A and 100B have a structure without including an in-pixel capacitor 123 whereas the pixels 100C and 100D have a structure including the in-pixel capacitor 123. Accordingly, pixel circuits of the pixels 100C and 100D correspond to the configuration of the pixel circuit illustrated in FIG. 2 whereas pixel circuits of the pixels 100A and 100B correspond to a configuration of a case where no in-pixel capacitor 123 is provided in the pixel circuit illustrated in FIG. 2.

(1-A) Basic Structure: A Structure with a Limited Size in a Depth Direction of a Low-Sensitivity PD First, the pixel 100A having a structure with a limited size in a depth direction of a low-sensitivity photodiode (PD) will be described with reference to the plan view in FIGS. 6A and 6B and the cross-sectional view in FIG. 7.

FIGS. 6A and 6B are plan views illustrating a structure of the pixel 100A. Note that, in FIGS. 6A and 6B, FIG. 6A illustrates a plan view of a case where one of the pixels 100A arranged in the pixel array unit 11 of the CMOS image sensor 10 (FIG. 1) in a two-dimensional manner is viewed from the wiring side, and FIG. 6B illustrates a plan view of a case where the pixel 100A is viewed from the light incident side.

Figure 7:
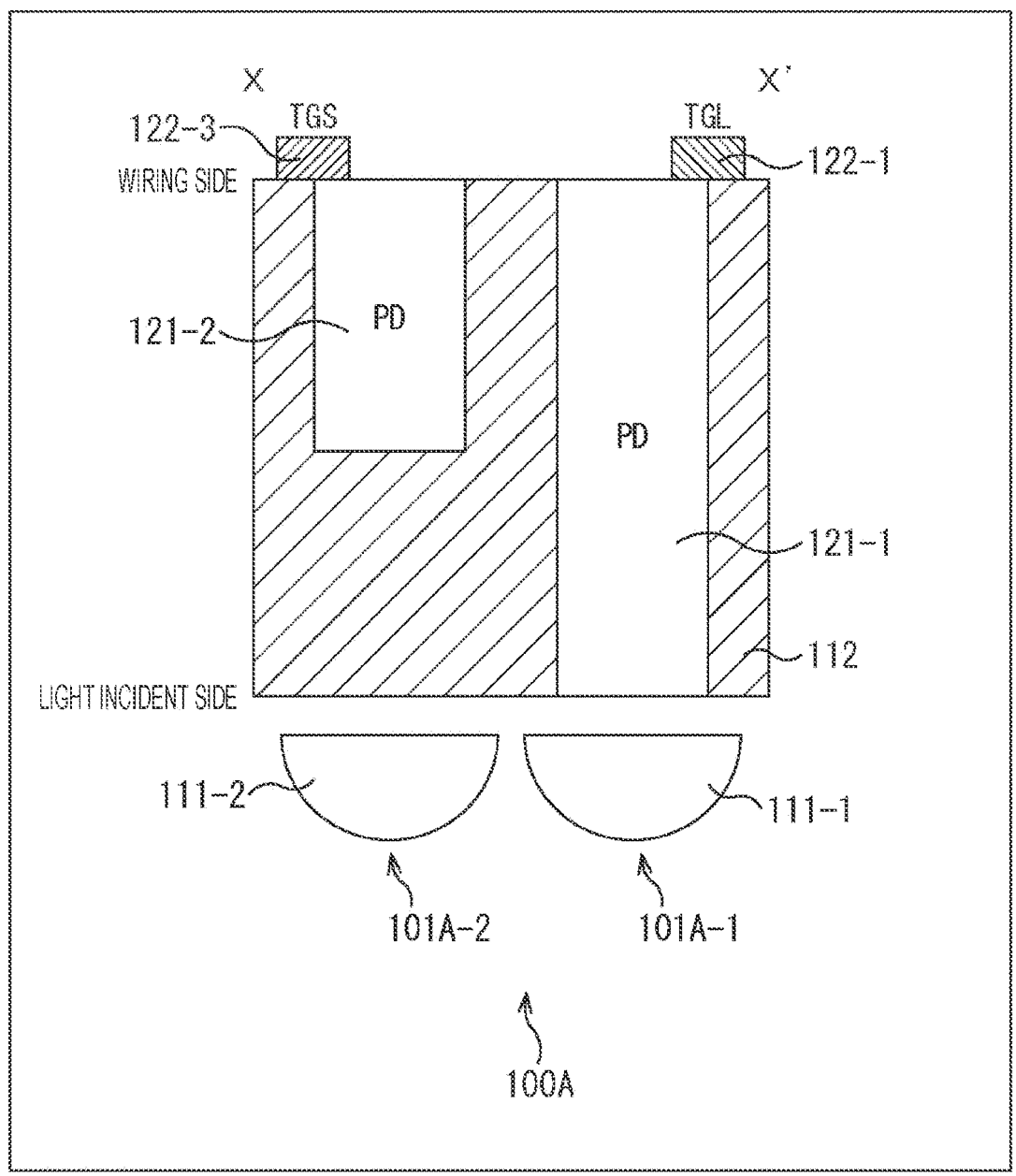
FIG. 7 is a cross-sectional view illustrating a structure of the pixel 100A of the second embodiment.

Furthermore, when illustrating the cross section of the dotted line XX' on the pixel 100A in FIG. 6A, the structure illustrated in the cross-sectional view in FIG. 7 is obtained. In FIG. 7, a high-sensitivity photodiode (PD) 121-1 and a low-sensitivity photodiode (PD) 121-2 are formed in silicon (Si) of a semiconductor substrate 112. Note that FIG. 7 illustrates a first transfer transistor 122-1 and a third transfer transistor 122-3, which will be described below, for the sake of convenience.

The high-sensitivity photodiode 121-1 generates and accumulates a charge according to the amount of light entering via an on-chip lens 111-1. Then, the charge accumulated in the high-sensitivity photodiode 121-1 is read as the first transfer transistor 122-1 operates in response to a drive signal TGL applied to a gate electrode of the first transfer transistor 122-1.

Note that in FIG. 7, although not all of constituent elements are illustrated for simplification of description, a pixel circuit of the on-chip lens 111-1, the high-sensitivity photodiode 121-1, the first transfer transistor 122-1, and the like constitute a high-sensitivity pixel 101A-1.

The low-sensitivity photodiode 121-2 generates and accumulates a charge according to the amount of light entering via an on-chip lens 111-2. The charge accumulated in the low-sensitivity photodiode 121-2 is read as the third transfer transistor 122-3 operates in response to a drive signal TGS applied to a gate electrode of the third transfer transistor 122-3.

Note that in FIG. 7, although not all of constituent elements are illustrated for simplification of description, a pixel circuit of the on-chip lens 111-2, the high-sensitivity photodiode 121-2, the third transfer transistor 122-3, and the like constitute a low-sensitivity pixel 101A-2.

Here, when comparing the high-sensitivity pixel 101A-1 and the low-sensitivity pixel 100A-2, the sizes in a plane direction (areas of light receiving surfaces) are equal (approximately the same) but the sizes in a depth direction of silicon (Si) of the semiconductor substrate 112 are different between the high-sensitivity photodiode 121-1 and the low-sensitivity photodiode 121-2. Specifically, the size in the depth direction of the low-sensitivity photodiode 121-2 is smaller than the size in the depth direction of the high-sensitivity photodiode 121-1.

In other words, in the pixel 100A, to make a difference in sensitivity between the high-sensitivity pixel 101A-1 and the low-sensitivity pixel 101A-2, the size in the depth direction of the low-sensitivity photodiode 121-2 is limited to be made smaller than the size in the depth direction of the high-sensitivity photodiode 121-1. Furthermore, in this case, as illustrated in the plan views on the wiring side in FIG. 6A and on the light incident side in FIG. 6B, the sizes in the plane direction (the areas of light receiving surfaces) of the high-sensitivity photodiode 121-1 and the low-sensitivity photodiode 121-2 are equal (approximately the same).

Here, the pixel 100A of the second embodiment illustrated in FIGS. 6A, 6B, and 7 is compared with the pixel 900 of the first embodiment illustrated in FIGS. 3 and 4.

In the pixel 900 illustrated in FIGS. 3 and 4, the size in the plan direction (the area of the light receiving surface) of the low-sensitivity photodiode 921-2 is made smaller than the size in the plane direction (the area of the light receiving surface) of the high-sensitivity photodiode 921-1, whereby the amount of charges generated as a result of photoelectric conversion in the low-sensitivity photodiode 921-2 is made smaller than the amount of charges generated as a result of photoelectric conversion in the high-sensitivity photodiode 921-1. Furthermore, the low-sensitivity photodiode 921-2 includes the in-pixel capacitor 923 as charge accumulation means other than the low-sensitivity photodiode 921-2, for accumulating a larger amount of charges generated as a result of photoelectric conversion.

In this way, by making the accumulable amount of charges generated by photoelectric conversion large while making the amount of charges to be generated by photoelectric conversion small, the low-sensitivity pixel unit (low-sensitivity pixel 901-2) of the pixel 900 provided with the low-sensitivity photodiode 921-2 and the in-pixel capacitor 923 can accumulate and output the charge according to illuminance without causing the output to be saturated over a wide illuminance range. As a result, the pixel 900 of the first embodiment illustrated in FIGS. 3 and 4 can obtain a wider dynamic range characteristic than the conventional technology.

In contrast, in the pixel 100A illustrated in FIGS. 6A, 6B, and 7, the size in the depth direction (the thickness) of the low-sensitivity photodiode 121-2 is made smaller than the size in the depth direction (the thickness) of the high-sensitivity photodiode 121-1, whereby the amount of charges generated as a result of photoelectric conversion in the low-sensitivity photodiode 121-2 is made smaller than the amount of charges generated as a result of photoelectric conversion in the high-sensitivity photodiode 121-1. Furthermore, in the low-sensitivity photodiode 121-2, to accumulate a larger amount of charges generated as a result of photoelectric conversion, the size in the plane direction (the area of the light receiving surface) of the low-sensitivity photodiode 121-2 is made larger than the size in the plane direction (the area of the light receiving surface) of the low-sensitivity photodiode 921-2 provided in the pixel 900, whereby a saturation charge amount (Qs) of the low-sensitivity photodiode 121-2 is made large.

In this way, by making the accumulable amount of charges generated by photoelectric conversion large while making the amount of charges to be generated by photoelectric conversion small, the low-sensitivity pixel unit (low-sensitivity pixel 101A-2) of the pixel 100A provided with the low-sensitivity photodiode 121-2 can accumulate and output the charge according to illuminance without causing the output to be saturated over a wide illuminance range. As a result, the pixel 100A of the second embodiment illustrated in FIGS. 6A, 6B, and 7 can obtain a wider dynamic range characteristic than the conventional technology.

Moreover, the pixel 100A accumulates the charge generated in the low-sensitivity photodiode 121-2, in the photodiode. Here, when comparing a photodiode and a MOS capacitor as the charge accumulation means, the photodiode accumulates the charge in a well of potential generated in a depleted photodiode, whereas the MOS capacitor accumulates the charge by using metal having many free electrons or a degenerated semiconductor as an electrode. Therefore, noise is smaller in accumulating the charge in the photodiode than in accumulating the charge in the MOS capacitor.

Therefore, the pixel 100A has the structure illustrated in FIGS. 6A, 6B, and 7, thereby to obtain a higher S/N in the output of the low-sensitivity photodiode than the pixel 900 illustrated in FIGS. 3 and 4. Furthermore, the CMOS image sensor 10 (FIG. 1) provided with the pixel 100A can obtain a wider dynamic range in the direction of high illuminance than the conventional technology and a favorable S/N characteristic both in a low-illuminance region and in a high-illuminance region.

(1-B) A Structure in which the Position in the Depth Direction of the Low-Sensitivity PD is Changed Next, the pixel 100B having a structure in which the position in the depth direction of a low-sensitivity photodiode (PD) is changed will be described with reference to the plan view in FIGS. 8A and 8B and the cross-sectional view in FIG. 9.

FIGS. 8A and 8B are plan views illustrating a structure of the pixel 100B. Note that, in FIGS. 8A and 8B, FIG. 8A illustrates a plan view of a case where one of the pixels 100B arranged in the pixel array unit 11 of the CMOS image sensor 10 (FIG. 1) in a two-dimensional manner is viewed from the wiring side, and FIG. 8B illustrates a plan view of a case where the pixel 100B is viewed from the light incident side.

Furthermore, when illustrating the cross section of the dotted line XX' on the pixel 100B in FIG. 8A, the structure illustrated in the cross-sectional view in FIG. 9 is obtained. In FIG. 9, the high-sensitivity photodiode (PD) 121-1 and the low-sensitivity photodiode (PD) 121-2 are formed in silicon (Si) of a semiconductor substrate 112.

In the pixel 100B in FIG. 9, the sizes in a plane direction of the high-sensitivity photodiode 121-1 and the low-sensitivity photodiode 121-2 are equal (approximately the same) or more, but the size in a depth direction of the low-sensitivity photodiode 121-2 is smaller than the size in a depth direction of the high-sensitivity photodiode 121-1, similarly to the pixel 100A (FIG. 7).

Note that, in the pixel 100B in FIG. 9, the position in the depth direction of the low-sensitivity photodiode 121-2 is changed from the position on the wiring side to a position close to the light incident side, as compared with the above-described pixel 100A (FIG. 7). Therefore, a vertical transistor 131 is formed in the silicon (Si) of the semiconductor substrate 112, and the charge accumulated in the low-sensitivity photodiode 121-2 is transferred via the vertical transistor 131 to the third transfer transistor 122-3.

In other words, in the pixel 100B, to make a difference in sensitivity between a high-sensitivity pixel 101B-1 and a low-sensitivity pixel 101B-2, the size in the depth direction of the low-sensitivity photodiode 121-2 is limited to be made smaller than the size in the depth direction of the high-sensitivity photodiode 121-1. Furthermore, in the pixel 100B, the sensitivity of the low-sensitivity pixel 101B-2 can be adjusted by changing the position in the depth direction of the low-sensitivity photodiode 121-2.

For example, while the sensitivity of the low-sensitivity pixel 101B-2 is improved as the position in the depth direction of the low-sensitivity photodiode 121-2 is closer to the light incident side, the sensitivity of the low-sensitivity pixel 101B-2 is decreased as the position is closer to the wiring side. Therefore, the difference in sensitivity between the high-sensitivity pixel 101B-1 and the low-sensitivity pixel 101B-2 can be optimized by appropriately setting the position in the depth direction of the low-sensitivity photodiode 121-2.

Furthermore, in this case, as illustrated in the plan views on the wiring side in FIG. 8A and on the light incident side in FIG. 8B, the sizes in the plane direction (the areas of light receiving surfaces) of the high-sensitivity photodiode 121-1 and the low-sensitivity photodiode 121-2 are equal (approximately the same).

Note that, in FIG. 9, the case of changing the position in the depth direction of the low-sensitivity photodiode 121-2 has been described. However, the size (width) in the plane direction of the low-sensitivity photodiode 121-2 may be changed. As described above, even in a case where the position in the depth direction and the size (width) in the plane direction of the low-sensitivity photodiode 121-2 are changed, the charge accumulated in the low-sensitivity photodiode 121-2 can be read by forming the vertical transistor 131 according to the structure.

As described above, the pixel 100B has the structure of the cross section illustrated in FIGS. 8A, 8B, and 9, thereby to make the accumulable amount of charges generated as a result of photoelectric conversion large while making the amount of charges to be generated small in the low-sensitivity pixel 101B-2. As a result, the pixel 100B can obtain a wide dynamic range characteristic. Furthermore, the pixel 100B can obtain a favorable S/N characteristic in both the low-illuminance and high-illuminance regions by accumulating the generated charge in the photodiodes both in the high-sensitivity pixel 101B-1 and in the low-sensitivity pixel 101B-2. Moreover, in the pixel 100B, the sensitivity of the low-sensitivity pixel 101B-2 can be adjusted by changing the position in the depth direction and the size (width) in the plane direction of the low-sensitivity photodiode 121-2.

(1-C) A Structure in which the Low-Sensitivity Pixel Includes an In-Pixel Capacitor Next, the pixel 100C having a structure in which a low-sensitivity pixel includes an in-pixel capacitor (FC) will be described with reference to the plane view in FIGS. 10A and 10B and the cross-sectional view in FIG. 11.

FIGS. 10A and 10B are plan views illustrating a structure of the pixel 100C. Note that, in FIGS. 10A and 10B, FIG. 10A illustrates a plan view of a case where one of the pixels 100C arranged in the pixel array unit 11 of the CMOS image sensor 10 (FIG. 1) in a two-dimensional manner is viewed from the wiring side, and FIG. 10B illustrates a plan view of a case where the pixel 100C is viewed from the light incident side.

Figure 11:
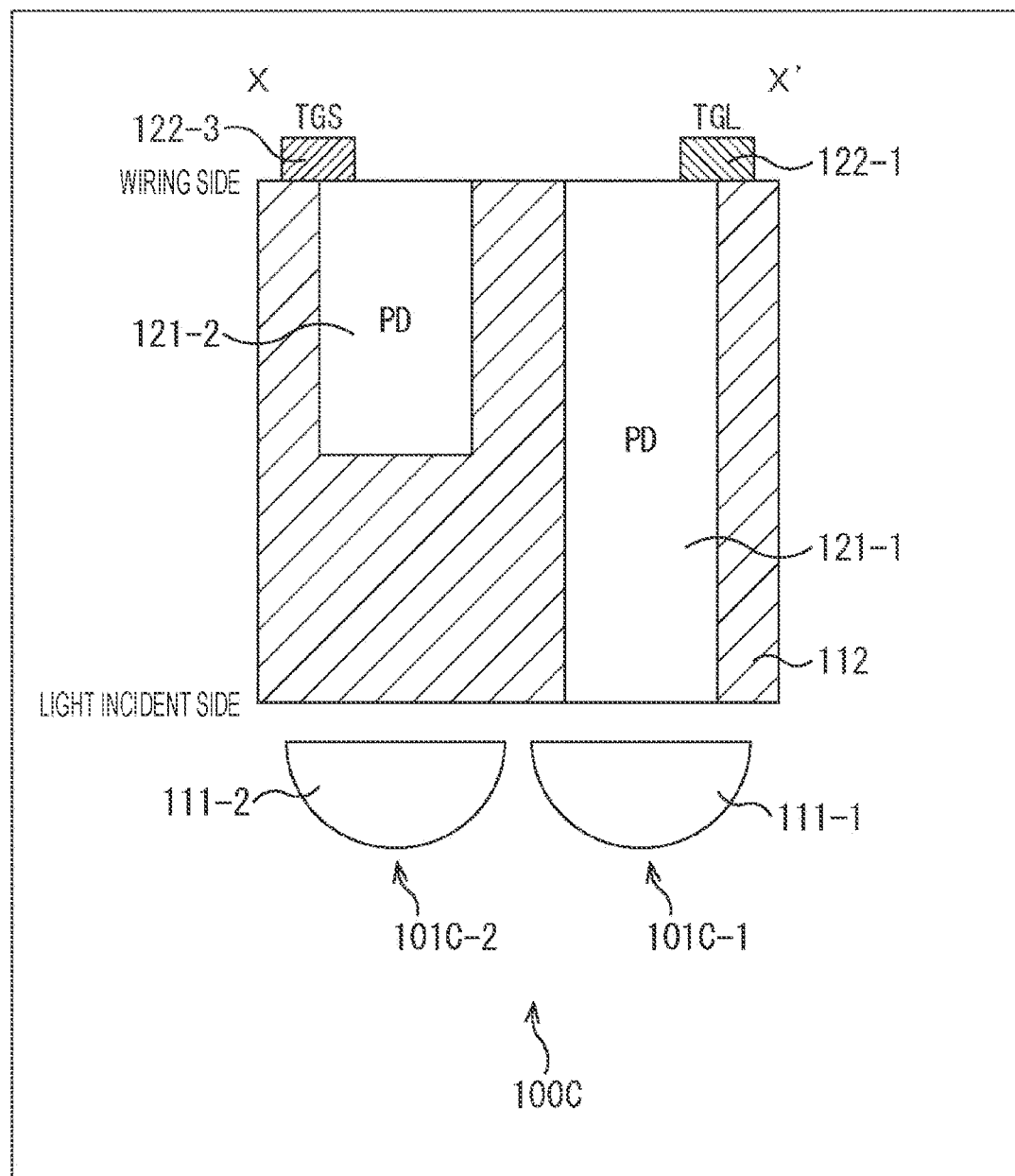
FIG. 11 is a cross-sectional view illustrating a structure of the pixel 100C of the second embodiment.

Furthermore, when illustrating the cross section of the dotted line XX' on the pixel 100C in FIG. 10A, the structure illustrated in the cross-sectional view in FIG. 11 is obtained. In FIG. 11, the high-sensitivity photodiode (PD) 121-1 and the low-sensitivity photodiode (PD) 121-2 are formed in the silicon (Si) of the semiconductor substrate 112.

In the pixel 100C in FIG. 11, the sizes in the plane direction (the areas of the light receiving surfaces) of the high-sensitivity photodiode 121-1 and the low-sensitivity photodiode 121-2 are equal (approximately the same) or more, but the size in the depth direction of the low-sensitivity photodiode 121-2 is smaller than the size in the depth direction of the high-sensitivity photodiode 121-1, similarly to the pixel 100A (FIG. 7).

Note that the pixel 100C has the structure different from the structure of the low-sensitivity pixel 101A-2 of the pixel 100A illustrated in the plan view on the wiring side in FIG. 6A in that a low-sensitivity pixel 101C-2 includes the in-pixel capacitor (FC) 123, as illustrated in plan view on the wiring side in FIG. 10A. In other words, a charge overflowing from the low-sensitivity photodiode 121-2 is accumulated in the in-pixel capacitor 123 in the low-sensitivity pixel 101C-2.

As described above, in the pixel 100C, since the low-sensitivity pixel 101C-2 includes the in-pixel capacitor 123, the saturation charge amount (Qs) of the low-sensitivity pixel 101C-2 is expanded according to the amount of charges overflowing to the in-pixel capacitor 123. Furthermore, in the pixel 100C, the size in the plane direction of the low-sensitivity photodiode 121-2 can be made equal to or larger than the size in the plane direction of the high-sensitivity photodiode 121-1, and the pixel 100C can earn the saturation charge amount (Qs) of the low-sensitivity pixel 101C-2 to some extent, thereby to have a superior S/N characteristic at low illuminance.

As described above, the pixel 100C has the structure of the cross section illustrated in FIGS. 10A, 10B, and 11, thereby to earn the saturation charge amount (Qs) to some extent without making the size in the plane direction of the low-sensitivity photodiode 121-2 small, which contributes to the saturation charge amount (Qs) of the low-sensitivity pixel 101C-2. Therefore, the charge less easily overflows to the in-pixel capacitor 123, and the pixel 100C has a superior S/N characteristic at low illuminance. Furthermore, in the pixel 100C, since the low-sensitivity pixel 101C-2 includes the in-pixel capacitor 123, the saturation charge amount (Qs) of the low-sensitivity pixel 101C-2 is expanded according to the amount of charges overflowing to the in-pixel capacitor 123.

(1-D) A Structure in which the Low-Sensitivity Pixel Includes an In-Pixel Capacitor, and the Position in the Depth Direction of the Low-Sensitivity PD is Changed Finally, the pixel 100D having a structure in which a low-sensitivity pixel includes an in-pixel capacitor (FC), and the position in the depth direction of a low-sensitivity photodiode (PD) is changed will be described with reference to the plan view in FIGS. 12A and 12B and the cross-sectional view in FIG. 13.

FIGS. 12A and 12B are plan views illustrating a structure of the pixel 100D. Note that, in FIGS. 12A and 12B, FIG. 12A illustrates a plan view of a case where one of the pixels 100D arranged in the pixel array unit 11 of the CMOS image sensor 10 (FIG. 1) in a two-dimensional manner is viewed from the wiring side, and FIG. 12B illustrates a plan view of a case where the pixel 100D is viewed from the light incident side.

Figure 13:
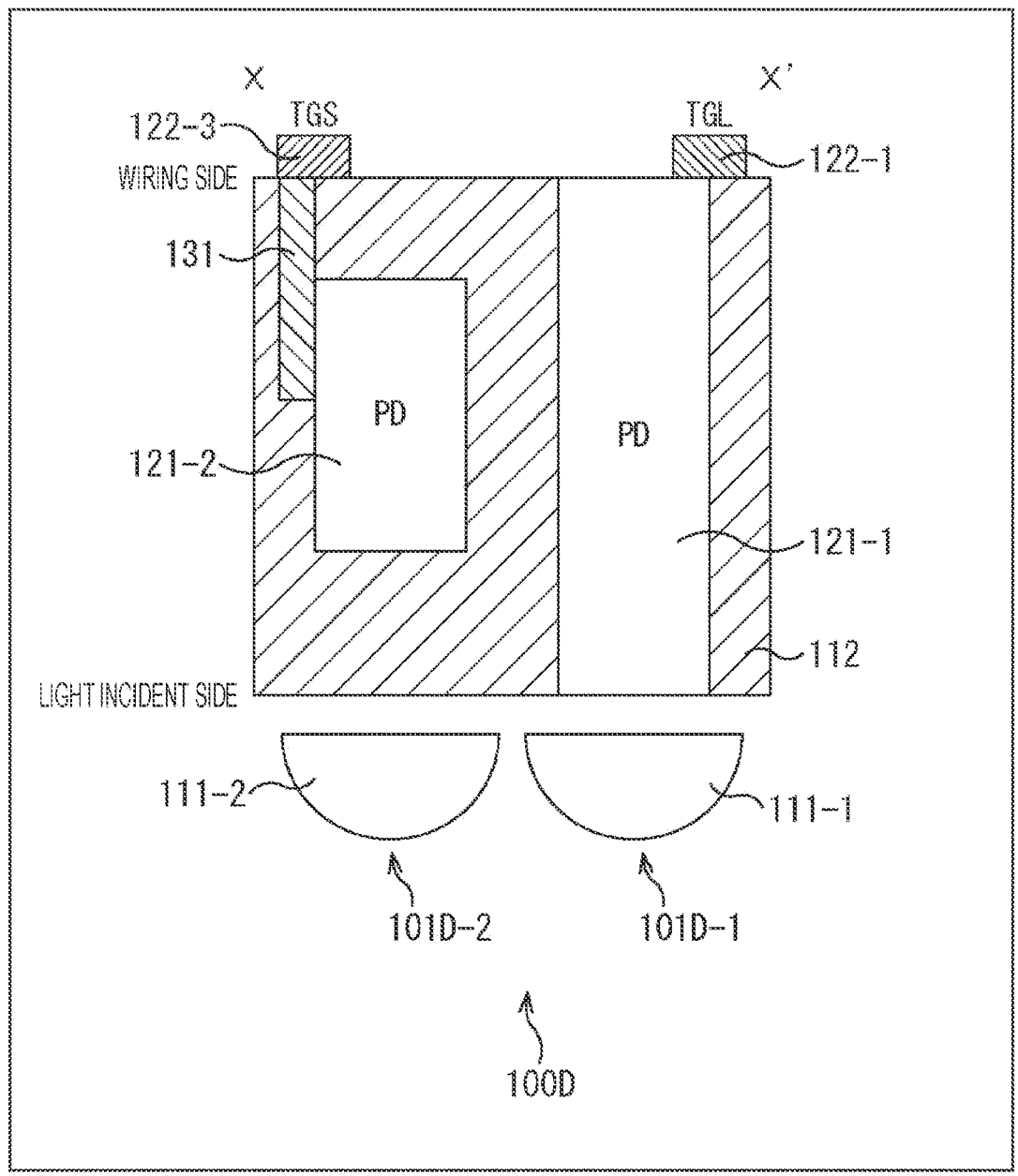
FIG. 13 is a cross-sectional view illustrating a structure of the pixel 100D of the second embodiment.

Furthermore, when illustrating the cross section of the dotted line XX' on the pixel 100D in FIG. 12A, the structure illustrated in the cross-sectional view in FIG. 13 is obtained. In FIG. 13, the high-sensitivity photodiode (PD) 121-1 and the low-sensitivity photodiode (PD) 121-2 are formed in the silicon (Si) of the semiconductor substrate 112.

In the pixel 100D in FIG. 13, the sizes in the plane direction (the areas of light receiving surfaces) of the high-sensitivity photodiode 121-1 and the low-sensitivity photodiode 121-2 are equal (approximately the same) or more, but the size in the depth direction of the low-sensitivity photodiode 121-2 is smaller than the size in a depth direction of the high-sensitivity photodiode 121-1, similarly to the pixel 100B (FIG. 9).

Furthermore, in the pixel 100D in FIG. 13, the position in the depth direction of the low-sensitivity photodiode 121-2 is changed from the position on the wiring side to a position close to the light incident side, similarly to the above-described pixel 100B (FIG. 9), and the sensitivity of a low-sensitivity pixel 101D-2 is adjusted. The charge accumulated in the low-sensitivity photodiode 121-2 is read by the third transfer transistor 122-3 via the vertical transistor 131.

Note that the pixel 100D has the structure different from the structure of the low-sensitivity pixel 101B-2 of the pixel 100B illustrated in the plan view on the wiring side in FIG. 8A in that the low-sensitivity pixel 101D-2 includes the in-pixel capacitor (FC) 123, as illustrated in the plan view on the wiring side in FIG. 12A. In other words, a charge overflowing from the low-sensitivity photodiode 121-2 is accumulated in the in-pixel capacitor 123 in the low-sensitivity pixel 101D-2.

As described above, in the pixel 100D, since the low-sensitivity pixel 101D-2 includes the in-pixel capacitor 123, the saturation charge amount (Qs) of the low-sensitivity pixel 101D-2 is expanded according to the amount of charges overflowing to the in-pixel capacitor 123.

Note that, in the pixel 100D in FIG. 13, the low-sensitivity photodiode 121-2 of the low-sensitivity pixel 101D-2 is formed at the position distant from the wiring side where ion-implantation is performed. Therefore, sharp PN junction is difficult to form, and the saturation charge amount (Qs) of only the low-sensitivity photodiode 121-2 is small. However, in the pixel 100D, the charge from the low-sensitivity photodiode 121-2 is caused to overflow to and accumulated in the in-pixel capacitor 123, and thus there is no problem in the saturation charge amount (Qs) as the low-sensitivity pixel 101D-2.

As described above, the pixel 100D has the structure of the cross section illustrated in FIGS. 12A, 12B, and 13, thereby to earn the saturation charge amount (Qs) to some extent without making the size in the plane direction of the low-sensitivity photodiode 121-2 small, which contributes to the saturation charge amount (Qs) of the low-sensitivity pixel 101D-2. Furthermore, in the pixel 100D, since the low-sensitivity pixel 101D-2 includes the in-pixel capacitor 123, the saturation charge amount (Qs) of the low-sensitivity pixel 101D-2 is expanded according to the amount of charges overflowing to the in-pixel capacitor 123.

Moreover, in the pixel 100D, the sensitivity of the low-sensitivity pixel 101D-2 can be adjusted by changing the position in the depth direction and the size (width) in the plane direction of the low-sensitivity photodiode 121-2.

As described above, the pixels 100A to 100D have been described as the second embodiment. In the second embodiment, the sensitivity of the low-sensitivity photodiode is made low, and the size in the plane direction of the low-sensitivity photodiode of the low-sensitivity pixel is made equal or larger than the size in the plane direction of the high-sensitivity photodiode by limiting the size in the depth direction of the low-sensitivity photodiode of the low-sensitivity pixel.

As a result, in the low-sensitivity pixel, the accumulable amount of charges generated as a result of photoelectric conversion is made large while making the amount of charges to be generated small. As a result, the pixels 100A to 100D can obtain a wide dynamic range characteristic. Furthermore, in the case where the low-sensitivity pixel includes the in-pixel capacitor, the saturation charge amount (Qs) can be earned to some extent, and thus the charge less easily overflow to the in-pixel capacitor, and a superior S/N characteristic at low illuminance can be obtained.

Note that the "depth direction" in the silicon (Si) of the semiconductor substrate 112 described above can also be said to be an "optical axis direction" in which light enters. Furthermore, the "plane direction" can also be said to be a "direction orthogonal to an optical axis". Further, the above-described in-pixel capacitor (floating capacitor: FC) is also referred to as a lateral overflow integration capacitor (LO-FIC).

4. Third Embodiment: Structure Having Different Sizes in Plane Direction on Incident Light Side and on Wiring Side of Low-Sensitivity PD Next, a third embodiment will be described with reference to FIGS. 14A, 14B, 15, 16A, 16B, 17, 18A, 18B, 19, 20A, 20B, 21, 22, and 23.

By the way, in the case where a high-sensitivity photodiode of a high-sensitivity pixel and a low-sensitivity photodiode of a low-sensitivity pixel are formed on a semiconductor substrate, a photodiode is formed by implanting ions from the wiring side. A photodiode with a high capacitor by PN junction can be more easily formed on the wiring side. In other words, to expand a saturation charge amount (Qs) of the low-sensitivity pixel, the size in a plane direction on the wiring side of the low-sensitivity photodiode is simply made large. Then, the larger the saturation charge amount (Qs) of the low-sensitivity photodiode of the low-sensitivity pixel, the higher the dynamic range can be obtained.

Therefore, in the third embodiment, the size in the plane direction on the wiring side of the low-sensitivity photodiode of the low-sensitivity pixel is made larger than the size in the plane direction on the light incident side, to expand the saturation charge amount (Qs) of the low-sensitivity pixel. As a result, the saturation charge amount (Qs) of the low-sensitivity pixel becomes large, and a high dynamic range can be obtained.

Note that in the third embodiment, pixels 200A to 200F will be described as pixels 200 arranged in a pixel array unit 11 of a CMOS image sensor 10 (FIG. 1) in a two-dimensional manner. The pixels 200A and 200F have a structure without including an in-pixel capacitor 223 whereas the pixels 200B to 200E have a structure including the in-pixel capacitor 223.

Furthermore, in the pixel 200, a pixel circuit of a high-sensitivity photodiode 221-1, a low-sensitivity photodiode 221-2, a first transfer transistor 222-1 to a selection transistor 229, and the like corresponds to the pixel circuit of the high-sensitivity photodiode 121-1, the low-sensitivity photodiode 121-2, the first transfer transistor 122-1 to the selection transistor 129, and the like, in the pixel 100 in FIG. 2.

Accordingly, pixel circuits of the pixels 200B and 200E correspond to the configuration of the pixel circuit illustrated in FIG. 2 whereas pixel circuits of the pixels 200A and 200F correspond to a configuration of a case where no in-pixel capacitor 223 is provided in the pixel circuit illustrated in FIG. 2.

(2-A) Basic Structure: A Structure in which Sizes in a Plane Direction on an Incident Light Side and on a Wiring Side of a Low-Sensitivity PD are Different First, the pixel 200A having a structure with the sizes in the plane direction on the incident light side and on the wiring side of the low-sensitivity photodiode (PD) are different will be described with reference to the plan view in FIGS. 14A and 14B and the cross-sectional view in FIG. 15.

FIGS. 14A and 14B is a plan view illustrating a structure of the pixel 200A. Note that, in FIGS. 14A and 14B, FIG. 14A illustrates a plan view of a case where one of the pixels 200A arranged in the pixel array unit 11 of the CMOS image sensor 10 (FIG. 1) in a two-dimensional manner is viewed from the wiring side, and FIG. 14B illustrates a plan view of a case where the pixel 200A is viewed from the light incident side.

Figure 15:
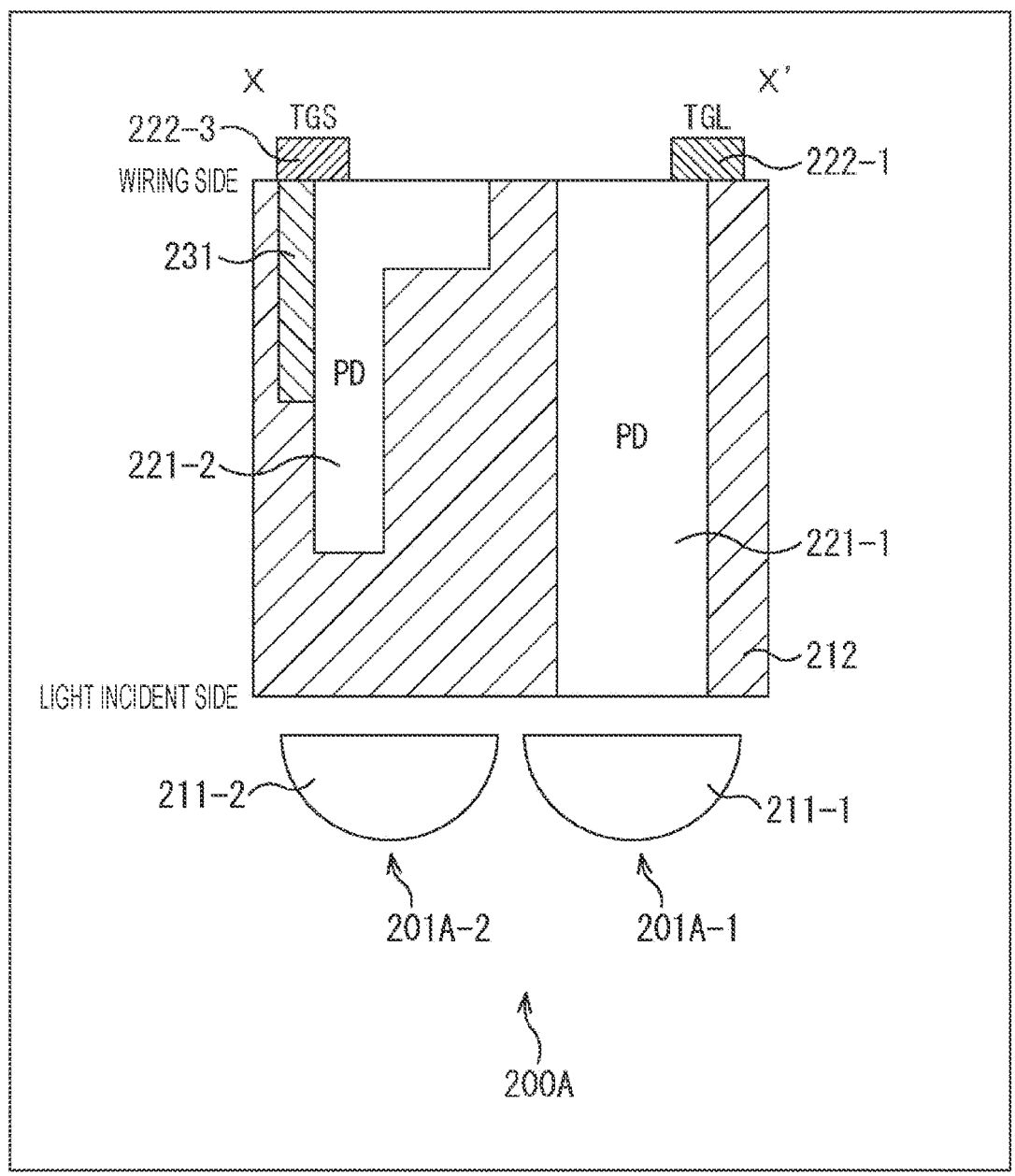
FIG. 15 is a cross-sectional view illustrating a structure of the pixel 200A of the third embodiment.

Furthermore, when illustrating the cross section of the dotted line XX' on the pixel 200A in FIG. 14A, the structure illustrated in the cross-sectional view in FIG. 15 is obtained. In FIG. 15, the high-sensitivity photodiode (PD) 221-1 and the low-sensitivity photodiode (PD) 221-2 are formed in silicon (Si) of a semiconductor substrate 212.

The high-sensitivity photodiode 221-1 generates and accumulates a charge according to the amount of light entering through an on-chip lens 211-1. Then, the charge accumulated in the high-sensitivity photodiode 221-1 is read by the pixel circuit such as the first transfer transistor 222-1.

Note that in FIG. 15, although not all of constituent elements are illustrated for simplification of description, a pixel circuit of the on-chip lens 211-1, the high-sensitivity photodiode 221-1, the first transfer transistor 222-1, and the like constitute a high-sensitivity pixel 201A-1.

The low-sensitivity photodiode 221-2 generates and accumulates a charge according to the amount of light entering via an on-chip lens 211-2. Then, the charge accumulated in the high-sensitivity photodiode 221-2 is read by the pixel circuit such as the third transfer transistor 222-3 via a vertical transistor 231.

Note that in FIG. 15, although not all of constituent elements are illustrated for simplification of description, a pixel circuit of the on-chip lens 211-2, the low-sensitivity photodiode 221-2, the third transfer transistor 222-3, and the like constitute a low-sensitivity pixel 201A-2.

Here, when comparing the high-sensitivity pixel 201A-1 and the low-sensitivity pixel 201A-2, the size in the depth direction of the low-sensitivity photodiode 221-2 is smaller than the size in the depth direction of the high-sensitivity photodiode 221-1. Furthermore, in the low-sensitivity pixel 201A-2, the size in the plane direction on the light incident side and the size in the plane direction on the wiring side, of the low-sensitivity photodiode 221-2, are different. Specifically, in the low-sensitivity photodiode 221-2, the size in the plane direction on the wiring side is larger than the size in the plane direction on the light incident side.

In other words, in the pixel 200A, the difference in sensitivity between the high-sensitivity pixel 201A-1 and the low-sensitivity pixel 201A-2 is made by the size in the depth direction of the photodiode. Therefore, the size in the plane direction of the low-sensitivity photodiode 221-2 is not necessarily made smaller than the size in the plane direction of the high-sensitivity photodiode 221-1, and can be made equal to or larger than the size of the high-sensitivity photodiode 221-1.

Furthermore, in the pixel 200A, regarding the low-sensitivity photodiode 221-2 of the low-sensitivity pixel 201A-2, the size in the plane direction on the light incident side, which contributes to the sensitivity, is made smaller than the size in the plane direction on the wiring side, which contributes to the saturation charge amount (Qs), whereby the sensitivity can be made lower while securing the saturation charge amount (Qs).

Here, in the case where the high-sensitivity photodiode 221-1 of the high-sensitivity pixel 201A-1 and the low-sensitivity photodiode 221-2 of the low-sensitivity pixel 201A-2 are formed on the semiconductor substrate 212, a photodiode is formed by implanting ions from the wiring side. A photodiode with a high capacitor by PN junction can be more easily formed on the wiring side.

Therefore, to expand the saturation charge amount (Qs) of the low-sensitivity pixel 201A-2, the size in the plane direction on the wiring side of the low-sensitivity photodiode 221-2 is simply made large, and the size in the plane direction on the wiring side is larger than the size in the plane direction on the light incident side in the low-sensitivity photodiode 221-2. As a result, the saturation charge amount (Qs) of the low-sensitivity pixel 201A-2 becomes large, and a high dynamic range can be obtained.

As described above, the pixel 200A has the structure illustrated in FIGS. 14A, 14B, and 15, thereby to make the size in the plane direction on the wiring side of the low-sensitivity photodiode 221-2, which contributes to the saturation charge amount (Qs) of the low-sensitivity pixel 101A-2, wider than the size in the plan direction on the light incident side to make the saturation charge amount (Qs) of the low-sensitivity pixel 201A-2 large.

In other words, since the size in the plane direction on the light incident side of the low-sensitivity photodiode 221-2, which contributes to the sensitivity of the low-sensitivity pixel 201A-2, is smaller than the size in the plane direction on the wiring side, the sensitivity of the low-sensitivity pixel 201A-2 can be further reduced while ensuring equal or higher saturation charge amounts (Qs) of the high-sensitivity pixel 201A-1 and the low-sensitivity pixel 201A-2, whereby the effect of expanding the dynamic range in the pixel 200A is increased.

(2-B) A Structure in which a Low-Sensitivity Pixel Includes an In-Pixel Capacitor Next, the pixel 200B having a structure in which a low-sensitivity pixel includes an in-pixel capacitor (FC) will be described with reference to the plane view in FIGS. 16A and 16B and the cross-sectional view in FIG. 17.

FIGS. 16A and 16B are plan views illustrating a structure of the pixel 200B. Note that, in FIGS. 16A and 16B, FIG. 16A illustrates a plan view of a case where one of the pixels 200B arranged in the pixel array unit 11 of the CMOS image sensor 10 (FIG. 1) in a two-dimensional manner is viewed from the wiring side, and FIG. 16B illustrates a plan view of a case where the pixel 200B is viewed from the light incident side.

Figure 17:
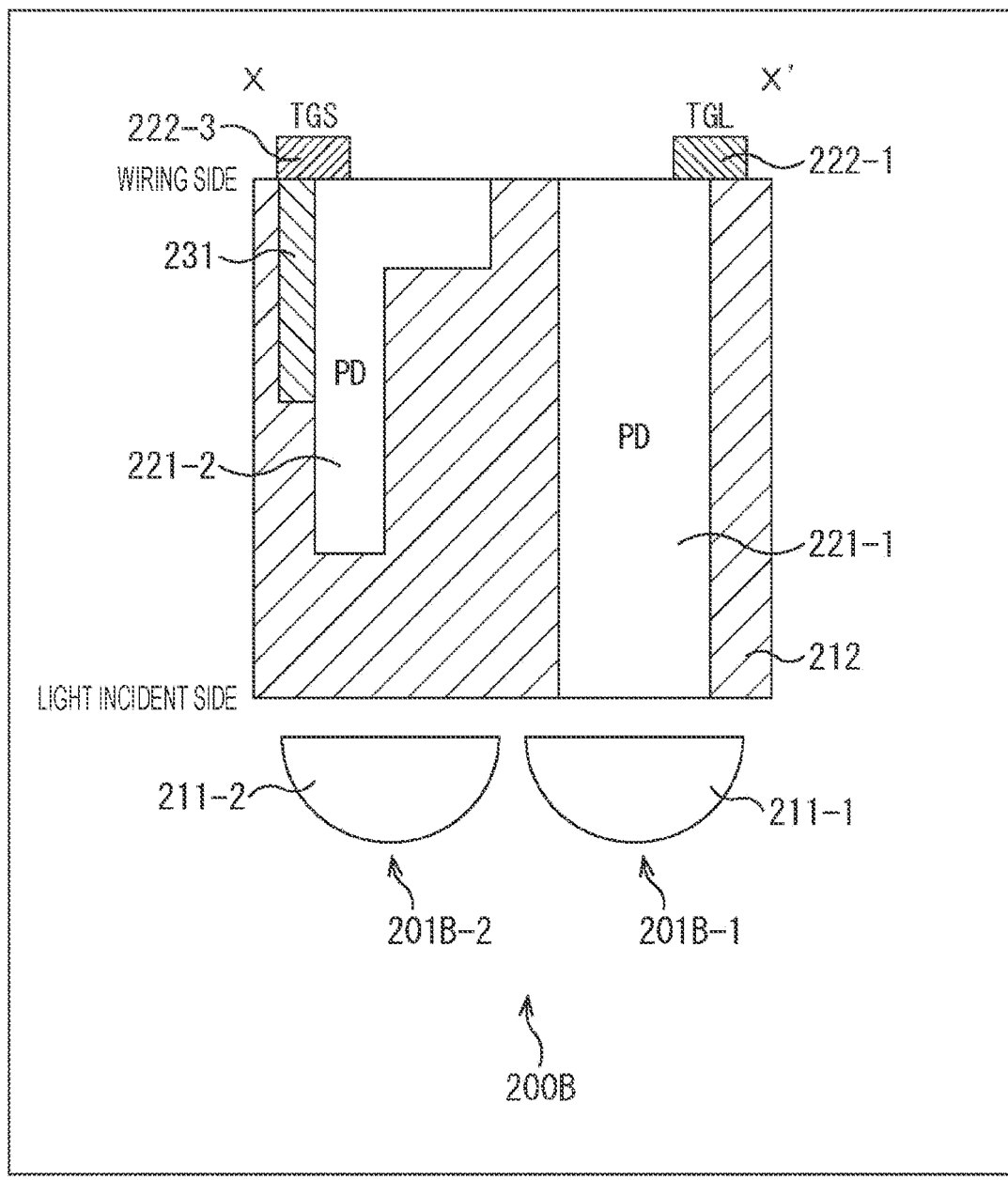
FIG. 17 is a cross-sectional view illustrating a structure of the pixel 200B of the third embodiment.

Furthermore, when illustrating the cross section of the dotted line XX' on the pixel 200B in FIG. 16A, the structure illustrated in the cross-sectional view in FIG. 17 is obtained. In FIG. 17, the high-sensitivity photodiode (PD) 221-1 and the low-sensitivity photodiode (PD) 221-2 are formed in the silicon (Si) of the semiconductor substrate 112.

In the pixel 200B in FIG. 17, the size in the depth direction of the low-sensitivity photodiode 221-2 is smaller than the size in the depth direction of the high-sensitivity photodiode 221-1, similarly to the above-described pixel 200A (FIG. 15). Furthermore, the size in the plane direction on the wiring side is larger than the size in the plane direction on the light incident side in the low-sensitivity photodiode 221-2. With the structure, in the pixel 200B, the sensitivity can be made lower while securing the saturation charge amount (Qs).

Note that the pixel 200B has the structure different from the structure of the low-sensitivity pixel 201A-2 of the pixel 200A illustrated in the plan view on the wiring side in FIGS. 14A and 14B in that a low-sensitivity pixel 201B-2 includes the in-pixel capacitor (FC) 223, as illustrated in the plan view on the wiring side in FIG. 16A. In other words, a charge overflowing from the low-sensitivity photodiode 221-2 is accumulated in the in-pixel capacitor 223 in the low-sensitivity pixel 201B-2 of the pixel 200B.

As described above, the pixel 200B has the structure illustrated in FIGS. 16A, 16B and 17, thereby to make the size in the plane direction on the wiring side of the low-sensitivity photodiode 221-2, which contributes to the saturation charge amount (Qs) of the low-sensitivity pixel 101B-2, wider than the size in the plan direction on the light incident side to make the saturation charge amount (Qs) of the low-sensitivity pixel 201B-2 large.

In other words, since the size in the plane direction on the light incident side of the low-sensitivity photodiode 221-2, which contributes to the sensitivity of the low-sensitivity pixel 201B-2, is smaller than the size in the plane direction on the wiring side, the sensitivity of the low-sensitivity pixel 201B-2 can be further reduced while ensuring equal or higher saturation charge amounts (Qs) of a high-sensitivity pixel 201B-1 and the low-sensitivity pixel 201B-2, whereby the effect of expanding the dynamic range in the pixel 200B is increased.

Furthermore, in the pixel 200B, since the low-sensitivity pixel 201B-2 includes the in-pixel capacitor 223, the saturation charge amount (Qs) of the low-sensitivity pixel 201B-2 is expanded according to the amount of charges overflowing to the in-pixel capacitor 223.

(2-C) A Structure in which a Low-Sensitivity PD is Formed Around a High-Sensitivity PD Next, the pixel 200C having a structure in which a low-sensitivity photodiode (PD) is formed around a high-sensitivity photodiode (PD) will be described with reference to the plan view in FIGS. 18A and 18B and the cross-sectional view in FIG. 19.

FIGS. 18A and 18B are plan views illustrating a structure of the pixel 200C. Note that, in FIGS. 18A and 18B, FIG. 18A illustrates a plan view of a case where one of the pixels 200C arranged in the pixel array unit 11 of the CMOS image sensor 10 (FIG. 1) in a two-dimensional manner is viewed from the wiring side, and FIG. 18B illustrates a plan view of a case where the pixel 200C is viewed from the light incident side.

Figure 19:
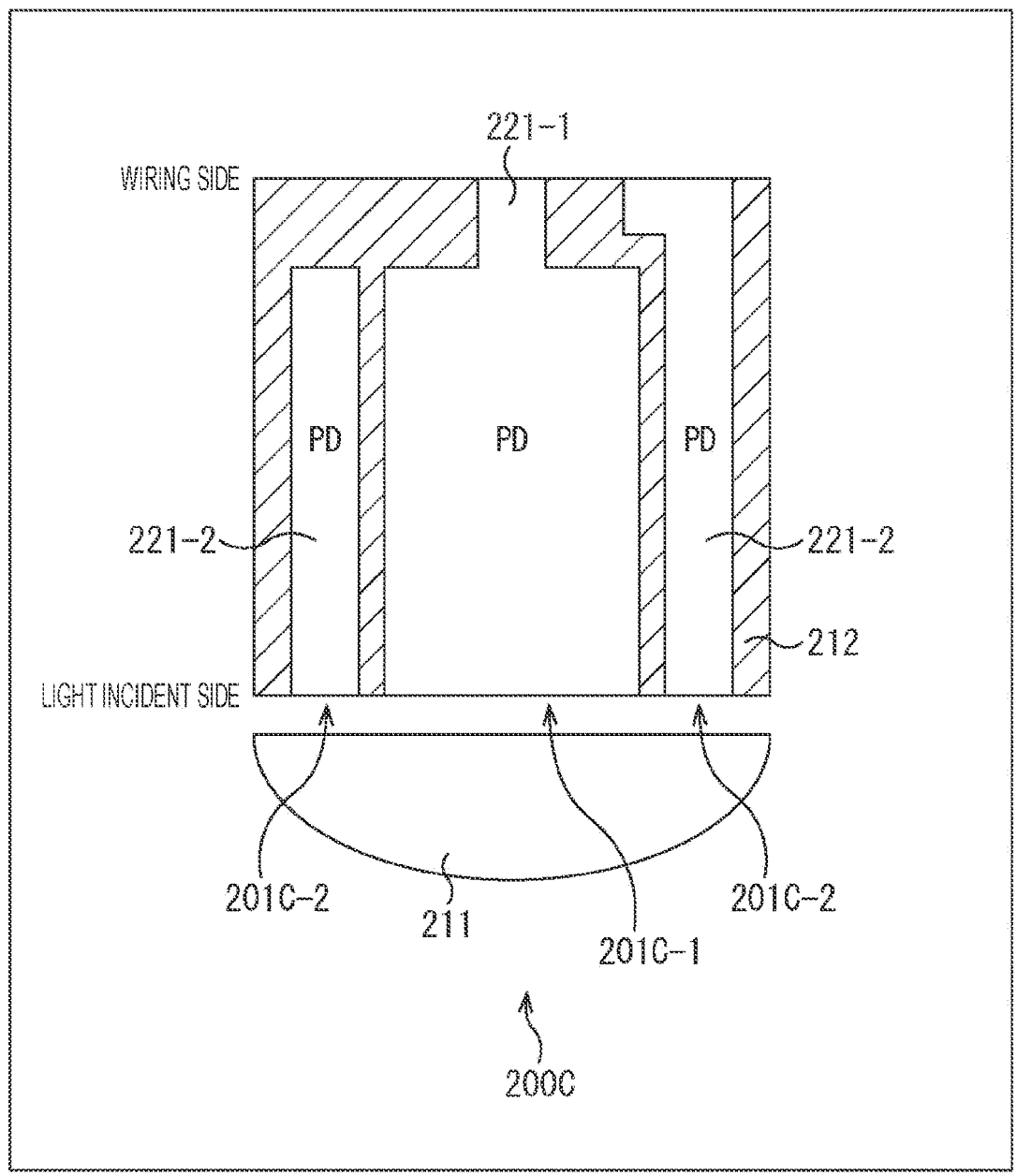
FIG. 19 is a cross-sectional view illustrating a structure of the pixel 200C of the third embodiment.

Furthermore, when illustrating the cross section of the dotted line XX' on the pixel 200C in FIG. 18A, the structure illustrated in the cross-sectional view in FIG. 19 is obtained. In FIG. 19, the high-sensitivity photodiode (PD) 221-1 and the low-sensitivity photodiode (PD) 221-2 are formed in the silicon (Si) of the semiconductor substrate 212. The low-sensitivity photodiode 221-2 is formed around (in surroundings of) the high-sensitivity photodiode 221-1 (the plane view on the light incident side in FIGS. 18A and 18B).

In other words, in the pixel 200C, the low-sensitivity photodiode 221-2 of a low-sensitivity pixel 201C-2 is formed in a region off a light collection point of an off-chip lens 211, whereby the difference in sensitivity between a high-sensitivity pixel 201C-1 and the low-sensitivity pixel 201C-2 is given.

Here, in the high-sensitivity pixel 201C-1, the sizes in the plane direction on the light incident side and on the wiring side of the high-sensitivity photodiode 221-1 are different. Specifically, in the high-sensitivity photodiode 221-1, the size in the plane direction on the wiring side is smaller than the size in the plane direction on the light incident side.

Furthermore, in the low-sensitivity pixel 201C-2, the sizes in the plane direction of the low-sensitivity photodiode 221-2 on the light incident side and on the wiring side are different. Specifically, in the low-sensitivity photodiode

221-2, the size in the plane direction on the wiring side is larger than the size in the plane direction on the light incident side.

In other words, since a higher dynamic range can be expected when the saturation charge amount (Qs) of the low-sensitivity photodiode 221-2 of the low-sensitivity pixel 201C-2 is higher, the size in the plane direction on the wiring side of the low-sensitivity photodiode 121-2 is made larger than the size in the plane direction on the light incident side in the pixel 200C, similarly to the pixel 200A (FIG. 15) or the pixel 200B (FIG. 17).

Meanwhile, in the pixel 200C, to secure a region to make the size in the plane direction on the wiring side of the low-sensitivity photodiode 121-2 large, the size in the plane direction on the wiring side of the high-sensitivity photodiode 221-1 is made small.

As described above, the pixel 200C has the structure in which the low-sensitivity pixel 201C-2 is arranged around (in surroundings of) the high-sensitivity pixel 201C-1, whereby the low-sensitivity photodiode 221-2 of the low-sensitivity pixel 201C-2 is formed in the region off the light collection point of the off-chip lens 211, and thus the pixel 200C can have low sensitivity.

Furthermore, in the pixel 200C, the size in the plane direction on the wiring side is made larger than the size in the plane direction on the light incident side in the low-sensitivity photodiode 221-2, whereby the sensitivity can be further reduced while securing the saturation charge amount (Qs).

Note that, in the cross-sectional view in FIG. 19, when comparing the sizes in the depth direction of the high-sensitivity photodiode 221-1 and the low-sensitivity photodiode 221-2, a part of the low-sensitivity photodiode 221-2 is smaller than the high-sensitivity photodiode 221-1. However, the entire low-sensitivity photodiode 221-2 may be smaller than the high-sensitivity photodiode 221-1.

As described above, the pixel 200C has the structure illustrated in FIGS. 18A, 18B, and 19, thereby to make the size in the plane direction on the wiring side of the low-sensitivity photodiode 221-2, which contributes to the saturation charge amount (Qs) of the low-sensitivity pixel 101C-2, wider than the size in the plan direction on the light incident side to make the saturation charge amount (Qs) of the low-sensitivity pixel 201C-2 large.

In other words, since the size in the plane direction on the light incident side of the low-sensitivity photodiode 221-2, which contributes to the sensitivity of the low-sensitivity pixel 201C-2, is smaller than the size in the plane direction on the wiring side, the sensitivity of the low-sensitivity pixel 201C-2 can be further reduced while ensuring equal or higher saturation charge amounts (Qs) of the high-sensitivity pixel 201C-1 and the low-sensitivity pixel 201C-2, whereby the effect of expanding the dynamic range in the pixel 200C is increased.

(2-D and E) Structures in which a Wiring Side of a High-Sensitivity PD is Formed by PN Junction.

Next, the pixel 200D having a structure in which the wiring side of a high-sensitivity photodiode (PD) is formed by PN junction will be described with reference to the plan view in FIGS. 20A and 20B and the cross-sectional views in FIGS. 21 and 22.

FIGS. 20A and 20B are plan views illustrating a structure of the pixel 200D. Note that, in FIGS. 20A and 20B, FIG. 20A illustrates a plan view of a case where one of the pixels 200D arranged in the pixel array unit 11 of the CMOS image sensor 10 (FIG. 1) in a two-dimensional manner is viewed from the wiring side, and FIG. 20B illustrates a plan view of a case where the pixel 200D is viewed from the light incident side.

Figure 21:
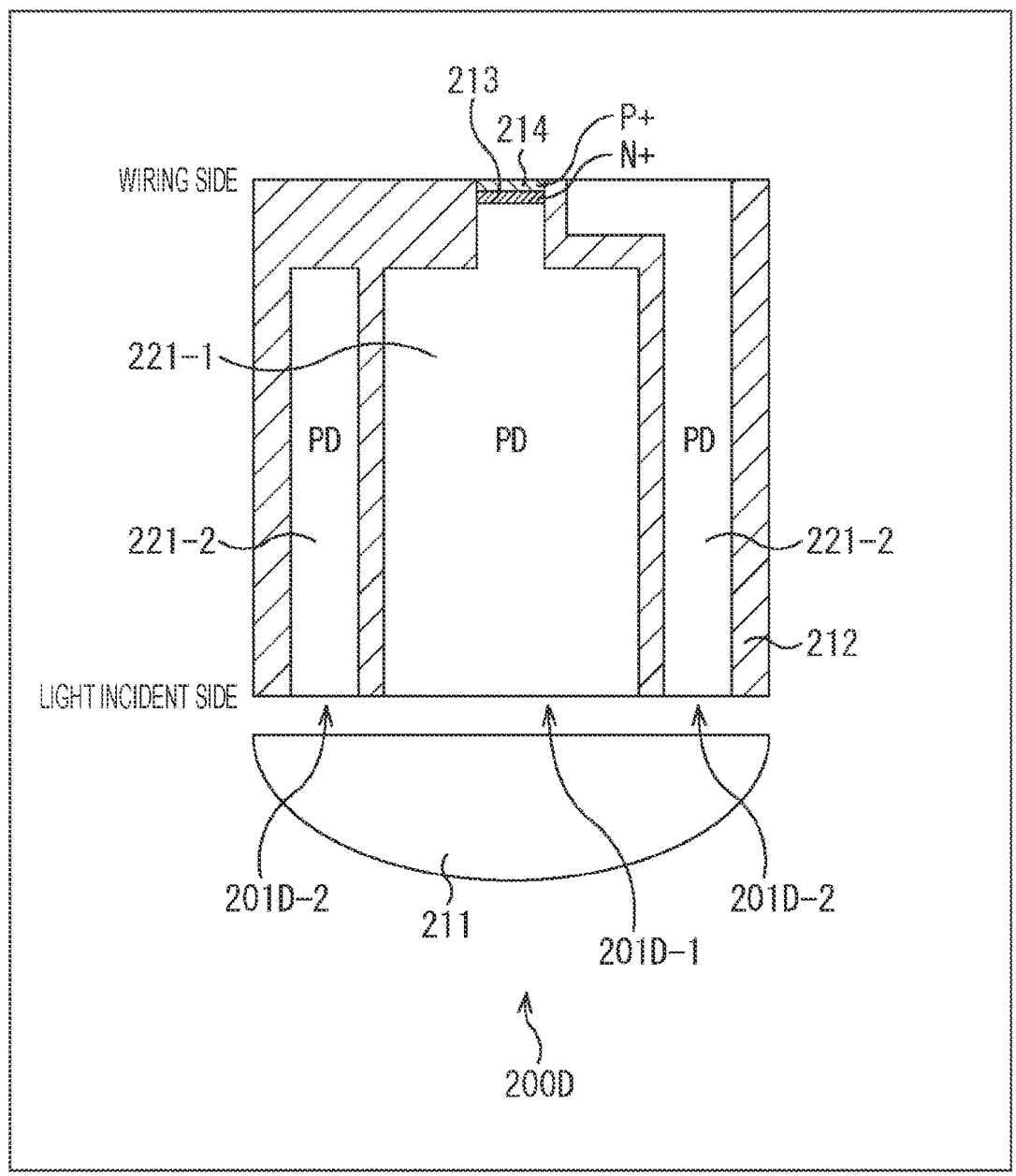
FIG. 21 is a cross-sectional view illustrating a structure of the pixel 200D of the third embodiment.

Furthermore, when illustrating the cross section of the dotted line XX' on the pixel 200D in FIG. 20A, the structure illustrated in the cross-sectional view in FIG. 21 is obtained. In the pixel 200D in FIG. 21, the low-sensitivity photodiode 221-2 is formed around (in surroundings of) the high-sensitivity photodiode 221-1 (the plane view on the light incident side in FIG. 20B), similarly to the pixel 200C (FIG. 19).

In other words, in the pixel 200D, the low-sensitivity photodiode 221-2 of a low-sensitivity pixel 201D-2 is formed in a region off a light collection point of the off-chip lens 211, whereby the difference in sensitivity between a high-sensitivity pixel 201D-1 and the low-sensitivity pixel 201D-2 is given.

Furthermore, in the pixel 200D, the size in the plane direction on the wiring side is smaller than the size in the plane direction on the light incident side in the high-sensitivity photodiode 221-1, and the size in the plane direction on the wiring side is larger than the size in the plane direction on the light incident side in the low-sensitivity photodiode 221-2, similarly to the pixel 200C (FIG. 19).

In the pixel 200D, an N+ layer 213 that is an N-type region and a P+ layer 214 that is a P-type region are formed, and a PN junction is formed, on the wiring side of the high-sensitivity photodiode 221-1. Here, in the case where the high-sensitivity photodiode 221-1 and the low-sensitivity photodiode 221-2 are formed, ions are implanted from the wiring side to the semiconductor substrate 212. A photodiode with a high capacitor by PN junction can be more easily formed on the wiring side. In other words, to expand a saturation charge amount (Qs), the size in the plane direction on the wiring side of the photodiode is simply made large.

Then, since a higher dynamic range can be expected when the saturation charge amount (Qs) of the low-sensitivity photodiode 221-2 of the low-sensitivity pixel 201D-2 is higher, the size in the plane direction on the wiring side of the low-sensitivity photodiode 121-2 is made large in the pixel 200D. Meanwhile, to secure a region to make the size in the plane direction on the wiring side of the low-sensitivity photodiode 121-2 large, the size in the plane direction on the wiring side of the high-sensitivity photodiode 221-1 is made small.

In other words, in the pixel 200D, the sizes of both the high-sensitivity photodiode 221-1 of the high-sensitivity pixel 201D-1 and the low-sensitivity photodiode 221-2 of the low-sensitivity pixel 201D-2 are made different in the plane direction on the light incident side and in the plane direction on the wiring side.

Furthermore, in the pixel 200D, the PN junction contributing to the saturation charge amount (Qs) is formed on the wiring side in forming the high-sensitivity photodiode 221-1, whereby the high-sensitivity photodiode 221-1 with a high capacitor can be formed.

Note that, in the pixel 200D, the structure in which the PN junction is formed only on the wiring side where the size is made small in the plane direction on the wiring side of the high-sensitivity photodiode 221-1 has been described. However, the PN junction may be formed in a portion in the middle stage of making the size in the plane direction of the high-sensitivity photodiode 221-1 small from the light incident side to the wiring side. For example, as illustrated in FIG. 22, in the pixel 200E, the PN junction is formed not only on the wiring side where the size is made small in the plane direction on the wiring side of the high-sensitivity photodiode 221-1 but also in the portion in the middle stage of making the size in the plane direction small.

Figure 22:
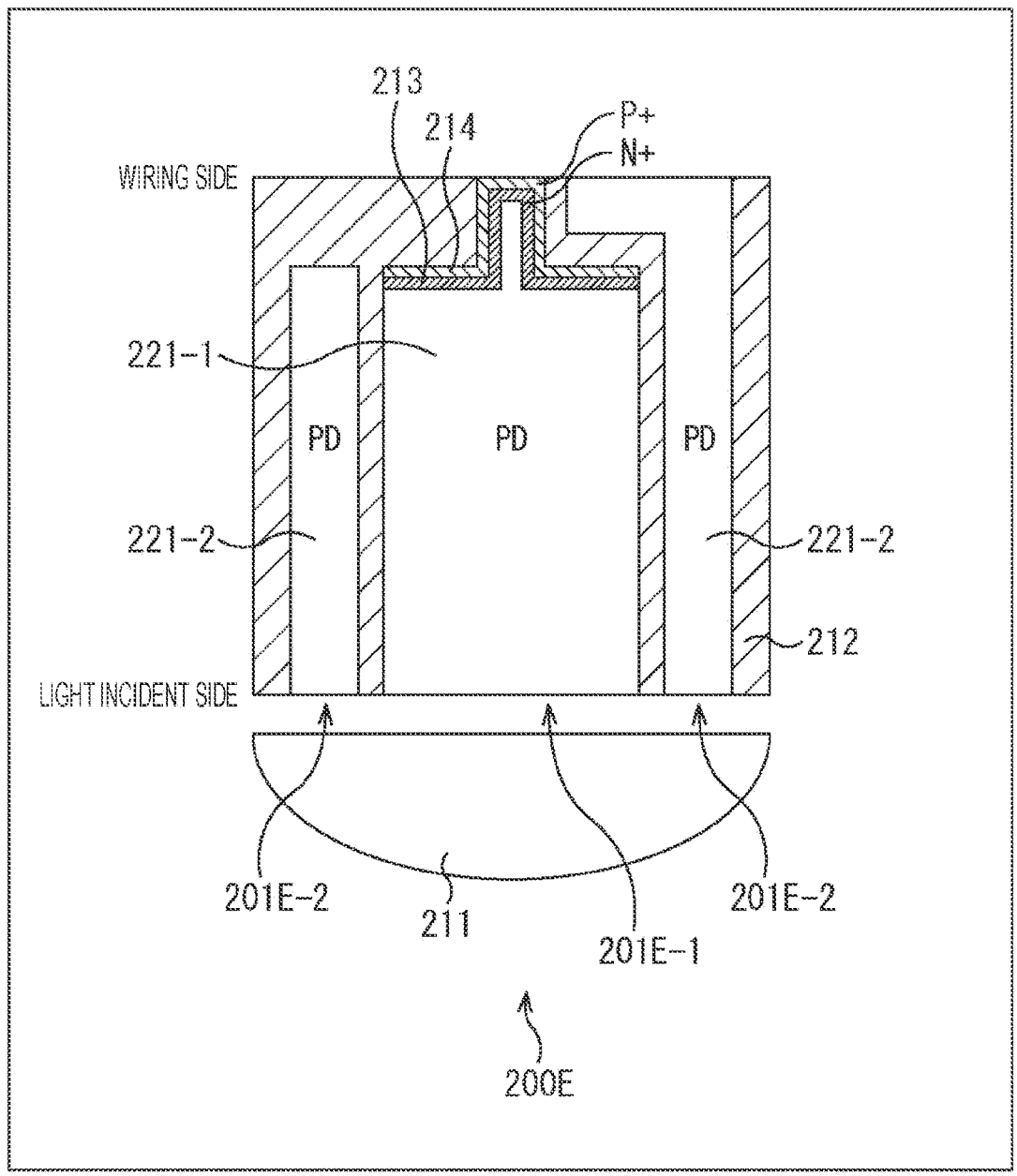
FIG. 22 is a cross-sectional view illustrating a structure of a pixel 200E of the third embodiment.

As described above, the pixel 200D has the structure illustrated in FIGS. 20A, 20B, and 21 and the pixel 200E has the structure illustrated in FIGS. 20A, 20B, and 22, thereby to make the size in the plane direction on the wiring side of the low-sensitivity photodiode 221-2, which contributes to the saturation charge amount (Qs) of the low-sensitivity pixel 201D-2 (201E-2), wider than the size in the plan direction on the light incident side to make the saturation charge amount (Qs) of the low-sensitivity pixel 201D-2 (201E-2) large, and thus can obtain a high dynamic range.

In other words, since the size in the plane direction on the light incident side of the low-sensitivity photodiode 221-2, which contributes to the sensitivity of the low-sensitivity pixel 201D-2 (201E-2), is smaller than the size in the plane direction on the wiring side, the sensitivity of the low-sensitivity pixel 201D-2 (201E-2) can be further reduced while ensuring equal or higher saturation charge amounts (Qs) of the high-sensitivity pixel 201D-1 (201E-1) and the low-sensitivity pixel 201D-2 (201E-2), whereby the effect of expanding the dynamic range in the pixel 200D is increased.

(2-F) Modification

Figure 23:
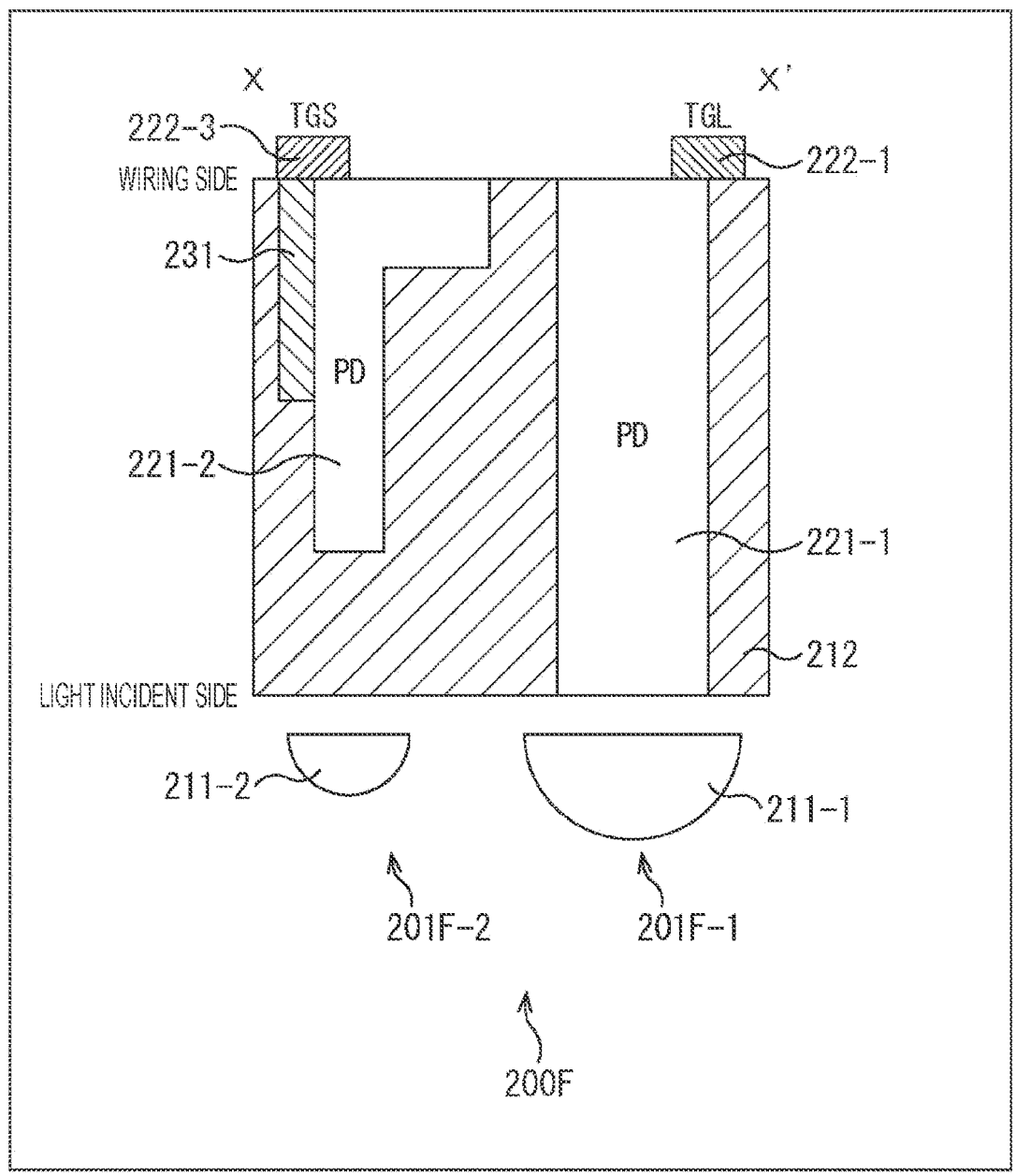
FIG. 23 is a cross-sectional view illustrating a structure of a pixel 200F of the third embodiment.

Finally, the pixel 200F will be described with reference to the cross-sectional view in FIG. 23. In the pixel 200F in FIG. 23, the size in the depth direction of the low-sensitivity photodiode 221-2 is smaller than the size in the depth direction of the high-sensitivity photodiode 221-1, similarly to the above-described pixel 200A (FIG. 15). Furthermore, the size in the plane direction on the wiring side is larger than the size in the plane direction on the light incident side in the low-sensitivity photodiode 221-2.

Meanwhile, the outer size of the on-chip lens 211-2 that collects light to the low-sensitivity photodiode 221-2 is adjusted to the size in the plane direction on the light incident side of the low-sensitivity photodiode 221-2, in a low-sensitivity pixel 201F-2.

In other words, in the above-described pixel 200A (FIG. 15), the on-chip lens 211-1 of the high-sensitivity pixel 201A-1 and the on-chip lens 211-2 of the low-sensitivity pixel 201A-2 have the same outer size. In the pixel 200F in FIG. 23, the on-chip lens 211-1 of a high-sensitivity pixel 201F-1 and the on-chip lens 211-2 of the low-sensitivity pixel 201F-2 have different outer sizes.

As described above, in the pixel 200F, the outer size of the on-chip lens 211-2 can be changed according to the size in the plane direction on the light incident side of the low-sensitivity photodiode 221-2.

As described above, the pixels 200A to 200F have been described as the third embodiment. In the third embodiment, the size in the plane direction on the wiring side of the low-sensitivity photodiode of the low-sensitivity pixel is made larger than the size in the plane direction on the light incident side, whereby the saturation charge amount (Qs) of the low-sensitivity pixel can be expanded. Furthermore, the sensitivity of the low-sensitive pixel can be reduced while securing equal or higher saturation charge amounts (Qs) of the high-sensitivity pixel and the low-sensitivity pixel, whereby the pixel including the high-sensitivity pixel and the low-sensitivity pixel is superior in expanding the dynamic range.

5. Fourth Embodiment: Structure in which Low-Sensitivity PD, In-Pixel Capacitor, and the Like are Stacked Next, a fourth embodiment will be described with reference to FIGS. 24 to 31.

In the above-described second embodiment, the difference in sensitivity between the high-sensitivity pixel and the low-sensitivity pixel is given by limiting the size in the depth direction of the low-sensitivity photodiode. A structure in which an in-pixel capacitor (FC) and the like are stacked can be adopted for a low-sensitivity photodiode by limiting the size in the depth direction of the low-sensitivity photodiode.

Therefore, in the fourth embodiment, the size in a plane direction of a high-sensitivity photodiode is expanded using a vacant region obtained by limiting the size in a depth direction of a low-sensitivity photodiode, and further having a structure in which an in-pixel capacitor (FC) and the like are stacked on the low-sensitivity photodiode. As a result, the difference in sensitivity between a high-sensitivity pixel and a low-sensitivity pixel can be further expanded.

Note that, in the fourth embodiment, pixels 300A to 300E will be described as pixels 300 arranged in a pixel array unit 11 of a CMOS image sensor 10 (FIG. 1) in a two-dimensional manner.

Furthermore, in the pixel 300, a pixel circuit of a high-sensitivity photodiode 321-1, a low-sensitivity photodiode 321-2, a first transfer transistor 322-1 to a selection transistor 329, and the like corresponds to the pixel circuit of the high-sensitivity photodiode 121-1, the low-sensitivity photodiode 121-2, the first transfer transistor 122-1 to the selection transistor 129, and the like, in the pixel 100 in FIG. 2.

Note that pixel circuits of pixels including an in-pixel capacitor 323, among the pixels 300A to 300E, correspond to the configuration of the pixel circuit illustrated in FIG. 2 whereas pixel circuits of pixels without including the in-pixel capacitor 323, of the pixels 300A to 300E, correspond to a configuration of a case where no in-pixel capacitor 323 is provided in the pixel circuit illustrated in FIG. 2.

(3-A) Basic Structure: A Structure in which a Low-Sensitivity PD and an In-Pixel Capacitor FC are Stacked First, the pixel 300A having a structure in which a low-sensitivity photodiode (PD) and an in-pixel capacitor (FC) are stacked will be described with reference to FIGS. 24 to 26.

Figure 24:
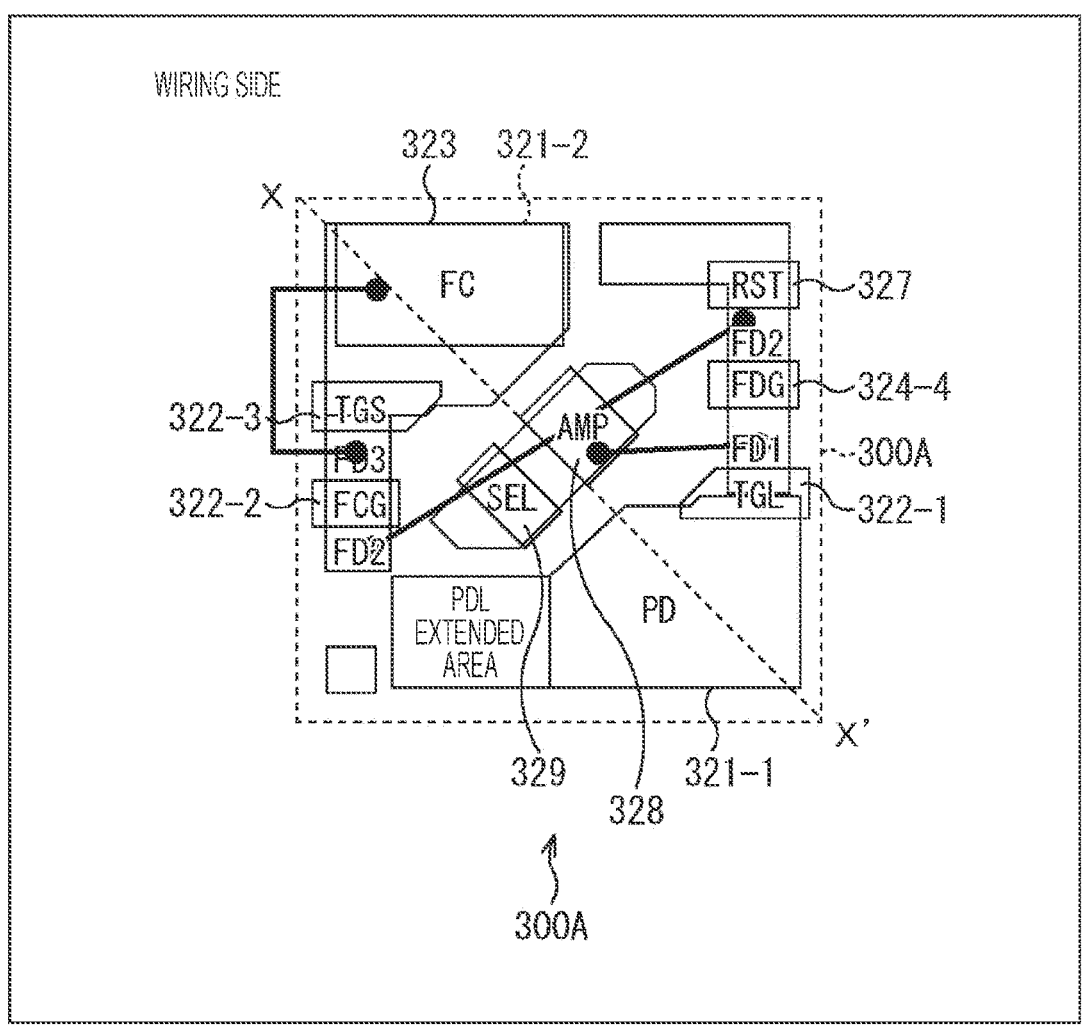
FIG. 24 is a plan view illustrating a structure of a pixel 300A of a fourth embodiment.

FIG. 24 is a plan view illustrating a structure of the pixel 300A. Note that FIG. 24 illustrates a plan view of one of the pixels 300A arranged in the pixel array unit 11 of the CMOS image sensor 10 (FIG. 1) in a two-dimensional manner is viewed from a wiring side.

Figure 25:
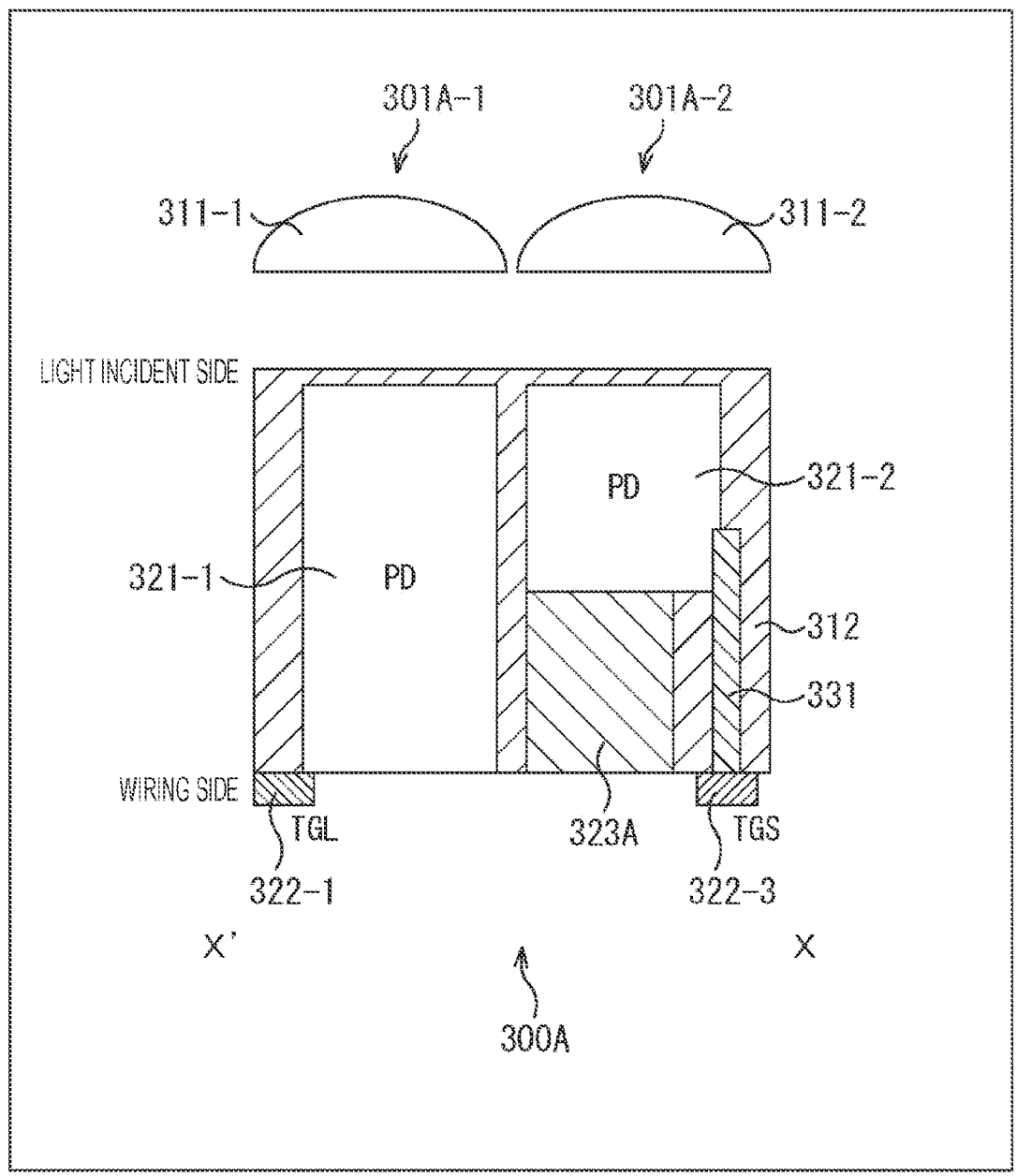
FIG. 25 is a cross-sectional view illustrating a structure of the pixel 300A of the fourth embodiment.

Furthermore, when illustrating the cross section of the dotted line XX' on the pixel 300A in FIG. 24, the structure illustrated in the cross-sectional view in FIG. 25 is obtained. In FIG. 25, the high-sensitivity photodiode (PD) 321-1 and the low-sensitivity photodiode (PD) 321-2 are formed in silicon (Si) of a semiconductor substrate 312.

In the pixel 300A in FIG. 25, the sizes in the plane direction (areas of light receiving surfaces) of the high-sensitivity photodiode 321-1 and the low-sensitivity photodiode 321-2 are equal, but the size in the depth direction of the low-sensitivity photodiode 321-2 is smaller than the size in the depth direction of the high-sensitivity photodiode 321-1, similarly to the pixel 100 (for example, the pixel 100A in FIG. 7) of the second embodiment.

Furthermore, in the pixel 300A, since the position in the depth direction of the low-sensitivity photodiode 321-2 is on a light incident side, not on the wiring side, a vertical transistor 331 is formed in the silicon (Si) of the semiconductor substrate 312. A charge accumulated in the low-sensitivity photodiode 321-2 is read by the vertical transistor 331.

Here, in the pixel 300A, the silicon (Si) of the semiconductor substrate 312 is dug from the wiring side, and a trench-type in-pixel capacitor (FC) 323A is embedded in this dug portion. In other words, in the pixel 300A, the low-sensitivity photodiode 321-2 and the in-pixel capacitor 323A have a stacked structure.

Therefore, in the case of the structure in which the low-sensitivity photodiode and the in-pixel capacitor (FC) are not stacked (for example, the structure of the plane view in FIGS. 10A and 10B or 12) like the above-described second embodiment, the region of the in-pixel capacitor (FC) needs to be secured in the plane direction. However, in the pixel 300A, a region of the in-pixel capacitor 323 (323A) does not need to be secured in the plane direction, as illustrated in the plan view in FIG. 24.

Then, the size in the plane direction of the high-sensitivity photodiode 321-1 can be expanded ("PDL expansion region" in FIG. 24) by allocating the region of the in-pixel capacitor 323 (323A) stacked on the low-sensitivity photodiode 321-2 to a region of the high-sensitivity photodiode 321-1. As a result, in the pixel 300A, the difference in size in the plane direction between the high-sensitivity photodiode 321-1 and the low-sensitivity photodiode 321-2 can be made larger, and thus the difference in sensitivity between a high-sensitivity pixel 301A-1 and the low-sensitivity pixel 301A-2 can be made larger.

Figure 26:
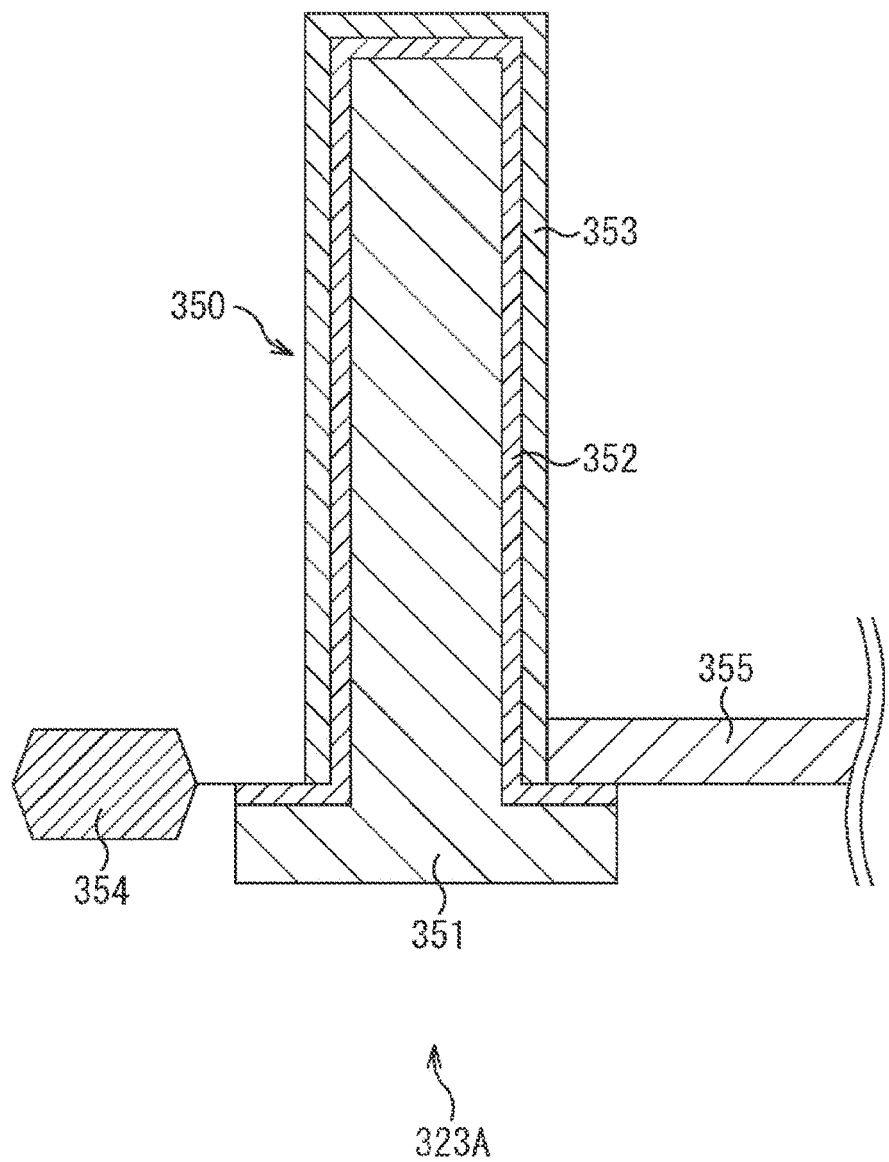
FIG. 26 is a cross-sectional view illustrating a structure of an in-pixel capacitor 323A.

FIG. 26 illustrates an example of a structure of the trench-type in-pixel capacitor 323A in FIG. 25. In the in-pixel capacitor 323A in FIG. 26, an N-layer 353 corresponding to a lower electrode is formed on an inner wall and a bottom surface of a dug portion 350 dug from the wiring side. Furthermore, a capacitor film 352 is formed on an inner wall and a bottom surface in the dug portion 350 and on a substrate in a formed region of the in-pixel capacitor 323A.

An upper electrode 351 embedded in the dug portion 350 and protruding from a substrate surface is formed on the capacitor film 352. Further, an element isolation portion 354 is formed around the in-pixel capacitor 323A. Moreover, in FIG. 26, an N+ layer 355 corresponding to a source of the transfer transistor is formed on the surface of the substrate located on the right side of the in-pixel capacitor 323A.

As described above, the pixel 300A has the structure illustrated in FIGS. 24 to 26, thereby to further enhance the sensitivity of the high-sensitivity photodiode 321-1 expanded to the PDL expansion region (the region secured by having the in-pixel capacitor 323A to have a stacked structure) than the sensitivity of the low-sensitivity photodiode 321-2. As a result, the difference in sensitivity between the high-sensitivity pixel 301A-1 and the low-sensitivity pixel 301A-2 can be further expanded.

(3-B) A Structure in which a Low-Sensitivity PD and an Oxide Film are Stacked (a Dug Portion from the Wiring Side)

Next, the pixel 300B having a structure in which a low-sensitivity photodiode (PD) and an oxide film are stacked will be described with reference to the cross-sectional view in FIG. 27. Note that, although not illustrated, the cross-sectional view in FIG. 27 corresponds to the cross section of the dotted line XX' in the plan view in FIG. 24.

Figure 27:
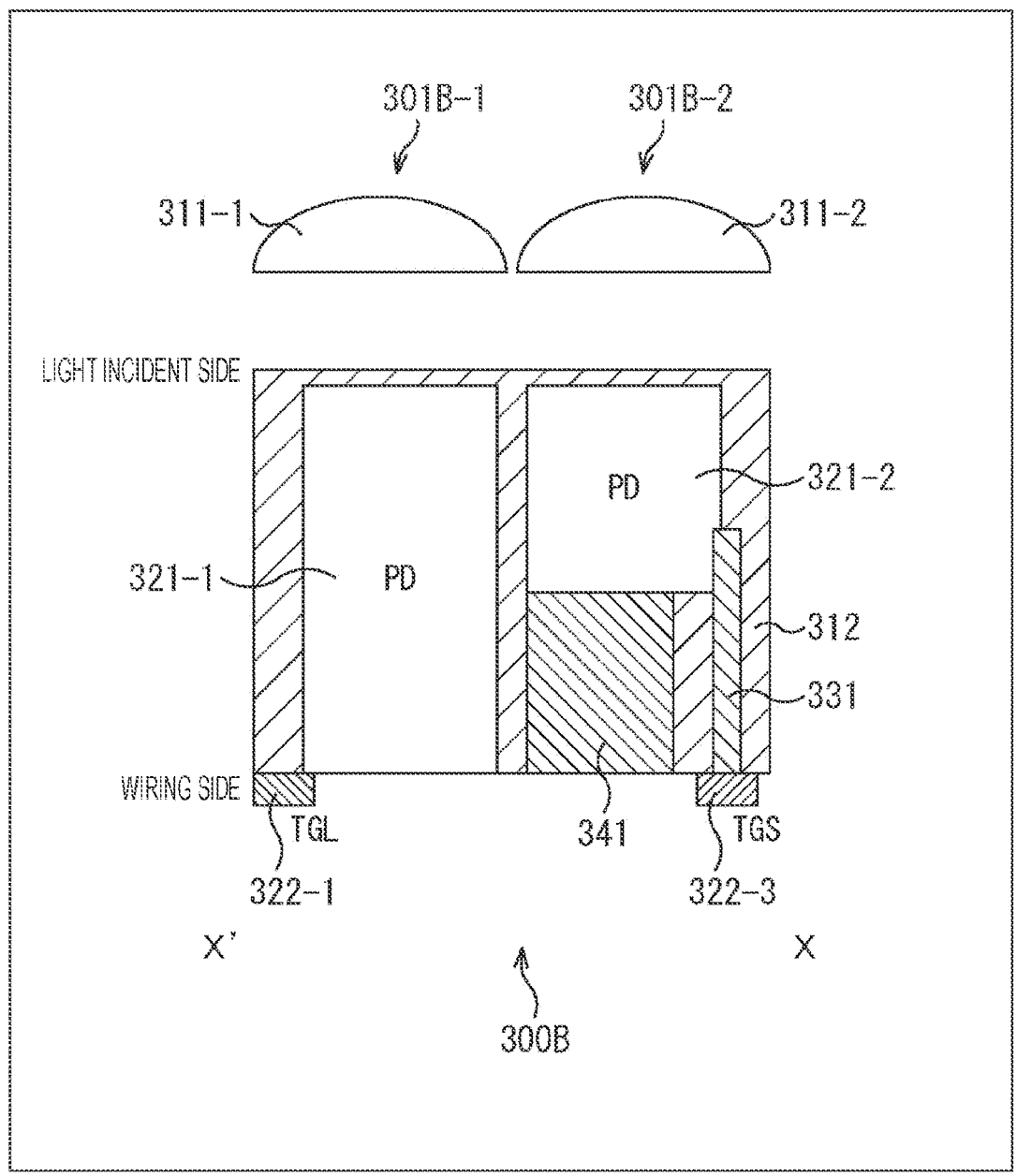
FIG. 27 is a cross-sectional view illustrating a structure of a pixel 300B of the fourth embodiment.

In the pixel 300B in FIG. 27, the size in the depth direction of the low-sensitivity photodiode 321-2 is smaller than the size in the depth direction of the high-sensitivity photodiode 321-1, similarly to the pixel 300A in FIG. 25. Furthermore, in the pixel 300A, a charge accumulated in the low-sensitivity photodiode 321-2 is read by the vertical transistor 331.

Meanwhile, in the pixel 300B, an oxide film 341 is embedded in the dug portion from the wiring side formed in the silicon (Si) of the semiconductor substrate 312. In other words, in the case where the in-pixel capacitor 323A is not stacked with the low-sensitivity photodiode 321-2 as in the pixel 300A (FIG. 25), the structure in which the oxide film 341 is embedded in the dug portion can be adopted. With the structure, in the pixel 300B, the low-sensitivity photodiode 321-2 and the oxide film 341 have a stacked structure.

Note that the substance embedded in the dug portion formed in the semiconductor substrate 312 in the pixel 300B is not limited to the oxide film 341, and another substance may be embedded.

(3-C) A Structure in which a Low-Sensitivity PD and an Oxide Film are Stacked (a Dug Portion from the Light Incident Side)

Next, the pixel 300C having a structure in which a low-sensitivity photodiode (PD) and an oxide film are stacked will be described with reference to the cross-sectional view in FIG. 28. Note that, although not illustrated, the cross-sectional view in FIG. 28 corresponds to the cross section of the dotted line XX' in the plan view in FIG. 24.

Figure 28:
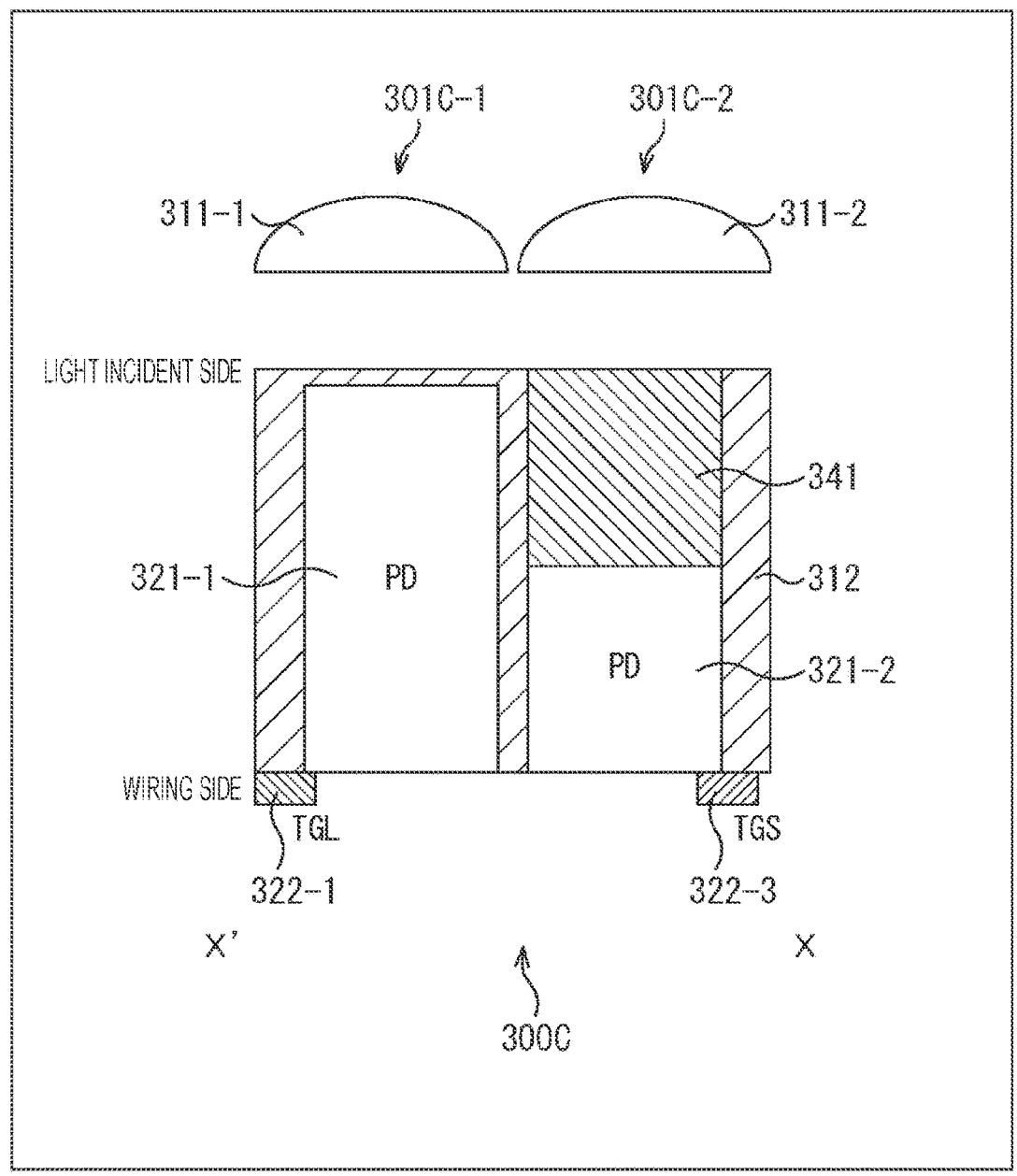
FIG. 28 is a cross-sectional view illustrating a structure of a pixel 300C of the fourth embodiment.

In the pixel 300C in FIG. 28, the size in the depth direction of the low-sensitivity photodiode 321-2 is smaller than the size in the depth direction of the high-sensitivity photodiode 321-1, similarly to the pixel 300B in FIG. 27.

Meanwhile, in the pixel 300C, since the position in the depth direction of the low-sensitivity photodiode 321-2 is on the wiring side, not on the light incident side, the third transfer transistor 322-3 directly reads the charge accumulated in the low-sensitivity photodiode 321-2. In this respect, the structure is different from the structure of the pixel 300B (FIG. 27) in which the charge is read from the low-sensitivity photodiode 321-2 by the vertical transistor 331.

Furthermore, in the pixel 300C, the silicon (Si) of the semiconductor substrate 312 is dug from the light incident side, and the oxide film 341 is embedded in this dug portion. In other words, in the case where the in-pixel capacitor 323A is not stacked with the low-sensitivity photodiode 321-2 as in the pixel 300A (FIG. 25), the structure in which the oxide film 341 is embedded can be adopted. The oxide film 341 can be embedded in the dug portion dug from the wiring side or the light incident side. With the structure, in the pixel 300C, the low-sensitivity photodiode 321-2 and the oxide film 341 have a stacked structure.

Note that the substance embedded in the dug portion formed in the semiconductor substrate 312 in the pixel 300C is not limited to the oxide film 341, and another substance may be embedded.

(3-D) A Structure Including Inter-Pixel Light Shielding

Next, the pixel 300D having a structure including inter-pixel light shielding will be described with reference to the cross-sectional view in FIG. 29. Note that, although not illustrated, the cross-sectional view in FIG. 29 corresponds to the cross section of the dotted line XX' in the plan view in FIG. 24.

Figure 29:
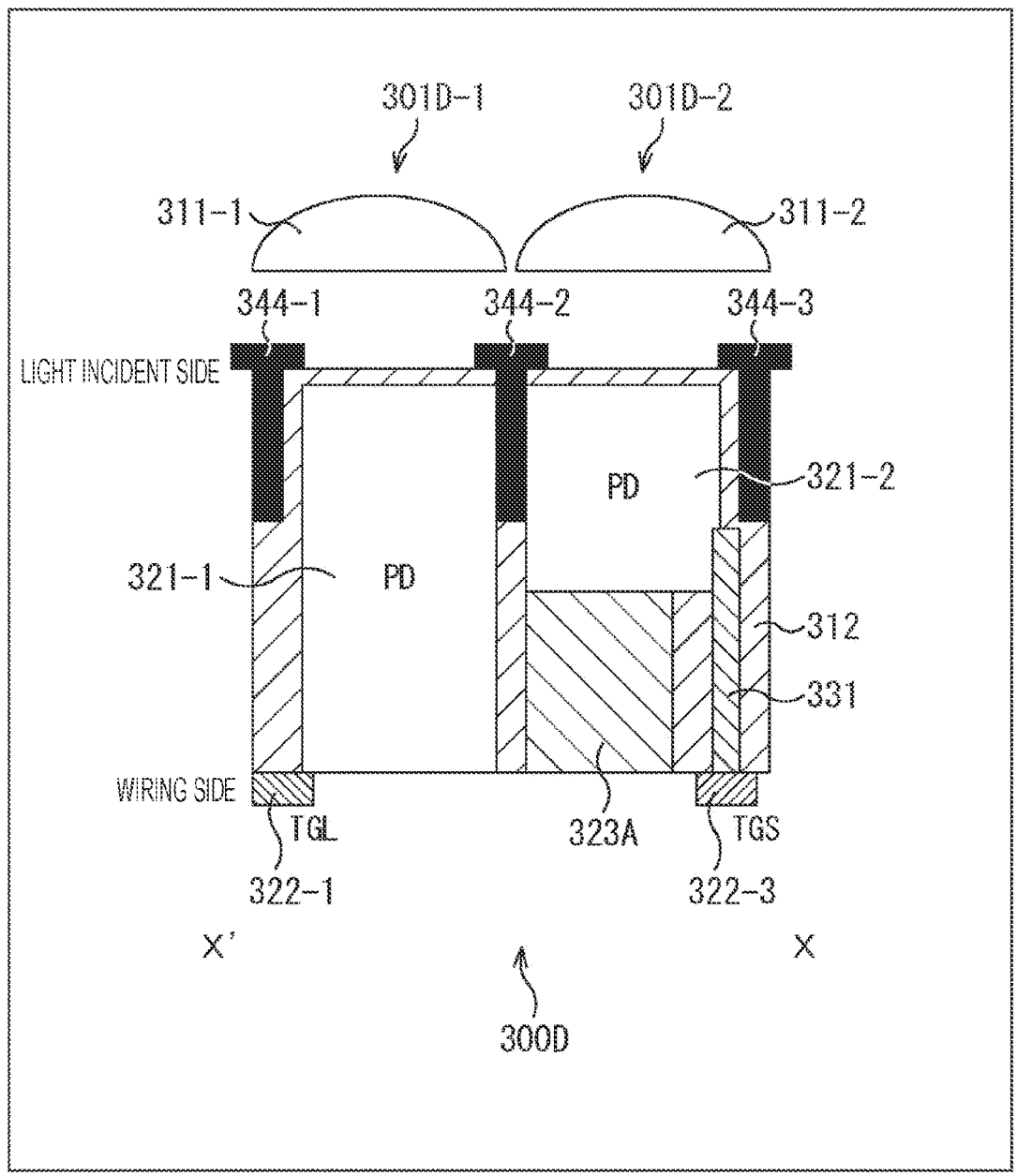
FIG. 29 is a cross-sectional view illustrating a structure of a pixel 300D of the fourth embodiment.

In the pixel 300D in FIG. 29, the size in the depth direction of the low-sensitivity photodiode 321-2 is smaller than the size in the depth direction of the high-sensitivity photodiode 321-1, similarly to the pixel 300A in FIG. 25. Furthermore, in the pixel 300D, a charge accumulated in the low-sensitivity photodiode 321-2 is read by the vertical transistor 331.

Furthermore, the pixel 300D has a structure in which the trench-type in-pixel capacitor 323A is embedded in the dug portion from the wiring side in the silicon (Si) of the semiconductor substrate 312, and the low-sensitivity photodiode 321-2 and the in-pixel capacitor 323A have a stacked structure, similarly to the pixel 300A in FIG. 25. With the structure, in the pixel 300D, the size in the plane direction of the high-sensitivity photodiode 321-1 can be expanded by allocating the region of the in-pixel capacitor 323 (323A) stacked on the low-sensitivity photodiode 321-2 to the region of the high-sensitivity photodiode 321-1, similarly to the pixel 300A in FIG. 25.

Here, in the pixel 300D, light shielding films 344-1 to 344-3 are formed by an RDTI structure between the high-sensitivity photodiode 321-1 and the low-sensitivity photodiode 321-2, and element isolation is performed. With the structure, inter-pixel light shielding for preventing leakage of incident light from an adjacent pixel is realized, and thus color mixture between the high-sensitivity photodiode 321-1 and the low-sensitivity photodiode 321-2 can be suppressed.

As described above, the pixel 300D has the structure of the cross section illustrated in FIG. 29, thereby to expand the region of the high-sensitivity photodiode 321-1 up to the PDL expansion region (FIG. 24). Therefore, the difference in sensitivity between the high-sensitivity pixel 301A-1 and the low-sensitivity pixel 301A-2 can be further expanded. Furthermore, the pixel 300D adopts the RDTI structure between the high-sensitivity photodiode 321-1 and the low-sensitivity photodiode 321-2, thereby to suppress the color mixture.

Note that the embedded electrode portion of the in-pixel capacitor 323A is set to a charge accumulation region, whereby color mixture between the high-sensitivity photodiode 321-1 and the in-pixel capacitor 323A can be suppressed. Furthermore, the pixel 300D is equivalent to a structure in which a light shielding film 343 is provided in the pixel 300A (FIG. 25). A structure provided with the light shielding film 344 may be similarly adopted to the pixel 300B (FIG. 27) or the pixel 300C (FIG. 28).

(3-E) A Structure in which a Low-Sensitivity PD and an In-Pixel Capacitor FC are Stacked (Another Structure of the In-Pixel Capacitor)

Finally, the pixel 300E having a structure in which a low-sensitivity photodiode (PD) and an in-pixel capacitor (FC) are stacked will be described with reference to FIGS. 30 and 31. Note that, although not illustrated, the cross-sectional view in FIG. 30 corresponds to the cross section of the dotted line XX' in the plan view in FIG. 24.

Figure 30:
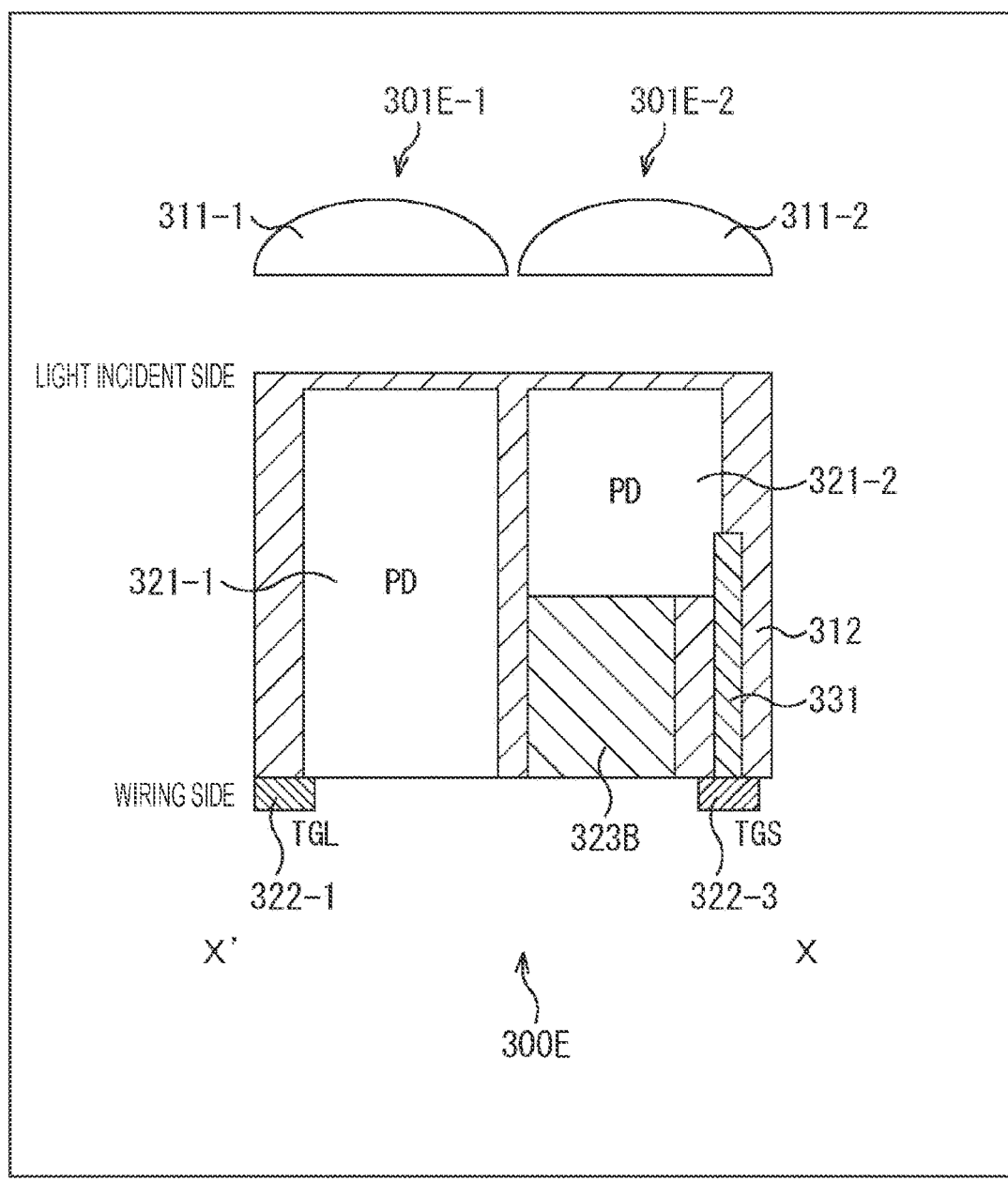
FIG. 30 is a cross-sectional view illustrating a structure of a pixel 300E of the fourth embodiment.

In the pixel 300E in FIG. 30, the size in a depth direction of the low-sensitivity photodiode 321-2 is smaller than the size in a depth direction of the high-sensitivity photodiode 321-1, similarly to the pixel 300A in FIG. 25. Furthermore, in the pixel 300E, a charge accumulated in the low-sensitivity photodiode 321-2 is read by the vertical transistor 331.

Furthermore, the pixel 300E has a structure in which a trench-type in-pixel capacitor 323B is embedded in a dug portion from the wiring side in the silicon (Si) of the semiconductor substrate 312, and the low-sensitivity photodiode 321-2 and the in-pixel capacitor 323B have a stacked structure, similarly to the pixel 300A in FIG. 25.

Figure 31:
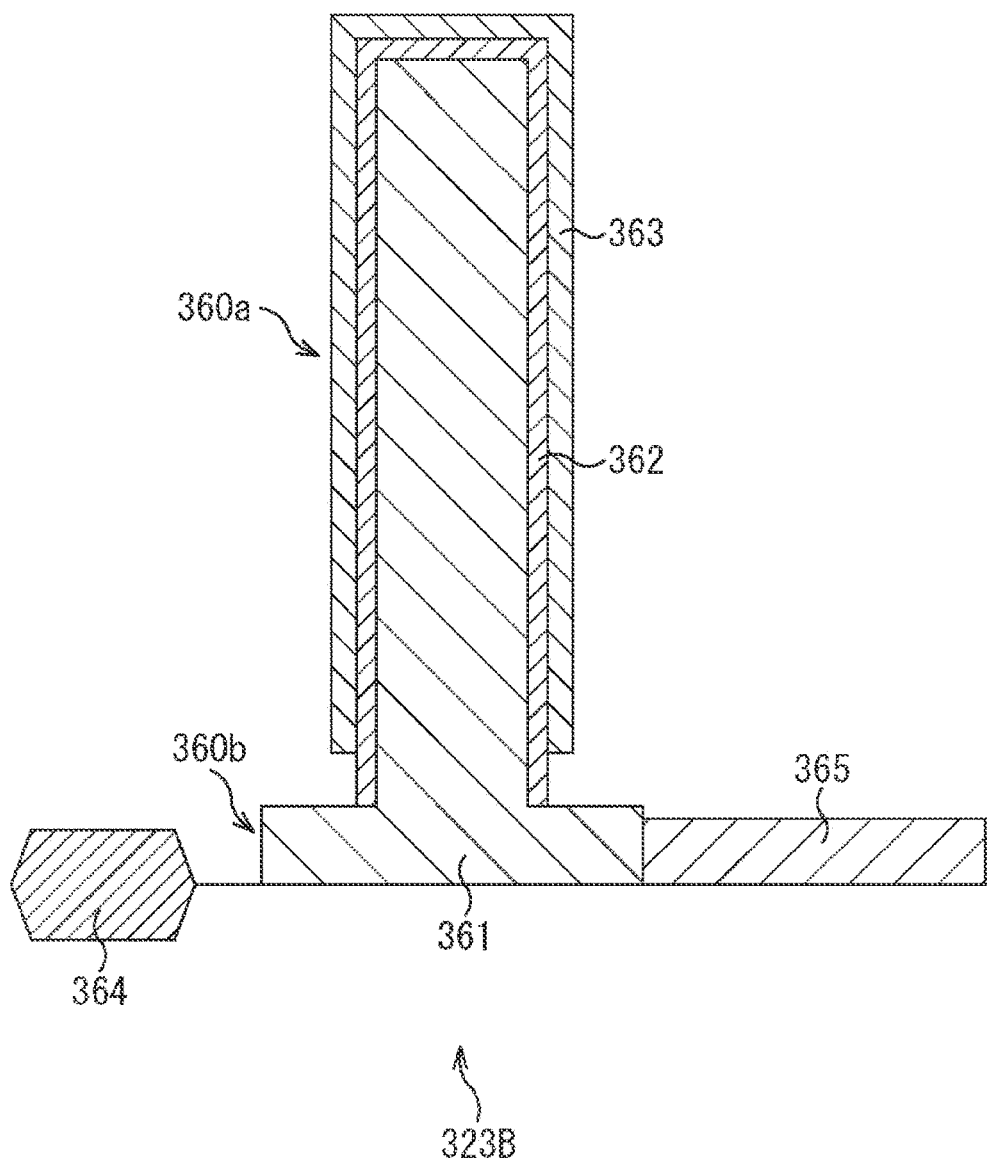
FIG. 31 is a cross-sectional view illustrating a structure of an in-pixel capacitor 323B.

Here, FIG. 31 illustrates an example of a structure of the trench-type in-pixel capacitor 323B in FIG. 30. In the in-pixel capacitor 323B in FIG. 31, a P-layer 363 is formed as a lower electrode on an inner wall surface and a bottom surface of a first dug portion 360a. The P-layer 363 is connected to a P well layer of the substrate. Then, a capacitor film 362 is formed on an inner wall surface and a bottom surface of the first dug portion 360a.

Then, a trench-type upper electrode 361 is formed on the substrate to cover the capacitor film 362 and to be embedded in a second dug portion 360b formed in a vicinity of the substrate surface. In the in-pixel capacitor 323B, an N+ layer 365 corresponding to a source of the transfer transistor and the upper electrode 361 are connected.

Note that the pixel 300E has a similar structure to the pixel 300A (FIG. 25) except that the in-pixel capacitor 323B is embedded instead of the in-pixel capacitor 323A. Accordingly, in the pixel 300E, the size in the plane direction of the high-sensitivity photodiode 321-1 can be expanded by allocating the region of the in-pixel capacitor 323B stacked on the low-sensitivity photodiode 321-2 to the region of the high-sensitivity photodiode 321-1.

As described above, the pixel 300E has the structure of the cross section illustrated in FIGS. 30 and 31, thereby to expand the region of the high-sensitivity photodiode 321-1 up to the PDL expansion region (FIG. 24). Therefore, the difference in sensitivity between the high-sensitivity pixel 301A-1 and the low-sensitivity pixel 301A-2 can be further expanded.

As described above, the pixels 300A to 300E have been described as the fourth embodiment. In the fourth embodiment, the size in the plane direction of the high-sensitivity photodiode can be expanded using the vacant region (for example, the PDL expansion region in FIG. 24) obtained by limiting the size in the depth direction of the low-sensitivity photodiode, and further having the structure in which the in-pixel capacitor (FC) and the like are stacked on the low-sensitivity photodiode. As a result, the difference in sensitivity between a high-sensitivity pixel and a low-sensitivity pixel can be further expanded.

Note that, in the pixel 300 of the fourth embodiment, similarly to the pixel 100 of the second embodiment and the like, the size in the plane direction (the area of the light receiving surface) of the low-sensitivity photodiode can be expanded, and the in-pixel capacitor (charge accumulation unit) can be further provided in the low-sensitivity photodiode, by limiting the size in the depth direction of the low-sensitivity photodiode of the low-sensitivity pixel. Therefore, a wide dynamic range characteristic can be obtained.

6. Fifth Embodiment: Structure Using Moth-Eye Structure for High-Sensitivity PD

Next, a fifth embodiment will be described with reference to FIGS. 32 to 36.

By the way, in a pixel, a so-called moth-eye structure is known in which a fine uneven structure is provided in an interface on a light receiving surface side (light incident side) of a silicon layer in which a photodiode is formed. Reflection of incident light can be prevented using the moth-eye structure, and the moth-eye structure can diffract the incident light, and thus an optical path length of light, which is to be photoelectrically converted in the photodiode, can be made long.

Here, it is known that the sensitivity of the photodiode can be increased if the optical path length of light to be photoelectrically converted can be made long. The fifth embodiment enables formation of a high-sensitivity pixel with higher sensitivity using this principle. Moreover, the fifth embodiment enables expansion of the dynamic range in a pixel including a high-sensitivity pixel and a low-sensitivity pixel using this principle.

Note that, in the fifth embodiment, pixels 400A to 400D will be described as pixels 400 arranged in a pixel array unit 11 of a CMOS image sensor 10 (FIG. 1) in a two-dimensional manner.

Furthermore, in the pixel 400, a pixel circuit of a high-sensitivity photodiode 421-1, a low-sensitivity photodiode 421-2, a first transfer transistor 422-1 to a selection transistor 429, and the like corresponds to the pixel circuit of the high-sensitivity photodiode 121-1, the low-sensitivity photodiode 121-2, the first transfer transistor 122-1 to the selection transistor 129, and the like, in the pixel 100 in FIG. 2.

(4-A) Basic Structure: A Moth-Eye Structure of a High-Sensitivity PD

First, the pixel 400A in which a high-sensitivity photodiode (PD) has a moth-eye structure will be described with reference to the cross-sectional view in FIG. 32.

Figure 32:
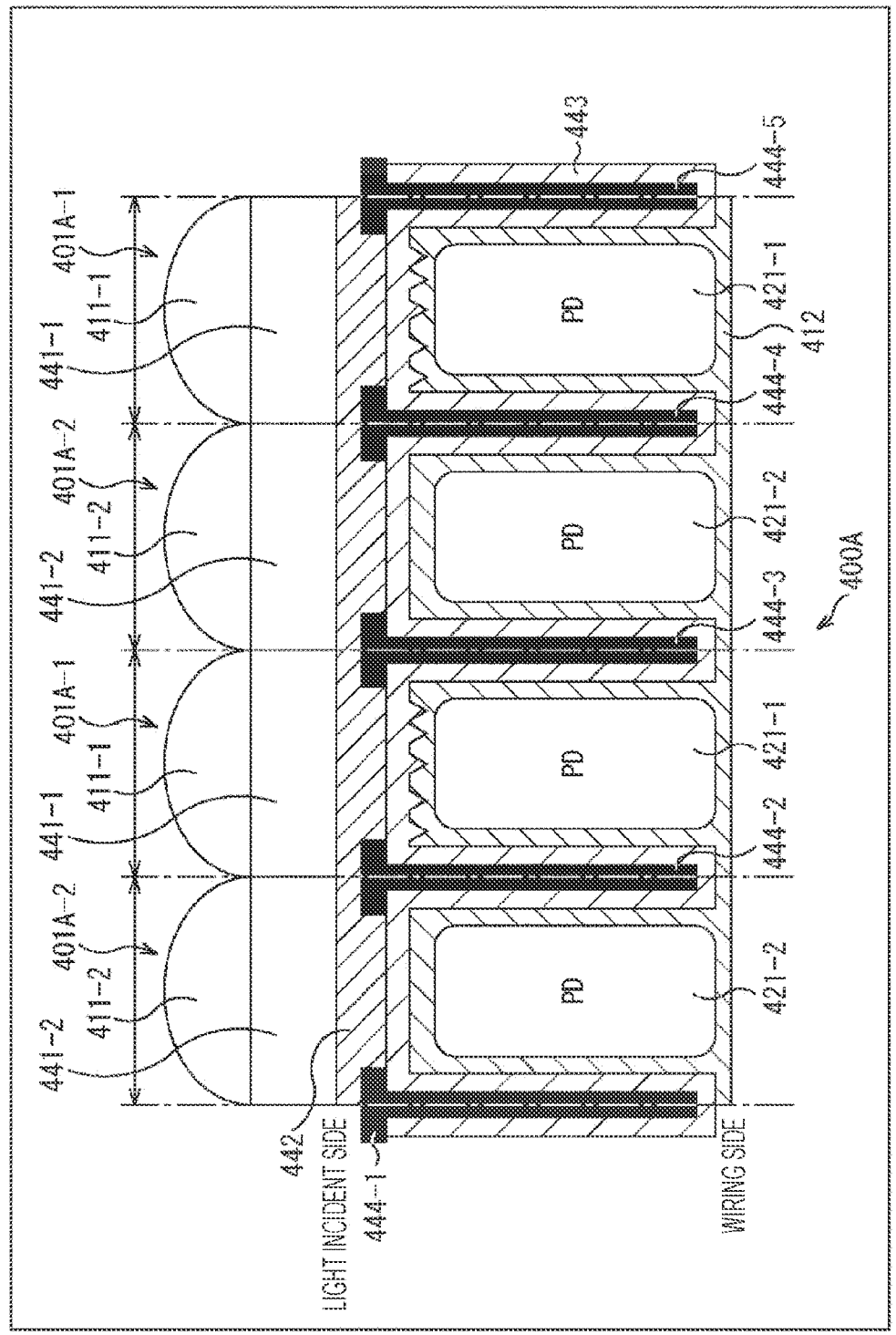
FIG. 32 is a cross-sectional view illustrating a structure of a pixel 400A of a fifth embodiment.

In FIG. 32, a pixel including a high-sensitivity pixel 401A-1 and a low-sensitivity pixel 401A-2 is illustrated as an example of the pixels 400A arranged in the pixel array unit 11 of the CMOS image sensor 10 (FIG. 1) in a two-dimensional manner.

In FIG. 32, in the semiconductor substrate 412, an N-type photodiode 421 is formed for each pixel in P-type silicon (Si).

Note that, in the pixel 400A, the sizes in a plane direction (areas of light receiving surfaces) of the photodiodes 421 formed in a semiconductor substrate 412 and the sizes in a depth direction of silicon (Si) are the same. Furthermore, in the pixel 400A, outer sizes of on-chip lenses 411 that allow light to enter the photodiodes 421 are also the same Here, a fine uneven structure is formed by the moth-eye structure in an interface (an interface on a light receiving surface side) of a P-type semiconductor region in an upper portion of a photodiode 421-1 among the four photodiodes 421 formed in the semiconductor substrate 412 illustrated in FIG. 32. Meanwhile, the moth-eye structure is not formed in an upper portion of a photodiode 421-2.

In other words, the high-sensitivity photodiode 421-1 can diffract the incident light by the moth-eye structure, thereby to make the optical path length of light, which is to be photoelectrically converted, longer than the low-sensitivity photodiode 421-2. Then, as described above, the sensitivity of the photodiode 421 can be increased if the optical path length of light to be photoelectrically converted can be made long. Note that the shape of the moth-eye structure including silicon (Si) is formed to have a shape corresponding to a wavelength to be absorbed.

In this way, the moth-eye structure is formed for the photodiode 421 for which the sensitivity is desired to be increased. As a result, the sensitivity of the photodiode 421-1 can be enhanced as compared with the sensitivity of the photodiode 421-2.

As a result, in the pixel 400A, the photodiode 421-2 not having the moth-eye structure serves as a low-sensitivity photodiode whereas the photodiode 421-1 having the moth-eye structure can serve as a high-sensitivity photodiode among the four photodiodes 421 formed in the semiconductor substrate 412.

In other words, it can be said that the pixel 400A is configured by the high-sensitivity pixel 401A-1 having the high-sensitivity photodiode 421-1 and the low-sensitivity pixel 401A-2 having the low-sensitivity photodiode 421-2.

Note that in the pixel 400A, a pinning film 443 covering an upper surface of the semiconductor region and light shielding films 444-1 to 444-5 are formed in dug portions of the semiconductor region on a back side (light incident side) of the semiconductor substrate 412. The pinning film 443 is formed using a high-dielectric substance having a negative fixed charge so that a positive charge (hole) accumulation region is formed in the interface portion of the semiconductor substrate 412 and generation of dark current is suppressed.

Furthermore, the light shielding films 444-1 to 444-5 are formed between the photodiodes 421 in the semiconductor region of the semiconductor substrate 412, and element isolation is performed. With the structure, inter-pixel light shielding for preventing leakage of incident light from an adjacent pixel is realized. An insulating film 442 is formed on an entire upper surface of the pinning film 443 including the light shielding films 444-1 to 444-5.

Furthermore, in the pixel 400A, a color filter 441 is formed between an on-chip lens 411 and the insulating film 442. Here, for example, one of color filters 441-1 corresponding to the high-sensitivity photodiodes 421-1 can be a red (R) color filter and the other color filter can be a green (G) color filter. Furthermore, for example, one of color filters 441-2 corresponding to the low-sensitivity photodiodes 421-2 can be a red (R) color filter and the other color filter can be a green (G) color filter.

Note that, although not illustrated in FIG. 32, in the pixel 400A, the pixel circuits including the first transfer transistor 422-1, the third transfer transistor 422-3, and the like are respectively connected to the high-sensitivity photodiode 421-1 and the low-sensitivity photodiode 421-2. Then, the first transfer transistor 422-1 and the third transfer transistor 422-3 are operated in accordance with the drive signals TGL, TGS, and the like, whereby the charges accumulated in the high-sensitivity photodiode 421-1 and the low-sensitivity photodiode 421-2 are read.

As described above, since the pixel 400A has the cross-sectional structure illustrated in FIG. 32, the sensitivity of the high-sensitivity photodiode 421-1 having the moth-eye structure can be enhanced as compared with the sensitivity of the low-sensitivity photodiode 421-2. Furthermore, the pixel 400A has the structure of the cross section illustrated in FIG. 32, thereby to expand the dynamic range.

Figure 33:
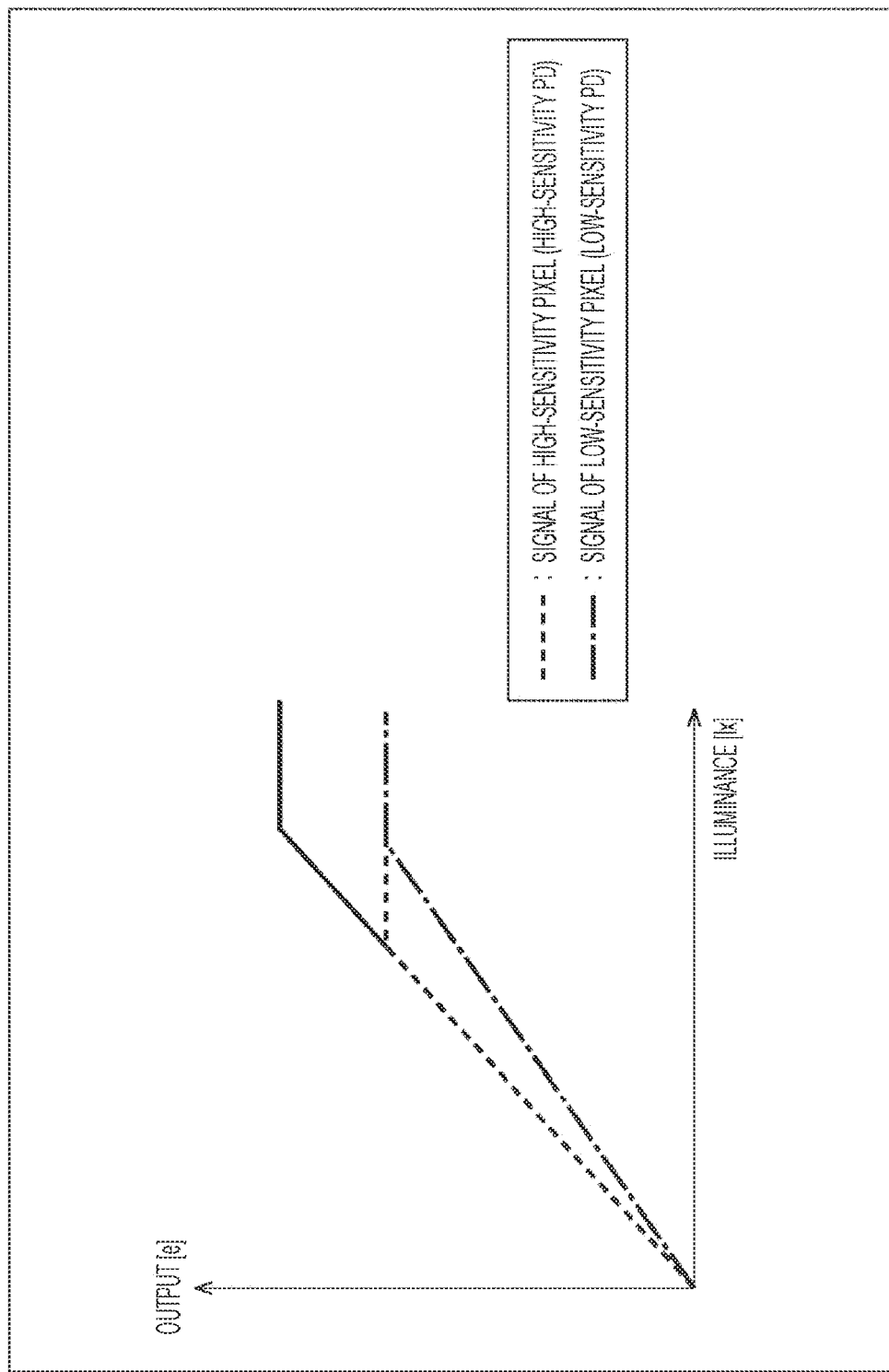
FIG. 33 is a diagram illustrating a method of expanding a dynamic range of a pixel including a high-sensitivity pixel and a low-sensitivity pixel.

Here, FIG. 33 illustrates an example of a dynamic range obtained by adopting the structure of the cross section of the pixel 400A. In FIG. 33, the horizontal axis represents the illuminance of light radiated to each photodiode, and the vertical axis represents the amount of charges output from each photodiode. Furthermore, the dotted line in FIG. 33 illustrates the input/output characteristic of the high-sensitivity pixel 401A-1, and the one dot chain line in FIG. 33 illustrates the input/output characteristic of the low-sensitivity pixel 401A-2. In the pixel 400A, since the surface of the high-sensitivity photodiode 421-1 has the moth-eye structure, the sensitivity of the high-sensitivity pixel 401A-1 is improved while a saturation charge amount (Qs) can be made large without changing the sensitivity of the low-sensitivity pixel 401A-2. Therefore, the dynamic range in the pixel 400A can be enlarged as compared with a normal pixel as illustrated by the solid line in FIG. 33.

(4-B) A Moth-Eye Structure of a High-Sensitivity PD in a Case of Giving a Difference in Sensitivity Between PDs According to Magnitude of OCLs Next, the pixel 400B in which a high-sensitivity photodiode (PD) has a moth-eye structure in the case of giving a difference in sensitivity between photodiodes (PD) according to the magnitude of on-chip lenses (OCL) will be described with reference to the cross-sectional view in FIG. 34.

Figure 34:
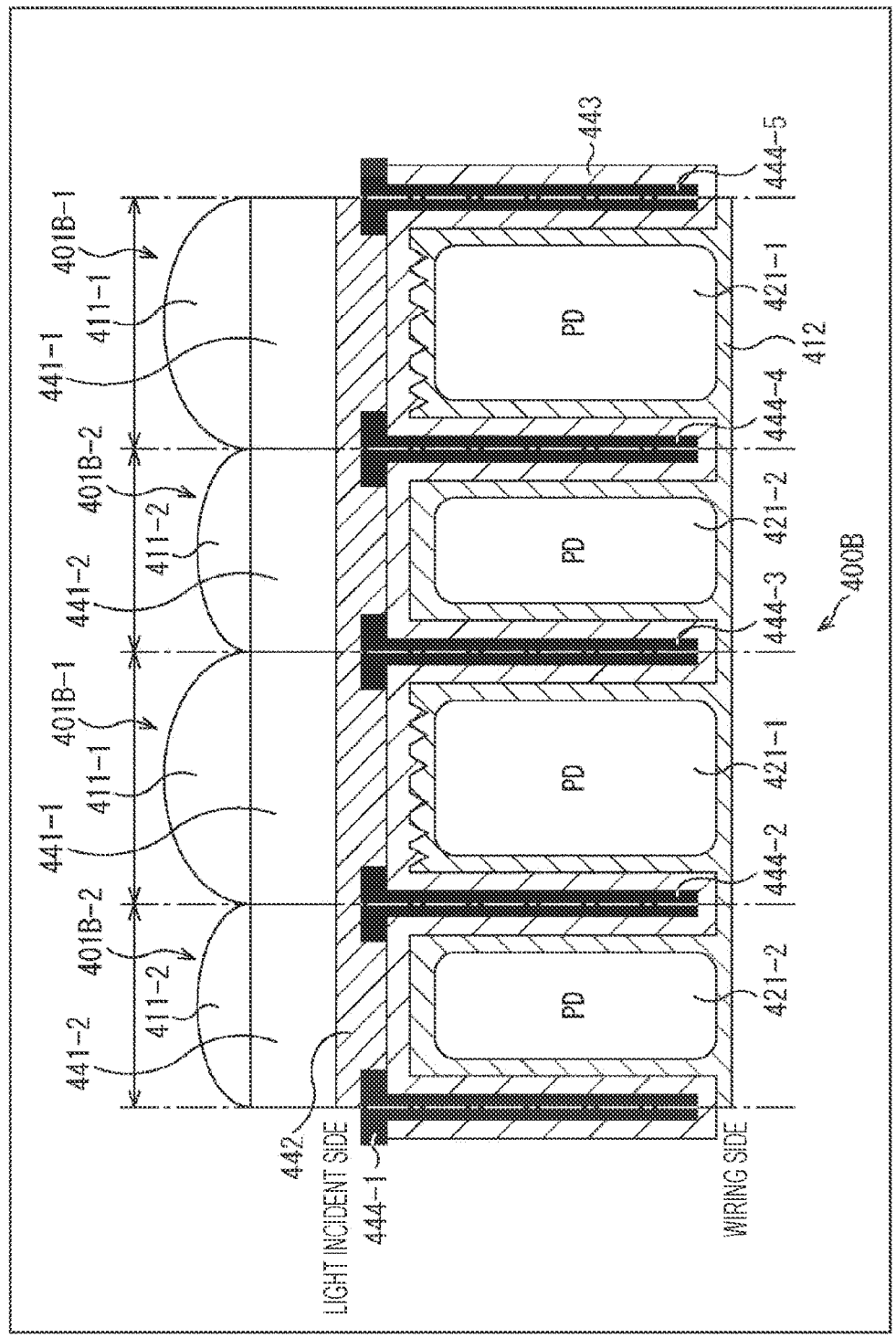
FIG. 34 is a cross-sectional view illustrating a structure of a pixel 400B of the fifth embodiment.

In FIG. 34, a pixel including a high-sensitivity pixel 401B-1 and a low-sensitivity pixel 401B-2 is illustrated as an example of the pixels 400B arranged in a pixel array unit 11 of a CMOS image sensor 10 (FIG. 1) in a two-dimensional manner.

In the pixel 400B in FIG. 34, the photodiode 421 is formed for each pixel on the semiconductor region (silicon (Si)) of the semiconductor substrate 412, similarly to the above-described pixel 400A (FIG. 32). The outer sizes of the on-chip lenses 411 provided corresponding to the photodiodes 421 are different. Furthermore, the sizes in the plane direction (the areas of the light receiving surfaces) of the photodiodes 421 are different according to the sizes of the on-chip lenses 411.

In other words, in the pixel 400B, the outer size of an on-chip lens 411-1 is larger than the outer size of an on-chip lens 411-2. Furthermore, the size in the plane direction of the photodiode 421-1 is larger than the size in the plane direction of the photodiode 421-2 corresponding to the difference in the outer size between the on-chip lenses 411.

As a result, in the pixel 400B, the photodiode 421-2 corresponding to the on-chip lens 411-2 having the small outer size serves as a low-sensitive photodiode, among the four photodiodes 421 formed in the semiconductor substrate 412. On the other hand, the photodiode 421-1 corresponding to the on-chip lens 411-1 having the large outer size serves as a high-sensitive photodiode among the four photodiodes 421.

In other words, it can be said that the pixel 400B is configured by a high-sensitivity pixel 401B-1 including the high-sensitivity photodiode 421-1 and a low-sensitivity pixel 401B-2 including the low-sensitivity photodiode 421-2.

Here, a fine uneven structure is formed by the moth-eye structure in an interface (an interface on a light receiving surface side) of a P-type semiconductor region in an upper portion of the high-sensitivity photodiode 421-1 among the four photodiodes 421 formed in the semiconductor substrate 412 illustrated in FIG. 34. Meanwhile, the moth-eye structure is not formed in an upper portion of the low-sensitivity photodiode 421-2.

In other words, the high-sensitivity photodiode 421-1 has the moth eye structure, thereby to diffract the incident light, and thus can make the optical path length of light, which is to be photoelectrically converted, longer than the low-sensitivity photodiode 421-2 to increase the sensitivity of the high-sensitivity photodiode 421-1.

In this way, in the pixel 400B, the moth-eye structure is formed on the high-sensitivity photodiode 421-1 side. As a result, the sensitivity of the high-sensitivity photodiode 421-1 can be further enhanced as compared with the sensitivity of the low-sensitivity photodiode 421-2.

Note that, in the pixel 400B in FIG. 34, the same reference numerals are given to the portions corresponding to the above-described pixel 400A (FIG. 32), and the description thereof will be omitted to avoid redundant description.

As described above, since the pixel 400B has the cross-sectional structure illustrated in FIG. 34, the sensitivity of the high-sensitivity photodiode 421-1 having the moth-eye structure can be further enhanced as compared with the sensitivity of the low-sensitivity photodiode 421-2.

Note that, in the pixel 400B in FIG. 34, the sizes in the plane direction (the areas of the light receiving surfaces) of the photodiodes 421 have been different in accordance with the sizes of the on-chip lenses 411. However, the sizes in the plane direction of the photodiodes 421 may be the same.

(4-C) A Moth-Eye Structure of a High-Sensitivity PD in a Case of Giving a Difference in Sensitivity Between PDs According to Magnitude of the PDs Next, the pixel 400C in which a high-sensitivity photodiode (PD) has a moth-eye structure in the case of giving a difference in sensitivity between photodiodes (PD) according to the magnitude of the photodiodes (PD) will be described with reference to the cross-sectional view in FIG. 35.

Figure 35:
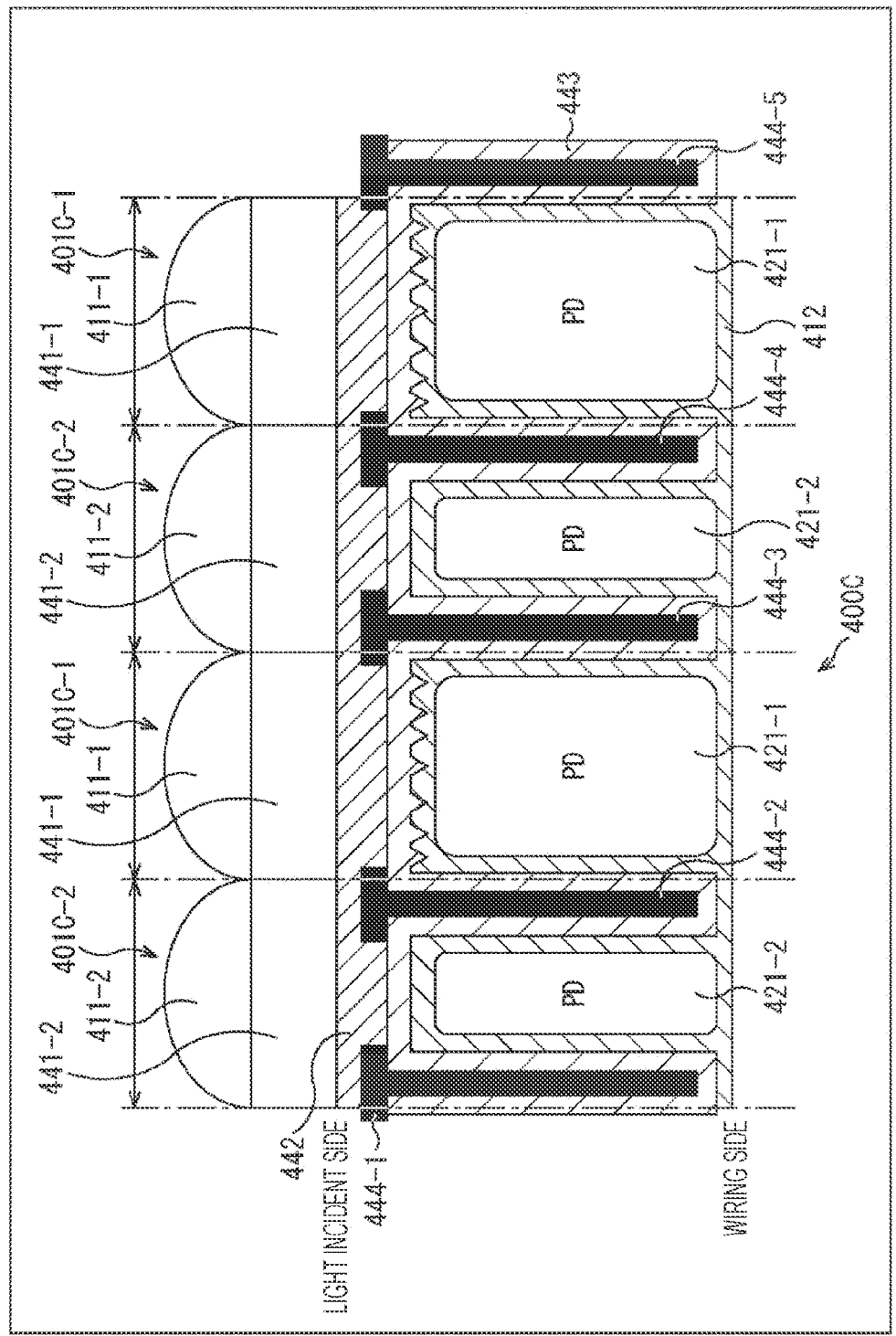
FIG. 35 is a cross-sectional view illustrating a structure of a pixel 400C of the fifth embodiment.

In FIG. 35, a pixel including a high-sensitivity pixel 401C-1 and a low-sensitivity pixel 401C-2 is illustrated as an example of the pixels 400C arranged in a pixel array unit 11 of a CMOS image sensor 10 (FIG. 1) in a two-dimensional manner.

In the pixel 400C in FIG. 35, the photodiode 421 is formed for each pixel on the semiconductor region (silicon (Si)) of the semiconductor substrate 412, similarly to the above-described pixel 400A (FIG. 32). The sizes in the plane direction (the areas of the light receiving surfaces) of the photodiodes 421 are different. Note that, in the pixel 400C, the outer sizes of the on-chip lenses 411 provided corresponding to the photodiodes 421 are the same.

In other words, in the pixel 400C, the size in the plane direction of the photodiode 421-1 is larger than the size in the plane direction of the photodiode 421-2.

Furthermore, the outer size of the on-chip lens 411-1 is larger than the outer size of the on-chip lens 411-2.

As a result, in the pixel 400C, the photodiode 421-2 having the small size in the plane direction serves as a low-sensitivity photodiode whereas the photodiode 421-1 having the large size in the plane direction can serve as a high-sensitivity photodiode among the four photodiodes 421 formed in the semiconductor substrate 412.

In other words, it can be said that the pixel 400C is configured by a high-sensitivity pixel 401C-1 including the high-sensitivity photodiode 421-1 and a low-sensitivity pixel 401C-2 including the low-sensitivity photodiode 421-2.

Here, a fine uneven structure is formed by the moth-eye structure in an interface (an interface on a light receiving surface side) of a P-type semiconductor region in an upper portion of the high-sensitivity photodiode 421-1 among the four photodiodes 421 formed in the semiconductor substrate 412 illustrated in FIG. 35. Meanwhile, the moth-eye structure is not formed in an upper portion of the low-sensitivity photodiode 421-2.

In other words, the high-sensitivity photodiode 421-1 has the moth eye structure, thereby to diffract the incident light, and thus can make the optical path length of light, which is to be photoelectrically converted, longer than the low-sensitivity photodiode 421-2 to increase the sensitivity of the high-sensitivity photodiode 421-1.

In this way, in the pixel 400C, the moth-eye structure is formed on the high-sensitivity photodiode 421-1 side. As a result, the sensitivity of the high-sensitivity photodiode 421-1 can be further enhanced as compared with the sensitivity of the low-sensitivity photodiode 421-2.

Note that, in the pixel 400C in FIG. 35, the same reference numerals are given to the portions corresponding to the above-described pixel 400A (FIG. 32), and the description thereof will be omitted to avoid redundant description.

As described above, since the pixel 400C has the cross-sectional structure illustrated in FIG. 35, the sensitivity of the high-sensitivity photodiode 421-1 having the moth-eye structure can be further enhanced as compared with the sensitivity of the low-sensitivity photodiode 421-2.

(4-D) A Moth-Eye Structure of a High-Sensitivity PD in a Case of Giving a Difference in Sensitivity Between PDs According to Magnitude of OCLs and Magnitude of the PDs Finally, the pixel 400D in which a high-sensitivity photodiode (PD) has a moth-eye structure in the case of giving a difference in sensitivity between photodiodes (PD) according to the magnitude of the photodiodes (PD) and the magnitude of the on-chip lenses (OCLs) will be described with reference to the cross-sectional view in FIG. 36.

Figure 36:
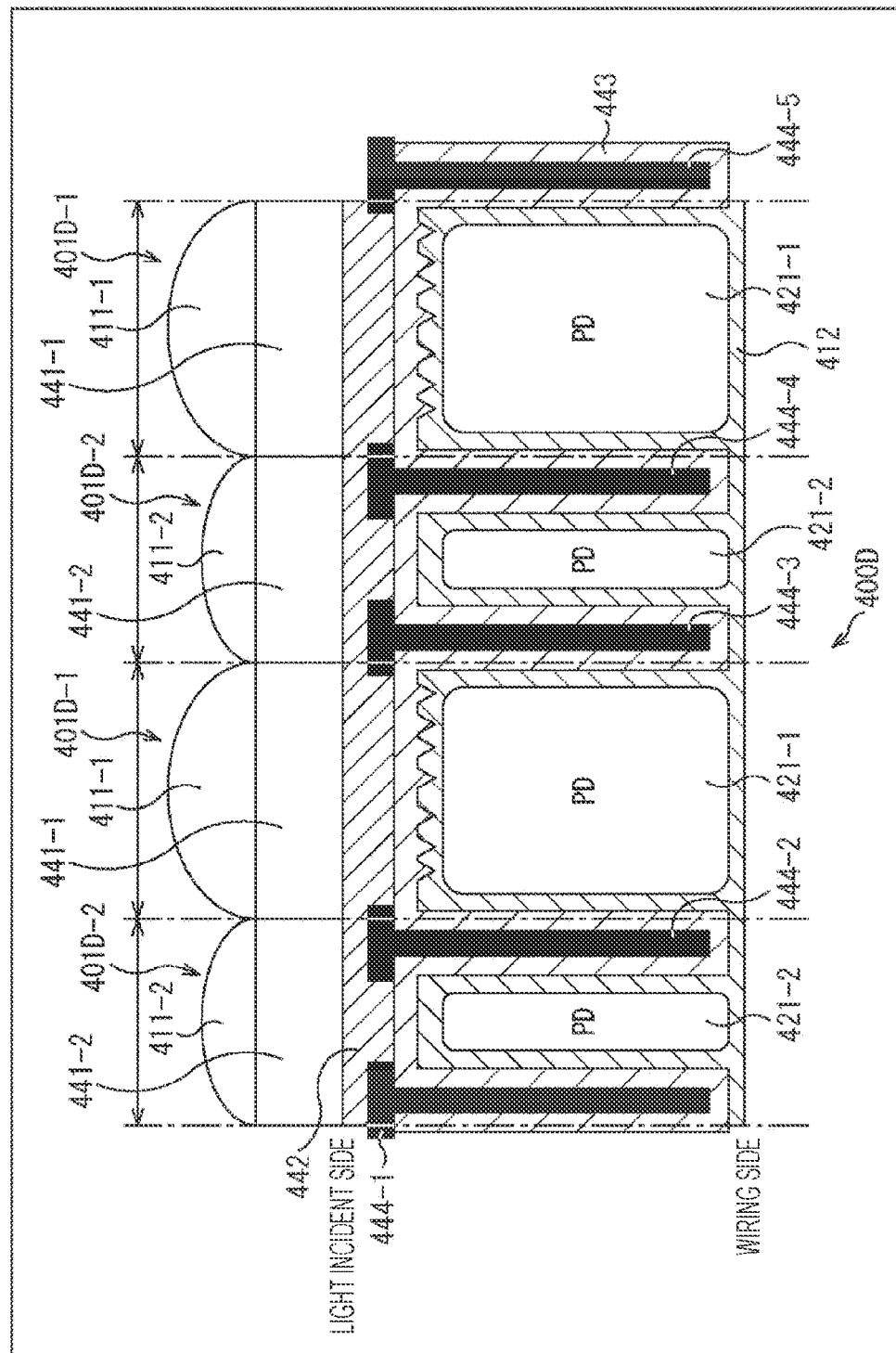
FIG. 36 is a cross-sectional view illustrating a structure of a pixel 400D of the fifth embodiment.

In FIG. 36, a pixel including a high-sensitivity pixel 401D-1 and a low-sensitivity pixel 401D-2 is illustrated as an example of the pixels 400D arranged in a pixel array unit 11 of a CMOS image sensor 10 (FIG. 1) in a two-dimensional manner.

In the pixel 400D in FIG. 36, the photodiode 421 is formed for each pixel on the semiconductor region (silicon (Si)) of the semiconductor substrate 412, similarly to the above-described pixel 400A (FIG. 32). The outer sizes of the on-chip lenses 411 provided corresponding to the photodiodes 421 are different. Furthermore, the sizes in the plane direction (the areas of the light receiving surfaces) of the photodiodes 421 are different according to the sizes of the on-chip lenses 411.

Here, in the pixel 400D, the light shielding film 444 formed between the photodiodes 421 is formed in an inner side of the low-sensitivity pixel 401D-2 than the pixel 400B (FIG. 35).

Specifically, in the low-sensitivity pixel 401D-2 (on the leftmost side in FIG. 36), the light shielding film 444-1 and the light shielding film 444-2 on both sides of the photodiode 421-2 are formed in inner sides. Therefore, the size in the plane direction of the photodiode 421-2 becomes smaller. Similarly, in the other low-sensitivity pixel 401D-2 (the third from the left in FIG. 36), the light shielding film 444-3 and the light shielding film 444-4 are formed in inner sides, and the size in the plane direction of the photodiode 421-2 becomes smaller.

In other words, the outer size of the on-chip lens 411-1 is larger than the outer size of the on-chip lens 411-2. Furthermore, the size in the plane direction of the photodiode 421-2 is further smaller than the size in the plane direction of the photodiode 421-1.

As a result, in the pixel 400D, the photodiode 421-2 corresponding to the on-chip lens 411-2 having the small outer size serves as a low-sensitive photodiode, among the four photodiodes 421 formed in the semiconductor substrate 412. On the other hand, the photodiode 421-1 corresponding to the on-chip lens 411-1 having the large outer size serves as a high-sensitive photodiode among the four photodiodes 421.

Here, a fine uneven structure is formed by the moth-eye structure in an interface (an interface on a light receiving surface side) of a P-type semiconductor region in an upper portion of the high-sensitivity photodiode 421-1 among the four photodiodes 421 formed in the semiconductor substrate 412 illustrated in FIG. 36. Meanwhile, the moth-eye structure is not formed in an upper portion of the low-sensitivity photodiode 421-2.

In other words, the high-sensitivity photodiode 421-1 has the moth eye structure, thereby to diffract the incident light, and thus can make the optical path length of light, which is to be photoelectrically converted, longer than the low-sensitivity photodiode 421-2 to increase the sensitivity of the high-sensitivity photodiode 421-1.

In this way, in the pixel 400D, the moth-eye structure is formed on the high-sensitivity photodiode 421-1 side. As a result, the sensitivity of the high-sensitivity photodiode 421-1 can be further enhanced as compared with the sensitivity of the low-sensitivity photodiode 421-2.

Note that, in the pixel 400D in FIG. 36, the same reference numerals are given to the portions corresponding to the above-described pixel 400A (FIG. 32), and the description thereof will be omitted to avoid redundant description.

As described above, since the pixel 400D has the cross-sectional structure illustrated in FIG. 36, the sensitivity of the high-sensitivity photodiode 421-1 having the moth-eye structure can be further enhanced as compared with the sensitivity of the low-sensitivity photodiode 421-2.

As described above, the pixels 400A to 400D have been described as the fifth embodiment. In the fifth embodiment, the moth-eye structure including the fine uneven structure is formed in the upper region of the high-sensitivity photodiode, and the optical path length of light to be photoelectrically converted is made long, whereby the sensitivity of the high-sensitivity photodiode can be enhanced. Furthermore, the pixel 400 including the high-sensitivity pixel and the low-sensitivity pixel can expand the dynamic range.

Note that, in the pixels 400B to 400D, the cases in which the size in the plane direction (the area of the light receiving surface) of the low-sensitivity photodiode of the low-sensitivity pixel is smaller than the size in the plane direction (the area of the light receiving surface) of the high-sensitivity photodiode of the high-sensitivity pixel has been described. However, a wide dynamic range characteristic may be able to be obtained by setting the size in the plane direction of the low-sensitivity photodiode to be equal to or larger than the size in the plane direction of the high-sensitivity photodiode, similarly to the pixel 100 of the second embodiment, and the like. Furthermore, in the low-sensitivity pixel, an in-pixel capacitor (charge accumulation unit) may be provided in the low-sensitivity photodiode.

7. Sixth Embodiment: Structure in which Low-Sensitivity PD Surrounds Periphery of High-Sensitivity PD Finally, a sixth embodiment will be described with reference to FIGS. 37A, 37B, 38, 39, 40, 41A, 41B, 42A, 42B, 43, 44, 45, 46, 47, 48, 49, and 50.

Figure 37A:
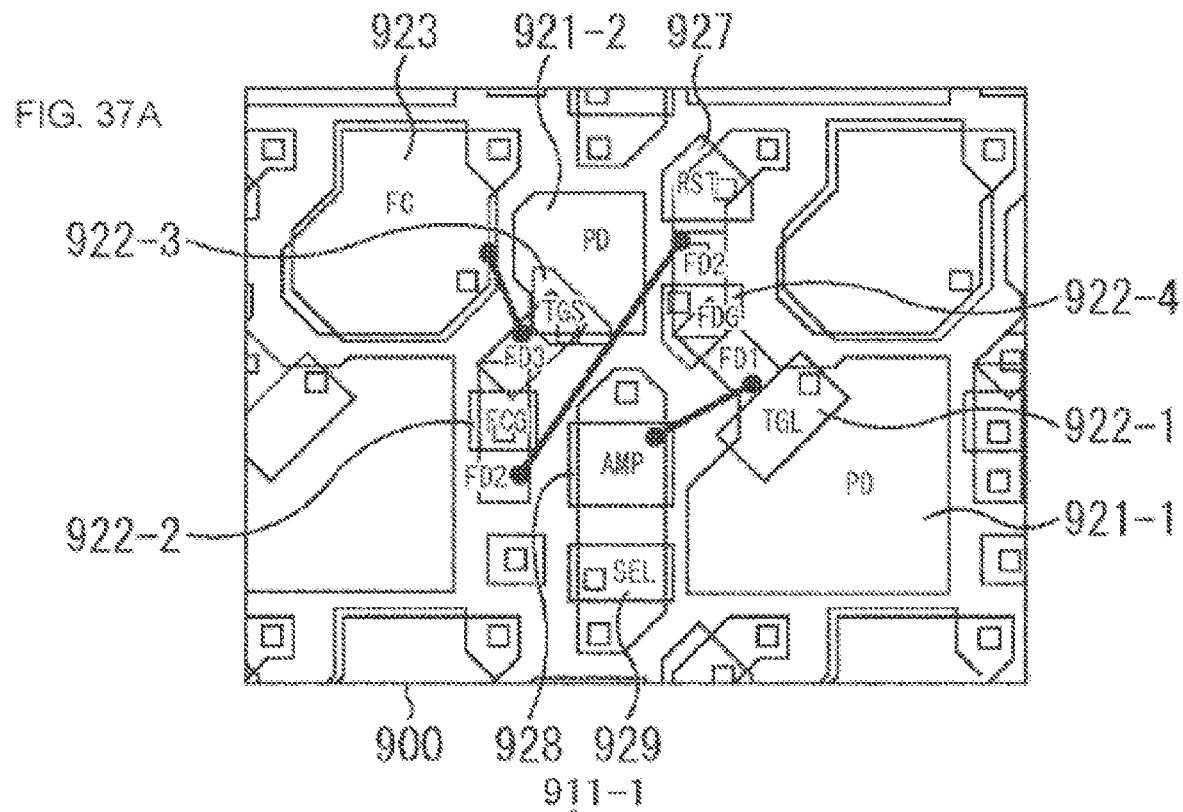
FIGS. 37A and 37B are views illustrating a structure of a pixel of the first embodiment.
Figure 37B:
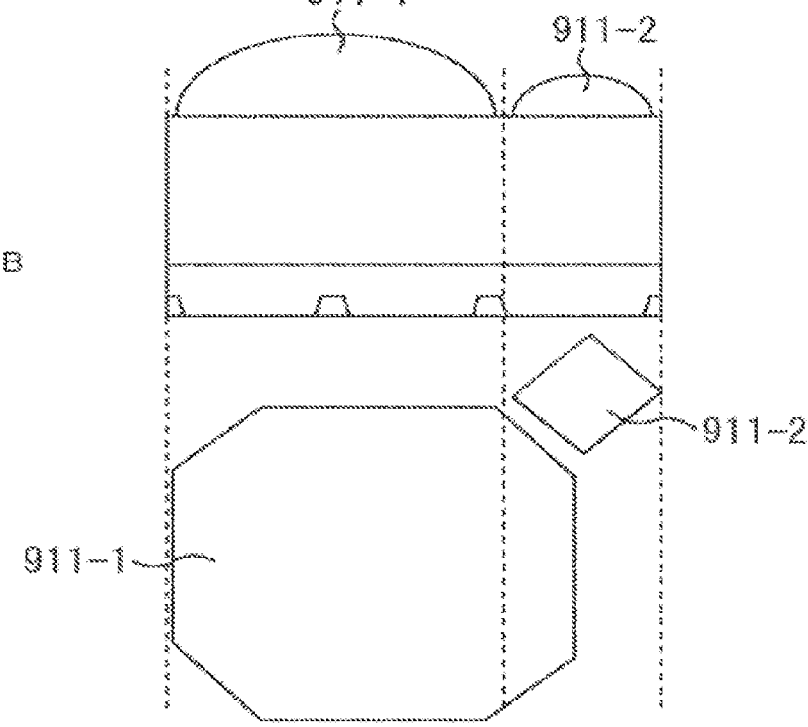

Here, pixels 900 of the first embodiment, which are arranged in a pixel array unit 11 of a CMOS image sensor 10 in FIG. 1 in a two-dimensional manner, will be described with reference to FIGS. 37A and 37B. FIG. 37A illustrates a plan view of a case where the pixel 900 of the first embodiment is viewed from a wiring side, and FIG. 37B illustrates a cross-sectional view and a plan view of the pixel.

In the pixel 900 of the first embodiment, sizes in a plane direction of a high-sensitivity photodiode 921-1 and a low-sensitivity photodiode 921-2 are changed according to a pixel layout illustrated in FIG. 37A. By the way, in the case of changing the sizes in the plane direction of the high-sensitivity photodiode 921-1 and the low-sensitivity photodiode 921-2 in such a layout, an on-chip lens 911-1 and an on-chip lens 911-2 illustrated in FIG. 37B need to be formed, for example.

However, at present, there is no established method of forming an on-chip lens including a high-sensitivity pixel and a low-sensitivity pixel having different pixel sizes and different lens thicknesses, and a method for forming the on-chip lens including a high-sensitivity pixel and a low-sensitivity pixel, which is a general method of forming an on-chip lens, has been sought. Furthermore, in the pixel layout illustrated in FIG. 37A, the layout becomes difficult in a case where pupil correction is applied.

Therefore, the sixth embodiment adopts a structure in which a low-sensitivity pixel surrounds a high-sensitivity pixel in a pixel, not only the dynamic range in the pixel including the low-sensitivity pixel and the high-sensitivity pixel is expanded but also formation of the on-chip lens and the pupil correction are facilitated.

Note that, in the sixth embodiment, pixels 500A to 500D will be described as pixels 500 arranged in a pixel array unit 11 of a CMOS image sensor 10 (FIG. 1) in a two-dimensional manner.

Furthermore, in the pixel 500, a pixel circuit of a high-sensitivity photodiode 521-1, a low-sensitivity photodiode 521-2, a first transfer transistor 522-1 to a selection transistor 529, and the like corresponds to the pixel circuit of the high-sensitivity photodiode 121-1, the low-sensitivity photodiode 121-2, the first transfer transistor 122-1 to the selection transistor 129, and the like, in the pixel 100 in FIG. 2.

(5-A) Basic Structure: A Structure in which a Low-Sensitivity PD Surrounds a Periphery of a Low-Sensitivity PD First, the pixel 500A having a structure in which a low-sensitivity photodiode (PD) surrounds a periphery of a high-sensitivity photodiode (PD) will be described with reference to FIGS. 38A and 38B.

Figure 38A:
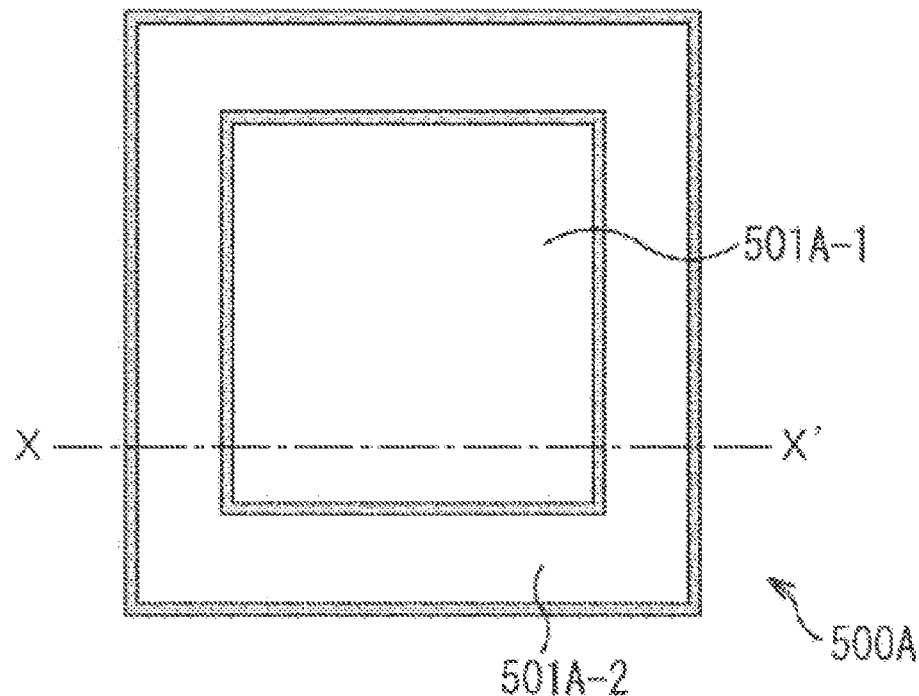
FIGS. 38A and 38B are views illustrating a structure of a pixel 500A of a sixth embodiment.

FIG. 38A is a plan view illustrating a structure of the pixel 500A. Note that FIG. 38A illustrates a plan view of a case where one of the pixels 500A arranged in a two-dimensional manner in the pixel array unit 11 of the CMOS image sensor 10 (FIG. 1) is viewed from a light incident side.

In FIG. 38A, the pixel 500A includes a high-sensitivity pixel 501A-1 and a low-sensitivity pixel 501A-2 surrounding the periphery of the high-sensitivity pixel 501A-1. The high-sensitivity pixel 501A-1 is a pixel having higher sensitivity than the low-sensitivity pixel 501A-2.

Figure 38B:
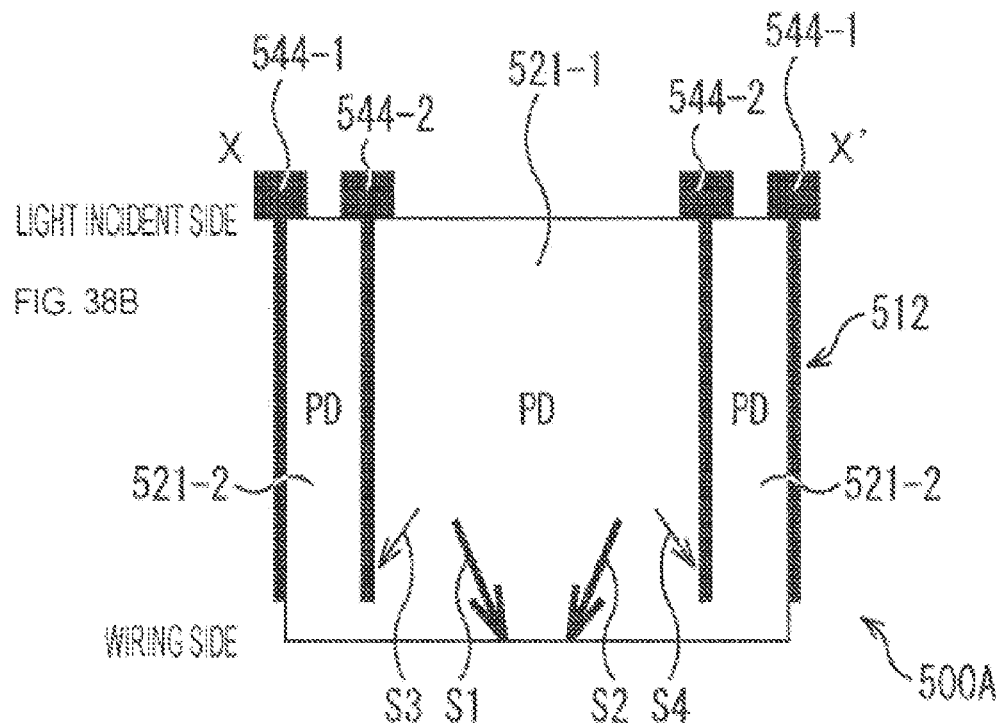

Furthermore, when illustrating the cross section of the dotted line XX' on the pixel 500A in FIG. 38A, the structure illustrated in the cross-sectional view in FIG. 38B is obtained. In FIG. 38B, a high-sensitivity photodiode (PD) 521-1 constituting the high-sensitivity pixel 501A-1 and a low-sensitivity photodiode (PD) 521-2 constituting the low-sensitivity pixel 501A-2 are formed in silicon (Si) of a semiconductor substrate 512 such that the low-sensitivity photodiode surrounds the periphery of the high-sensitivity photodiode.

In the pixel 500A, a light shielding film 544-1 and a light shielding film 544-2 are formed by an element isolation structure such as a DTI structure in a periphery of the low-sensitivity photodiode 521-2, and between the low-sensitivity photodiode 521-2 and the high-sensitivity photodiode 521-1, for example, and the element isolation is performed.

The high-sensitivity photodiode 521-1 generates and accumulates a charge according to the amount of light entering from a light incident side. Then, the charge accumulated in the high-sensitivity photodiode 521-1 is read by a pixel circuit such as a first transfer transistor 522-1 (the arrows S1 and S2 in FIGS. 38A and 38B). Note that light entering the high-sensitivity photodiode 521-1 is not leaked to the low-sensitivity photodiode 521-2 side by the light shielding film 544-2 (the arrows S3 and S4 in FIGS. 38A and 38B).

The low-sensitivity photodiode 521-2 generates and accumulates a charge according to the amount of light entering from the light incident side. Then, the charge accumulated in the low-sensitivity photodiode 521-2 is read by a pixel circuit such as a third transfer transistor 522-3. Note that light entering the low-sensitivity photodiode 521-2 is not leaked to the high-sensitivity photodiode 521-1 side by the light shielding film 544-2.

Note that although not illustrated in FIGS. 38A and 38B, an on-chip lens, a color filter, and the like are formed on the light incident side of the pixel 500A. Here, FIGS. 39 and 40 illustrate a structure of a case where an on-chip lens, a color filter, and the like are provided in the pixel 500A.

Figure 39:
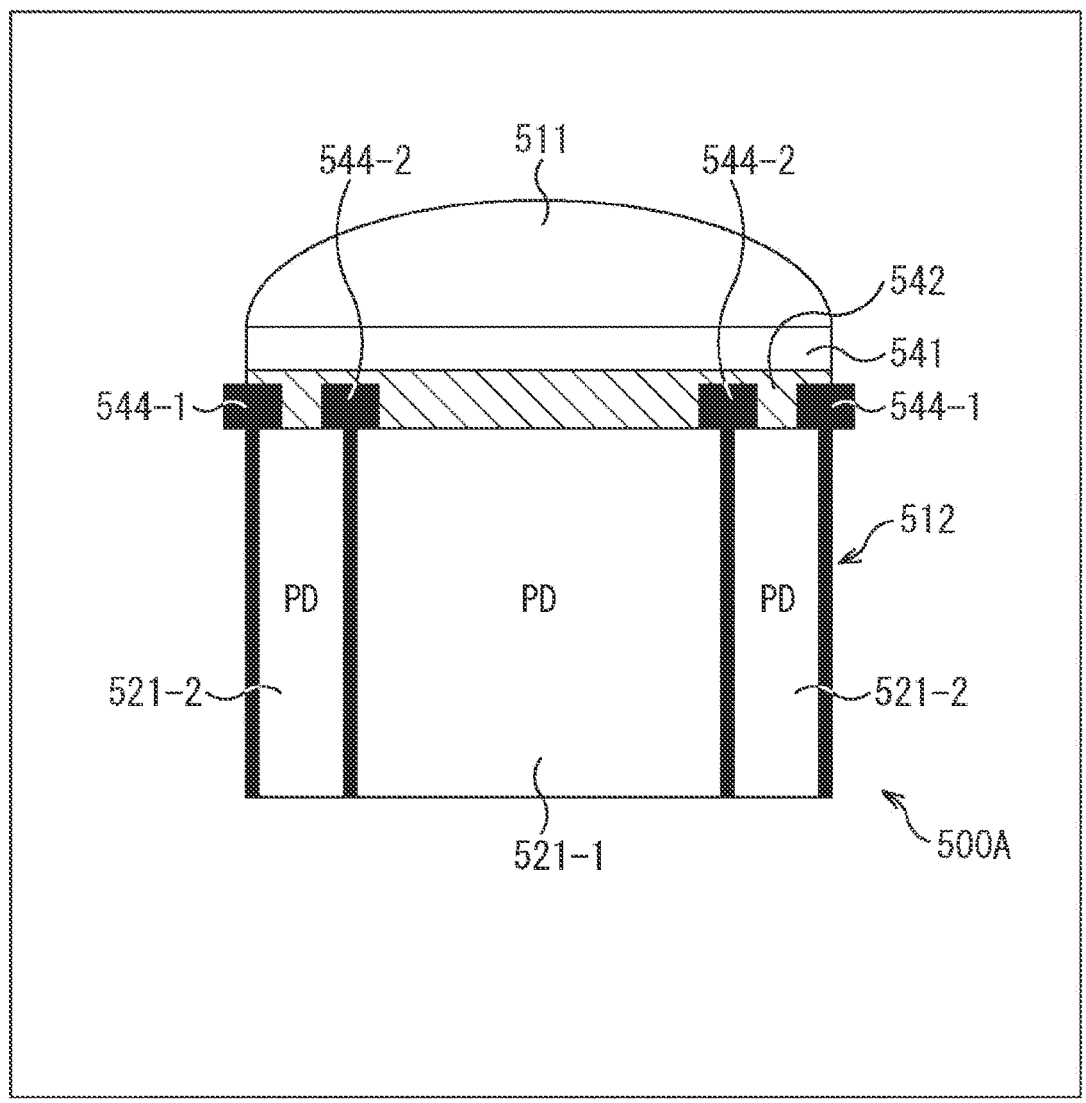
FIG. 39 is a cross-sectional view illustrating a structure of the pixel 500A of the sixth embodiment.
Figure 40:
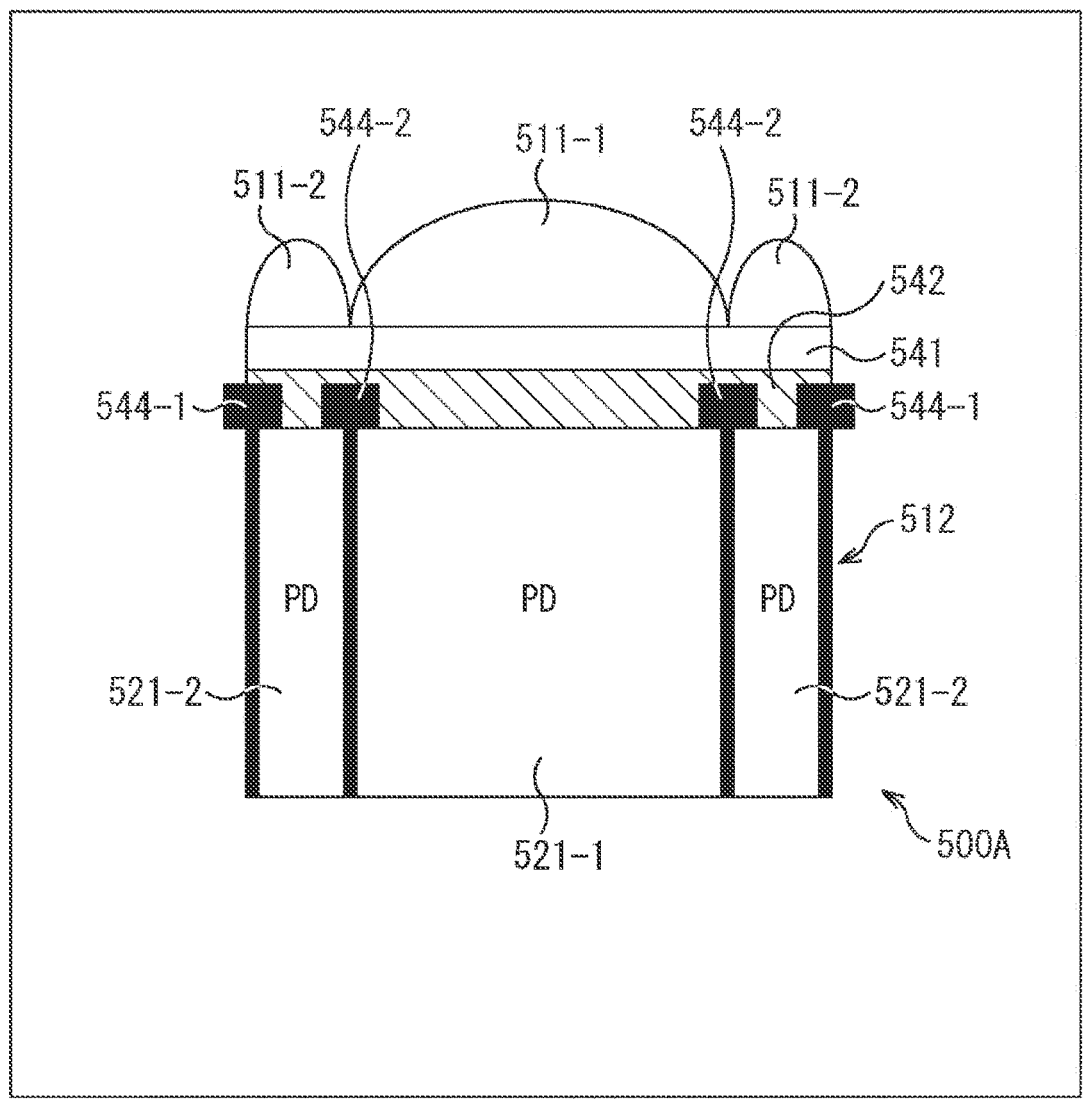
FIG. 40 is a cross-sectional view illustrating a structure of the pixel 500A of the sixth embodiment.

FIG. 39 is a diagram illustrating a structure of a case where one on-chip lens is formed on the high-sensitivity photodiode 521-1 and the low-sensitivity photodiode 521-2 surrounding the periphery of the high-sensitivity photodiode 521-1.

In the pixel 500A in FIG. 39, an insulating film 542 is formed on an entire upper surface of the photodiode (PD) 521 including the light shielding film 544. Note that although not illustrated in the structure of the pixel 500A in FIG. 39, a pinning film covers an upper surface of a semiconductor region of the semiconductor substrate 512.

Furthermore, in the pixel 500A, a color filter 541 and an on-chip lens 511 are formed on the insulating film 542. One on-chip lens 511 is provided for the high-sensitivity photodiode 521-1 and the low-sensitivity photodiode 521-2 surrounding the high-sensitivity photodiode 521-1, and allows light to enter the high-sensitivity photodiode 521-1 and the low-sensitivity photodiode 521-2.

FIG. 40 is a diagram illustrating a structure of a case where on-chip lenses are individually formed on the high-sensitivity photodiode 521-1 and the low-sensitivity photodiode 521-2 surrounding the periphery of the high-sensitivity photodiode 521-1. Note that the structure of the pixel 500A in FIG. 40 is the same structure except that the structure of the on-chip lens 511 is different from the structure of the pixel 500A in FIG. 39, and thus redundant description is omitted.

In other words, in the pixel 500A in FIG. 40, an on-chip lens 511-1 for causing light to enter the high-sensitivity photodiode 521-1 and an on-chip lens 511-2 for causing light to enter the low-sensitivity photodiode 521-2 are provided.

The on-chip lens 511-2 is arranged to surround a periphery of the on-chip lens 511-1 corresponding to the low-sensitivity photodiode 521-2 being arranged to surround the periphery of the high-sensitivity photodiode 521-1. In other words, the on-chip lens 511-2 is arranged in a so-called donut manner with respect to the on-chip lens 511-1.

In this way, in the pixel 500A, for example, the on-chip lens 511 (511-1 or 511-2) illustrated in FIG. 39 or 40 can be formed. The on-chip lens 511 (511-1 or 511-2) has a general shape, and thus the on-chip lens 511 (511-1 or 511-2) can be formed using a currently widely used method.

As described above, the pixel 500A has the structure illustrated in FIGS. 38A, 38B, 39, and 40 and thus can enhance the sensitivity of the high-sensitivity photodiode 521-1 as compared with the sensitivity of the low-sensitivity photodiode 521-2 surrounding the periphery of the high-sensitivity photodiode 521-1, and adopts such a layout and thus can facilitate the formation of the on-chip lens and the pupil correction.

Furthermore, in the pixel 500A, the light shielding film 544 is formed between the high-sensitivity photodiode 521-1 and the low-sensitivity photodiode 521-2 and element isolation is performed. Therefore, the problem of color mixture between the high-sensitivity pixel 501A-1 and the low-sensitivity pixel 501A-2 can be solved.

(5-B) A Structure in which a Low-Sensitivity PD Performs Photoelectric Conversion with Incident Light Having Passed Through a High-Sensitivity PD Next, the pixel 500B having a structure in which a low-sensitivity photodiode (PD) performs photoelectric conversion with incident light having passed through a high-sensitivity photodiode (PD) will be described with reference to FIGS. 41A and 41B.

Figure 41A:
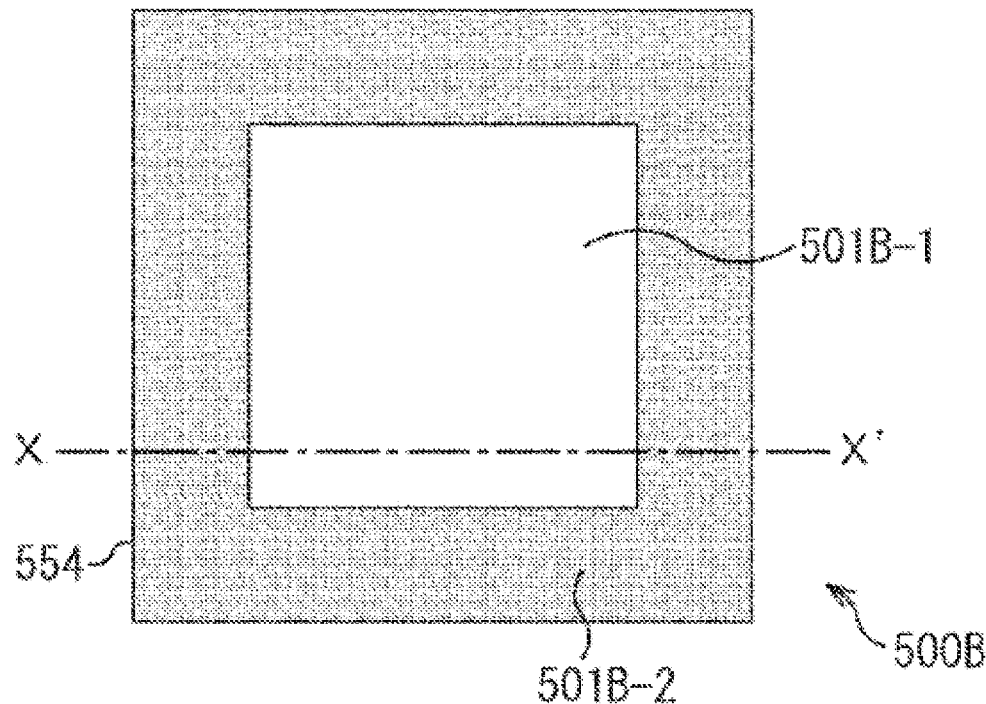
FIGS. 41A and 41B are cross-sectional views illustrating a structure of a pixel 500B of the sixth embodiment.

FIG. 41A is a plan view illustrating a structure of the pixel 500B. Note that FIG. 41A illustrates a plan view of a case where one of the pixels 500B arranged in a two-dimensional manner in the pixel array unit 11 of the CMOS image sensor 10 (FIG. 1) is viewed from the light incident side.

Figure 41B:
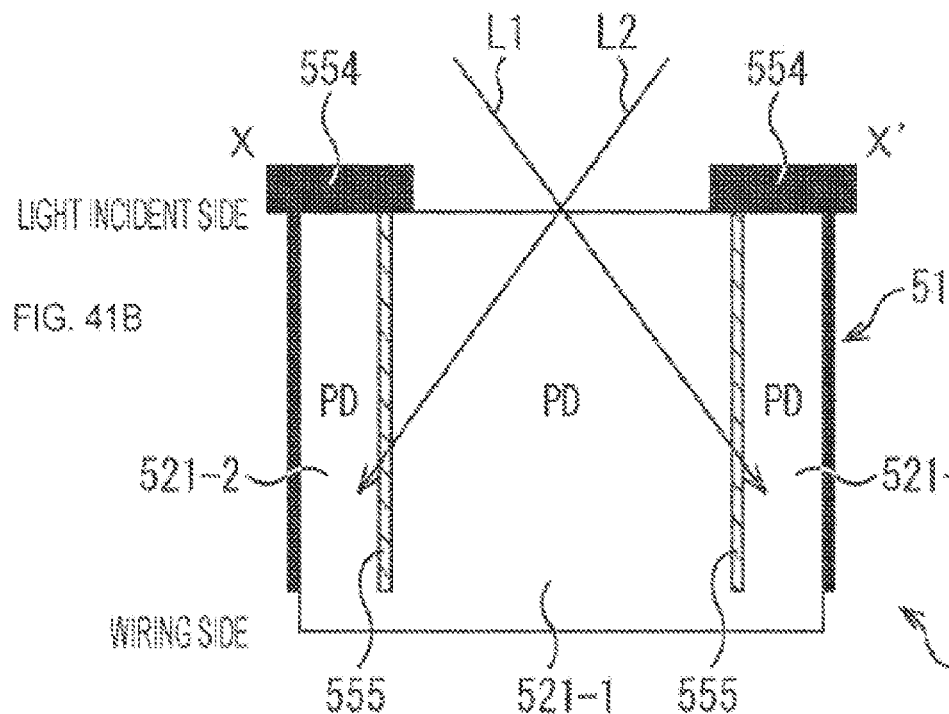

Furthermore, when illustrating the cross section of the dotted line XX' on the pixel 500B in FIG. 41A, the structure illustrated in the cross-sectional view in FIG. 41B is obtained. In the pixel 500B in FIGS. 41A and 41B, the high-sensitivity photodiode (PD) 521-1 and the low-sensitivity photodiode (PD) 521-2 surrounding the periphery of the high-sensitivity photodiode are formed in the silicon (Si) of the semiconductor substrate 512, similarly to the pixel 500A (FIGS. 38A and 38B).

In the pixel 500B, a light shielding film 554 is formed in the periphery of the low-sensitivity photodiode 521-2. The light shielding film 554 also covers an upper portion on the light incident side of the low-sensitivity photodiode (PD) 521-2. With the structure, no light enters the low-sensitivity photodiode 521-2 through (the light incident side of) the upper portion.

Furthermore, in the pixel 500B, an oxide film 555 is formed between the high-sensitivity photodiode 521-1 and the low-sensitivity photodiode 521-2. With the structure, the light incident through (the light incident side of) an upper portion of the high-sensitivity photodiode 521-1 is transmitted not only through the high-sensitivity photodiode 521-1 but also through the oxide film 555 and enters the low-sensitivity photodiode 521-2 side (the arrows L1 and L2 in FIGS. 41A and 41B).

The high-sensitivity photodiode 521-1 generates and accumulates a charge according to the amount of light entering from a light incident side. Then, the charge accumulated in the high-sensitivity photodiode 521-1 is read by the pixel circuit such as the first transfer transistor 522-1.

The low-sensitivity photodiode 521-2 generates and accumulates a charge according to the amount of light having entered the high-sensitivity photodiode 521-1 and entering via the oxide film 555. Then, the charge accumulated in the low-sensitivity photodiode 521-2 is read by a pixel circuit such as a third transfer transistor 522-3.

Note that although not illustrated in FIGS. 41A and 41B, an on-chip lens and a color filter are provided on the light incident side of the pixel 500B, as illustrated in FIGS. 39 and 40. Note that the pixel 500B does not need an on-chip lens for causing light to enter the low-sensitivity photodiode 521-2, and therefore it is not necessary to provide the on-chip lens 511-2 arranged in a donut manner in the case of adopting the structure in FIG. 40.

As described above, the pixel 500B has the structure illustrated in FIGS. 41A and 41B and thus can enhance the sensitivity of the high-sensitivity photodiode 521-1 as compared with the sensitivity of the low-sensitivity photodiode 521-2 surrounding the periphery of the high-sensitivity photodiode 521-1, and adopts such a layout and thus can facilitate the formation of the on-chip lens and the pupil correction.

(5-C) A Structure in which a Memory is Arranged in a Part of a Region Around a High-Sensitivity PD Next, the pixel 500C having a structure in which a memory (MEM) is arranged in a part of a region in a periphery of a high-sensitivity photodiode (PD) will be described with reference to the cross-sectional view in FIGS. 42A and 42B.

Figure 42A:
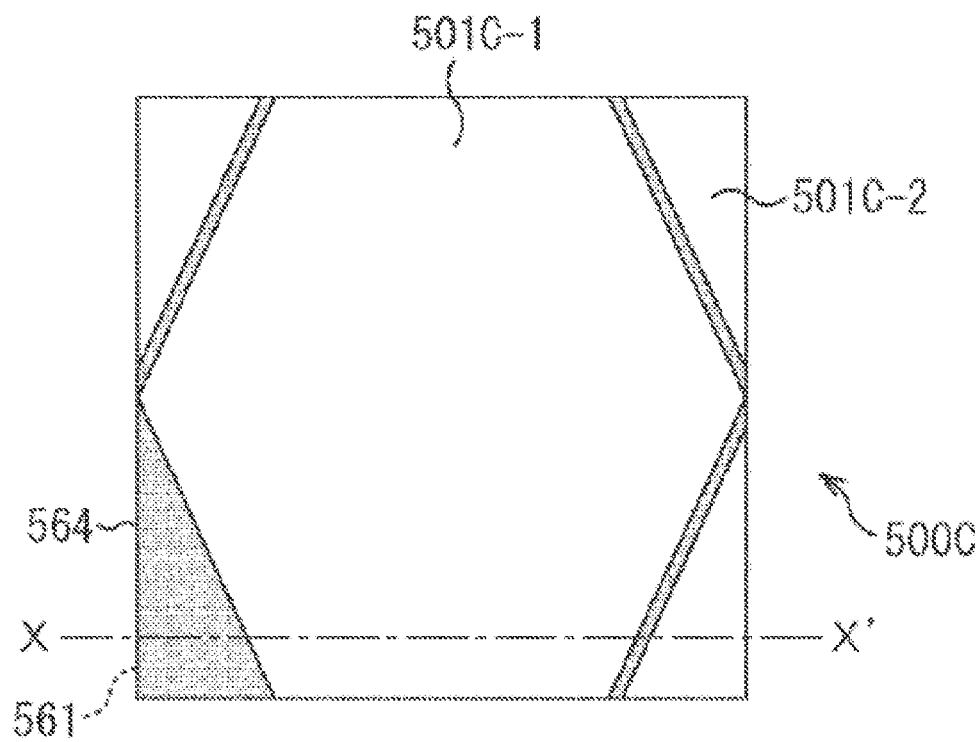
FIGS. 42A and 42B are cross-sectional views illustrating a structure of a pixel 500C of the sixth embodiment.

FIG. 42A is a plan view illustrating a structure of the pixel 500C. Note that FIG. 42A illustrates a plan view of a case where one of the pixels 500C arranged in a two-dimensional manner in the pixel array unit 11 of the CMOS image sensor 10 (FIG. 1) is viewed from the light incident side.

In the pixel 500C in FIG. 42A, four corner regions (the triangular regions in FIGS. 42A and 42B) of a portion excluding the region of a high-sensitivity pixel 501C-1 having a hexagonal shape within a square region are regions of a low-sensitivity pixel 501C-2. In other words, in the pixel 500C, the low-sensitivity pixel 501C-2 is arranged at a point-symmetrical position with respect to the center of the high-sensitivity pixel 501C-1 as a symmetrical point.

Furthermore, in the pixel 500C, a partial region (for example, a lower left region in FIGS. 42A and 42B) among the four corner regions (the triangular regions in FIGS. 42A and 42B) is shielded by a light shielding film 564, and a memory unit (MEM) 561 for holding a charge can be formed in a lower region of the light shielding film 564. In other words, the memory unit 561 formed in the semiconductor substrate 512 is shielded from light by the light shielding film 564.

Figure 42B:
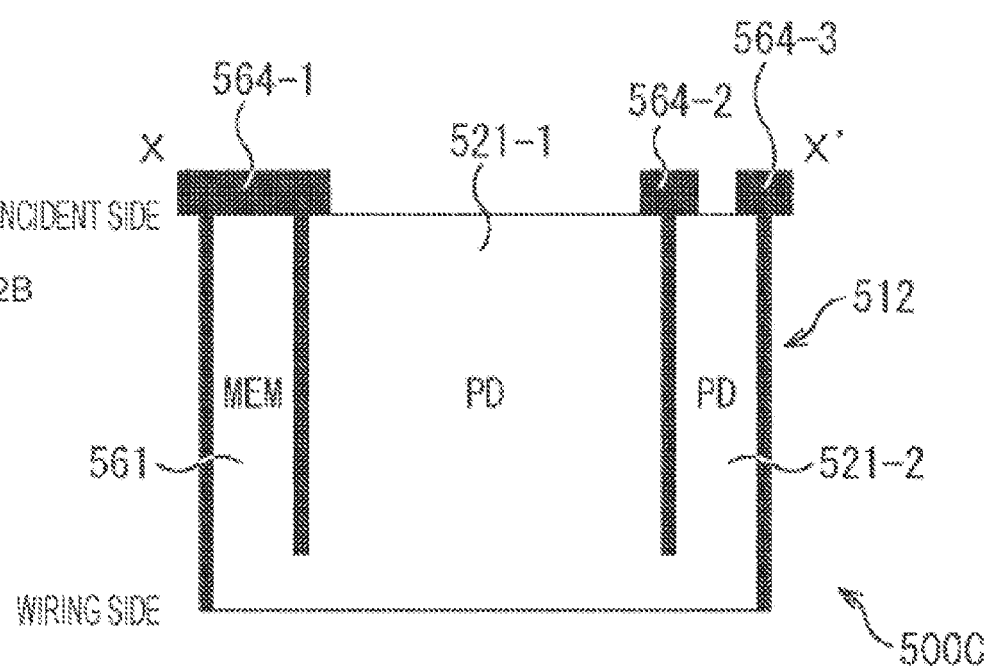

Furthermore, when illustrating the cross section of the dotted line XX' on the pixel 500C in FIG. 42A, the structure illustrated in the cross-sectional view in FIG. 42B is obtained. In FIG. 42B, the high-sensitivity photodiode (PD) 521-1 and the low-sensitivity photodiode (PD) 521-2 are formed in the silicon (Si) of the semiconductor substrate 512 such that the low-sensitivity photodiode surrounds (a part of) the periphery of the high-sensitivity photodiode.

In the pixel 500C, light shielding films 564-2 and 564-3 are formed between the high-sensitivity photodiode 521-1 and the low-sensitivity photodiode 521-2, and in a periphery of the low-sensitivity photodiode 521-2, and element isolation is performed. Furthermore, in the pixel 500C, (the incident light side of) a partial region among the four corner regions is shielded by the light shielding film 564 (light shielding film 564-1), and the memory unit (MEM) 561 is formed in the lower region of the light shielding film 564 (light shielding film 564-1).

The high-sensitivity photodiode 521-1 generates and accumulates a charge according to the amount of light entering from a light incident side. Then, the charge accumulated in the high-sensitivity photodiode 521-1 is read by the pixel circuit such as the first transfer transistor 522-1. Furthermore, the charge read by the first transfer transistor 522-1 can be accumulated in the memory unit 561.

The low-sensitivity photodiode 521-2 generates and accumulates a charge according to the amount of light entering from the light incident side. Then, the charge accumulated in the low-sensitivity photodiode 521-2 is read by a pixel circuit such as a third transfer transistor 522-3. Furthermore, the charge read by the third transfer transistor 522-3 can be accumulated in the memory unit 561.

Note that the charge accumulated in the memory unit 561 is transferred to an FD unit 526, converted into a voltage, amplified by an amplifier transistor 528, and output via a selection transistor 529.

Here, in the solid-state imaging device such as the CMOS image sensor 10 in FIG. 1, image distortion occurs due to difference in exposure timing in a rolling shutter method of sequentially reading pixels, and thus a global shutter method of simultaneously reading all the pixels is used by providing the memory unit (charge holding unit) for holding the charge in the pixels.

By using the global shutter method, the pixels become sequentially readable after all the pixels are simultaneously read in the memory unit. Therefore, the exposure timing can be common to all the pixels and pixel distortion can be suppressed. Then, in the pixel 500C, the memory unit 561 is provided as a charge holding unit for holding a charge when the global shutter method is adopted.

Note that although not illustrated in FIGS. 42A and 42B, an on-chip lens and a color filter can be formed on the light incident side of the pixel 500C, as illustrated in FIGS. 39 and 40.

Furthermore, in the pixel 500C in FIGS. 42A and 42B, the lower left region among the four corner regions has been used as the memory unit 561. However, an embodiment is not limited thereto, and for example, another structure in which two regions of the four regions are used as a memory unit 561-1 for the high-sensitivity photodiode 521-1 and a memory unit 561-2 for the low-sensitivity photodiode 521-2 may be adopted.

Furthermore, in the pixel 500C in FIGS. 42A and 42B, a configuration in which the low-sensitivity photodiodes 521-2 are arranged in the four corner regions without providing the memory unit 561. Moreover, in the pixel 500C in FIGS. 42A and 42B, the low-sensitivity pixel 501C-2 and the memory unit 561 have been arranged in the four corner regions. However, the low-sensitivity pixel 501C-2 and the memory unit 561 may be arranged in other regions by changing the shape of the high-sensitivity pixel 501C-1 as long as the low-sensitivity pixel 501C-2 is arranged in the periphery of the high-sensitivity pixel 501C-1.

As described above, the pixel 500C has the structure illustrated in FIGS. 42A and 42B and thus can enhance the sensitivity of the high-sensitivity photodiode 521-1 as compared with the sensitivity of the low-sensitivity photodiode 521-2 surrounding the periphery of the high-sensitivity photodiode 521-1, and adopts such a layout and thus can facilitate the formation of the on-chip lens and the pupil correction. Furthermore, in the pixel 500C, a partial region of the light receiving surface in which light enters can be used as the memory unit 561 for accumulating a charge by shielding the region from light.

(5-D) A Four-Pixel-Sharing Structure

Next, the pixel 500D configured by four pixel sharing will be described with reference to FIGS. 43 to 50.

Figure 43:
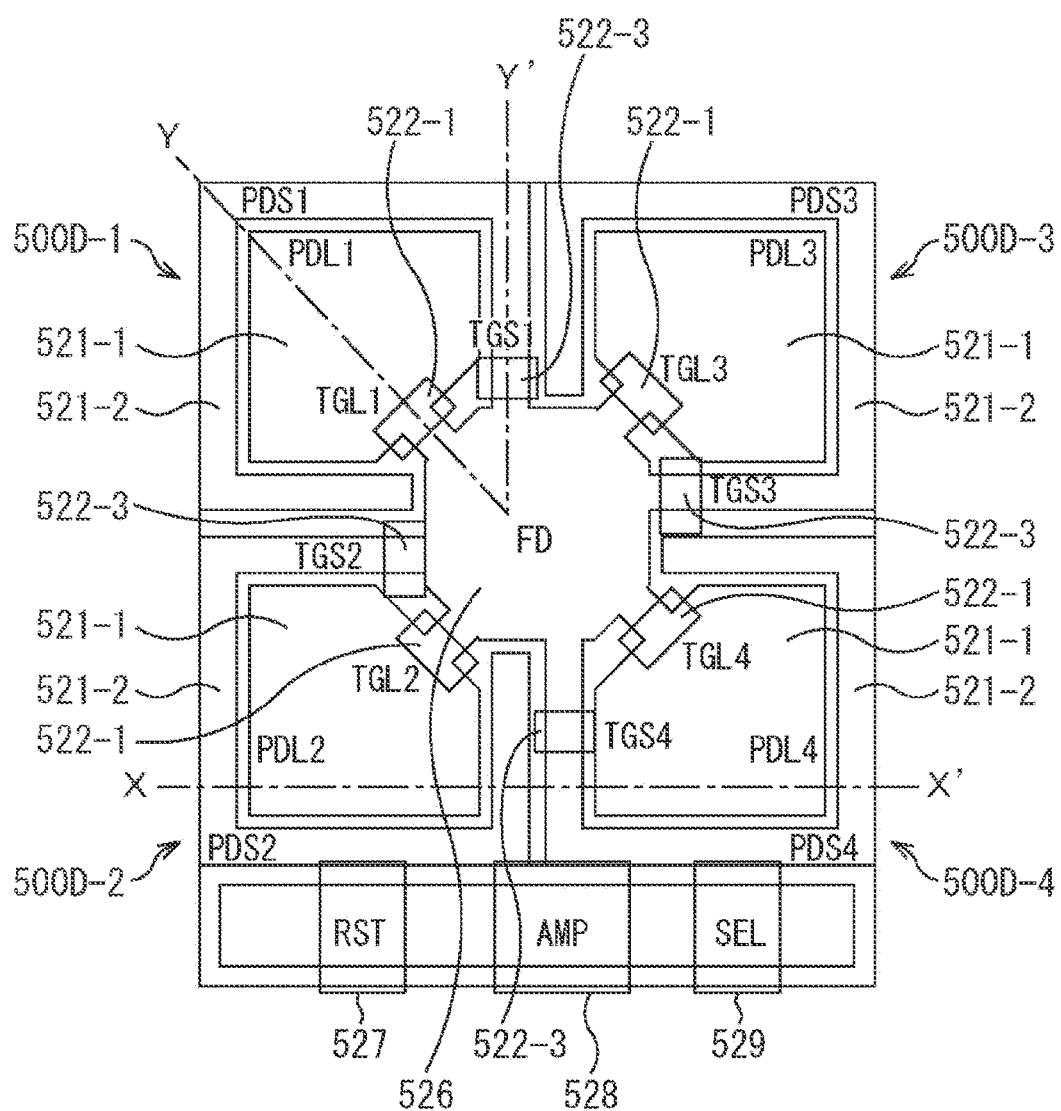
FIG. 43 is a plan view illustrating a structure of a pixel 500D of the sixth embodiment.

FIG. 43 is a plan view illustrating a structure of the pixel 500D configured by four pixel sharing. Note that FIG. 43 illustrates a plan view of a case where pixels 500D-1 to 500D-4 arranged in a two-dimensional manner in the pixel array unit 11 of the CMOS image sensor 10 (FIG. 1) are viewed from the light incident side.

In FIG. 43, the four pixels 500D-1 to 500D-4 share the pixel circuit such as the FD unit (FD) 526.

In the pixel 500D-1, charges accumulated in the high-sensitivity photodiode (PDL1) 521-1 and the low-sensitivity photodiode (PDS1) 521-2 around the high-sensitivity photodiode are read and transferred by the transfer transistor (TRL1) 522-1 and the transfer transistor (TRS1) 522-3 to the FD unit 526.

Similarly, in the pixels 500D-2 to 500D-4, charges accumulated in the high-sensitivity photodiode (PDL2, PDL3, or PDL4) 521-1 and the low-sensitivity photodiode (PDS2, PDS3, or PDS4) 521-2 around the high-sensitivity photodiode are read and transferred by the transfer transistor (TRL2, TRL3, or TRL4) 522-1 and the transfer transistor (TRS2, TRS3, or TRS4) 522-3 to the FD unit 526.

The FD unit 526 performs charge/voltage conversion for the charges read from the respective photodiodes of the pixels 500D-1 to 500D-4 into a voltage signal and output the voltage signal. This voltage signal is read by the amplifier transistor (AMP) 528 and output to the vertical signal line 22 (FIG. 1) via the selection transistor (SEL) 529. Note that a reset transistor (RST) 527 resets the potential of FD unit 526.

Figure 44:
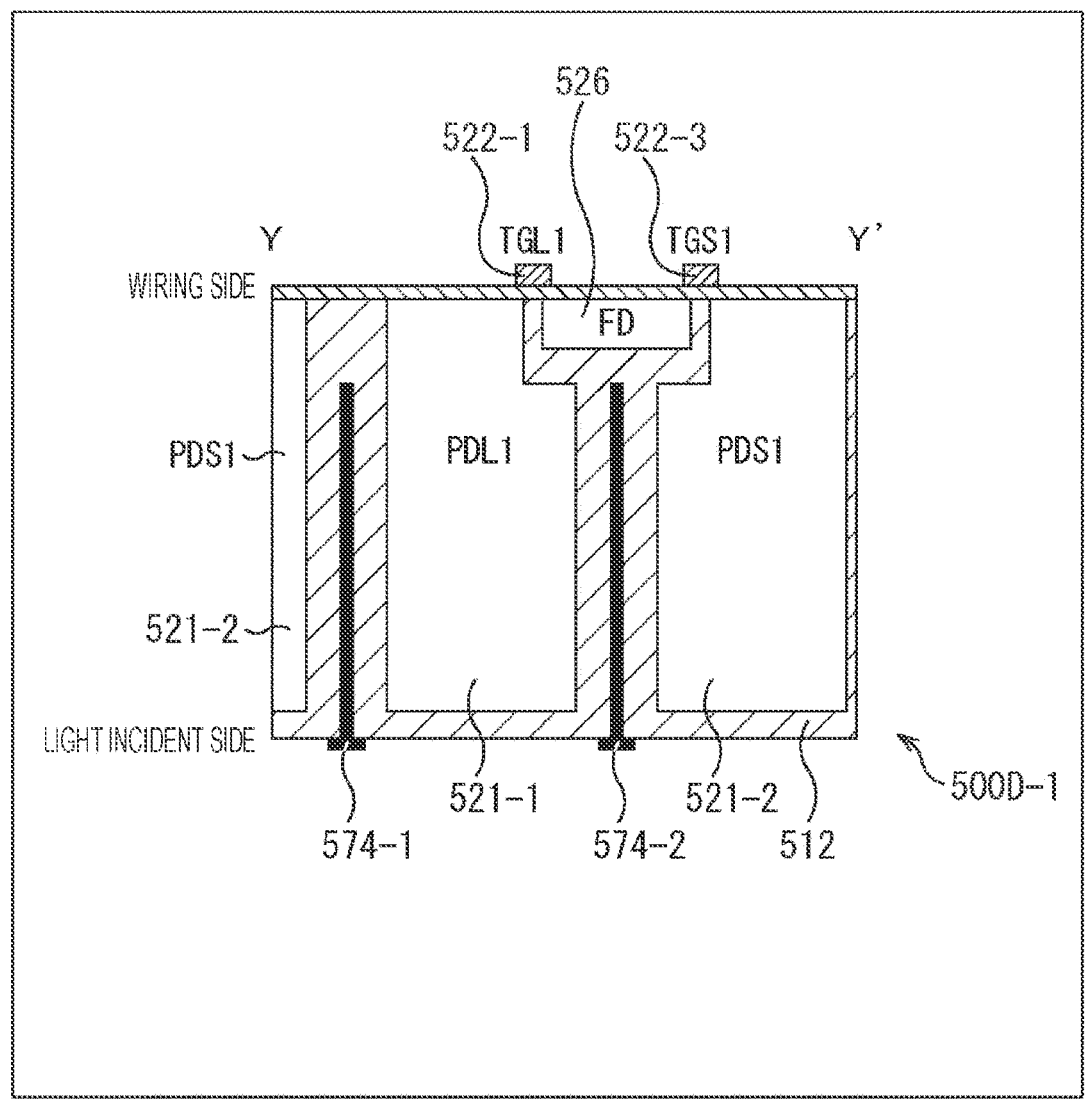
FIG. 44 is a cross-sectional view illustrating a structure of the pixel 500D of the sixth embodiment.

Here, when illustrating the cross section of the dotted line YY' on the pixel 500D-1 in FIG. 43, the structure illustrated in the cross-sectional view in FIG. 44 is obtained. Furthermore, when illustrating the cross section of the dotted line XX' on the pixel 500D-2 and the pixel 500D-4 in FIG. 43, the structure illustrated in the cross-sectional view in FIG. 45 is obtained.

In other words, FIG. 44 illustrates a section structure of the pixel 500D-1, among the four-pixel-sharing pixels. In FIG. 44, the high-sensitivity photodiode (PDL1) 521-1 and the low-sensitivity photodiode (PDS1) 521-2 are formed in the silicon (Si) of the semiconductor substrate 512 such that the low-sensitivity photodiode surrounds the periphery of the high-sensitivity photodiode. Furthermore, a light shielding film 574-1 and a light shielding film 574-2 are formed between the high-sensitivity photodiode (PDL1) 521-1 and the low-sensitivity photodiode (PDS1) 521-2, and element isolation is performed.

The charge accumulated in the high-sensitivity photodiode (PDL1) 521-1 is read and transferred by the pixel circuit such as the transfer transistor (TRL1) 522-1 to the FD unit 526. Furthermore, the charge accumulated in the low-sensitivity photodiode (PDS1) 521-2 is read and transferred by the pixel circuit such as the transfer transistor (TRS1) 522-3 to the FD unit 526.

Figure 45:
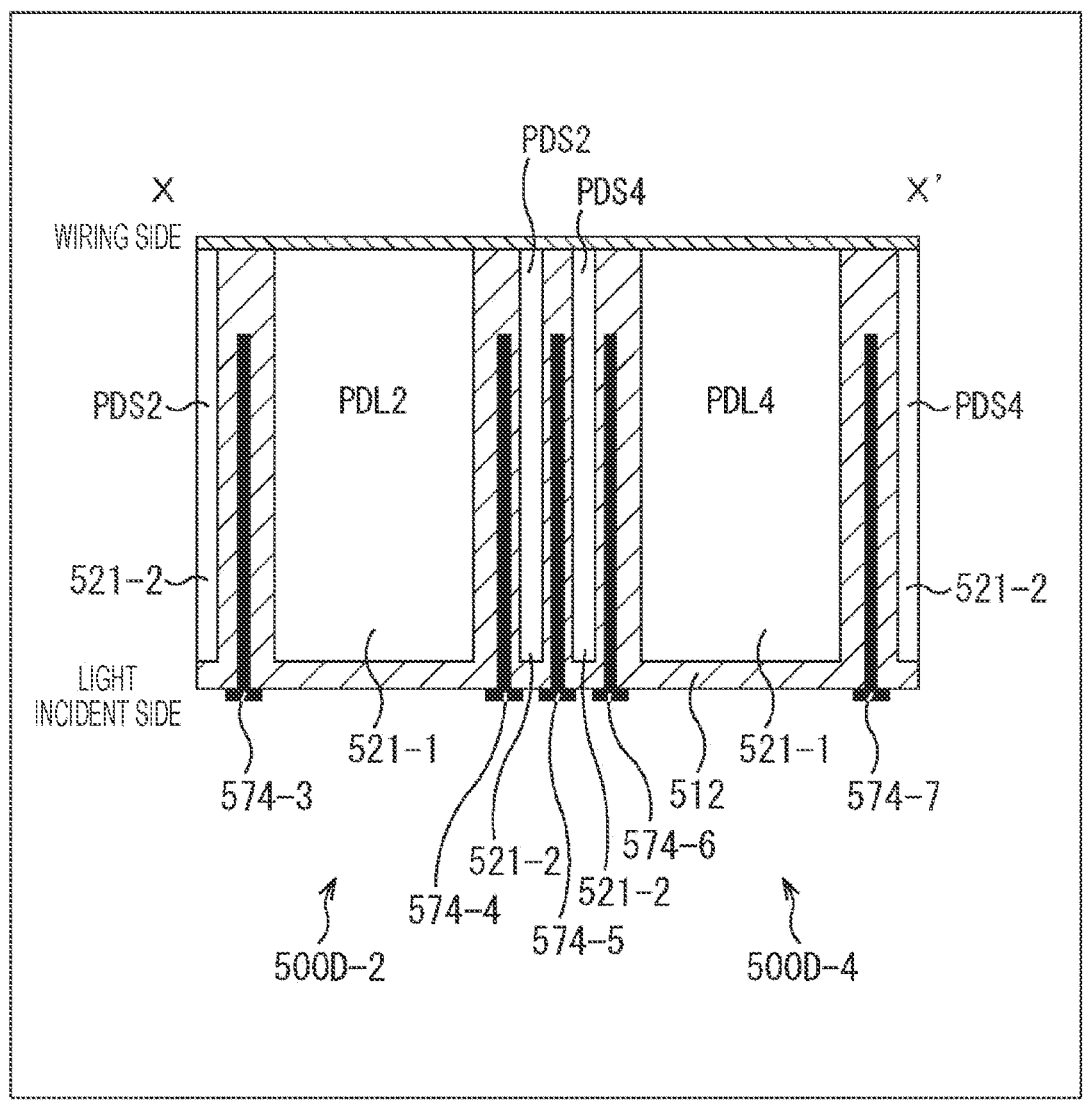
FIG. 45 is a cross-sectional view illustrating a structure of the pixel 500D of the sixth embodiment.

Furthermore, FIG. 45 illustrates section structures of the pixel 500D-2 and the pixel 500D-4, among the four-pixel-sharing pixels. In FIG. 45, the high-sensitivity photodiode (PDL2) 521-1 and the low-sensitivity photodiode (PDS2) 521-2 around the high-sensitivity photodiode of the pixel 500D-2 are formed in the silicon (Si) of the semiconductor substrate 512. Furthermore, the high-sensitivity photodiode (PDL4) 521-1 and the low-sensitivity photodiode (PDS4) 521-2 around the high-sensitivity photodiode of the pixel 500D-4 are formed in the silicon (Si) of the semiconductor substrate 512.

In FIG. 45, a light shielding film 574-3 and a light shielding film 574-4 are formed between the high-sensitivity photodiode (PDL2) 521-1 of the pixel 500D-2 and the low-sensitivity photodiode (PDS2) 521-2 of the pixel 500D-2, and element isolation is performed.

Similarly, the low-sensitivity photodiode (PDS2) 521-2 of the pixel 500D-2 and the low-sensitivity photodiode (PDS4) 521-2 of the pixel 500D-4 are isolated by a light shielding film 574-5. Furthermore, the high-sensitivity photodiode (PDL4) 521-1 of the pixel 500D-4 and the low-sensitivity photodiode (PDS4) 521-2 of the pixel 500D-4 are isolated by a light shielding film 574-6 and a light shielding film 574-7.

The charge accumulated in the high-sensitivity photodiode (PDL2) 521-1 of the pixel 500D-2 is read and transferred by the pixel circuit such as the transfer transistor (TRL2) 522-1 to the FD unit 526. Furthermore, the charge accumulated in the low-sensitivity photodiode (PDS2) 521-2 of the pixel 500D-2 is read and transferred by the pixel circuit such as the transfer transistor (TRS2) 522-3 to the FD unit 526.

The charge accumulated in the high-sensitivity photodiode (PDL4) 521-1 of the pixel 500D-4 is read and transferred by the pixel circuit such as the transfer transistor (TRL4) 522-1 to the FD unit 526. Furthermore, the charge accumulated in the low-sensitivity photodiode (PDS4)

521-2 of the pixel 500D-4 is read and transferred by the pixel circuit such as the transfer transistor (TRS4) 522-3 to the FD unit 526.

Here, an example of a structure of a wiring layer in the case of performing the four pixel sharing by the pixels 500D-1 to 500D-4 will be described with reference to FIGS. 46 to 49.

(TGL and RST Control Lines)

Figure 46:
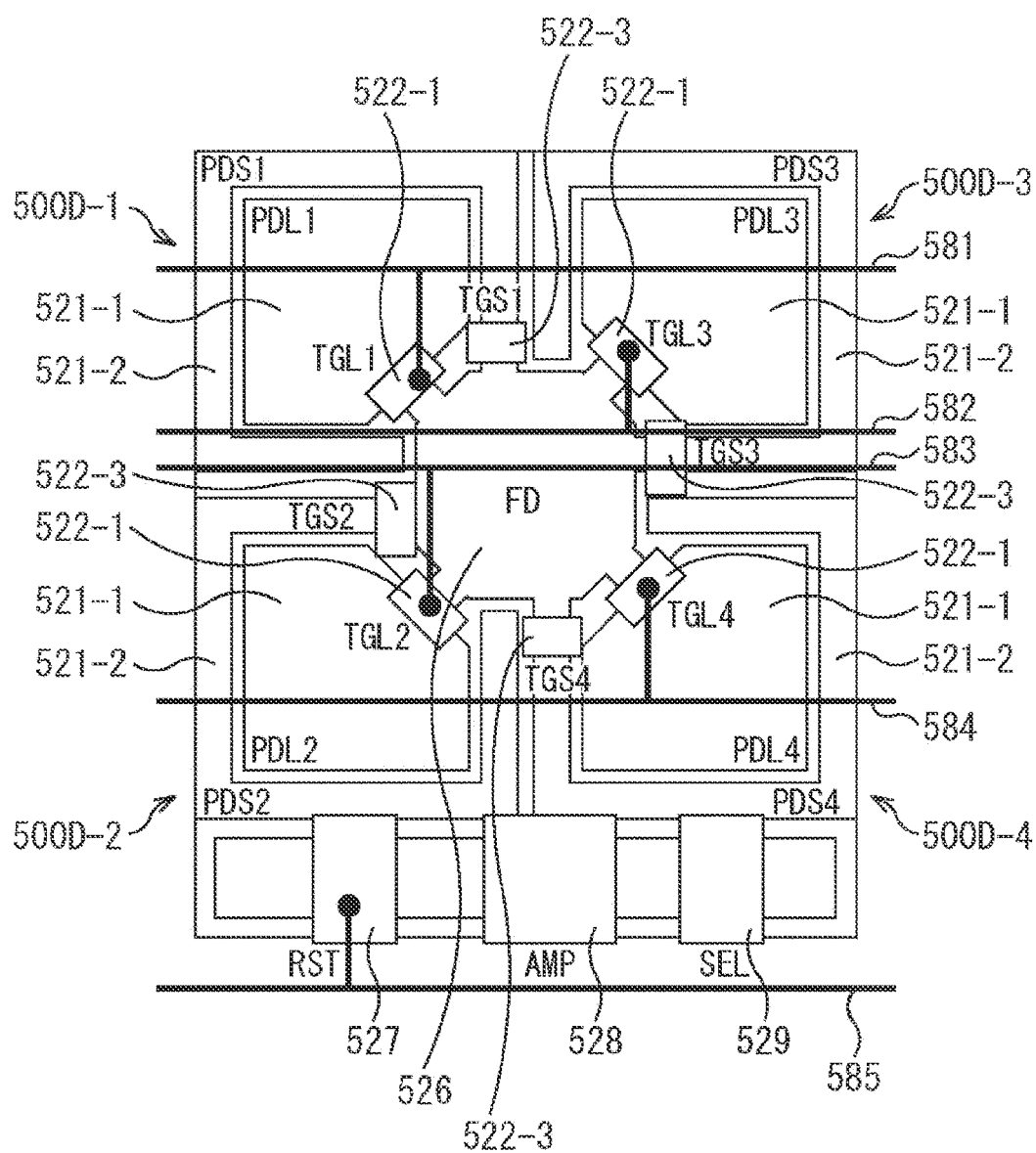
FIG. 46 is a plan view illustrating a structure using one wiring layer as control lines of TGL and RST.

FIG. 46 illustrates a structure of a case where a certain wiring layer, among a plurality of wiring layers, is arranged as control lines of the transfer transistor 522-1 and the reset transistor 527.

In FIG. 46, the transfer transistor (TGL1) 522-1 of the pixel 500D-1 is connected to a control line 581. A drive signal TGL1 is applied to a transfer gate of the transfer transistor (TGL1) 522-1 via the control line 581, and the charge accumulated in the high-sensitivity photodiode (PDL1) 521-1 is read. The transfer transistor (TGL2) 522-1 of the pixel 500D-2 is connected to a control line 583, and when a drive signal TGL2 is applied to a transfer gate of the transfer transistor (TGL2) 522-1, the charge accumulated in the high-sensitivity photodiode (PDL2) 521-1 is read.

The transfer transistor (TGL3) 522-1 of the pixel 500D-3 is connected to a control line 582, and when a drive signal TGL3 is applied to a transfer gate of the transfer transistor (TGL3) 522-1, the charge accumulated in the high-sensitivity photodiode (PDL3) 521-1 is read. The transfer transistor (TGL4) 522-1 of the pixel 500D-4 is connected to a control line 584, and when a drive signal TGL4 is applied to a transfer gate of the transfer transistor (TGL4) 522-1, the charge accumulated in the high-sensitivity photodiode (PDL4) 521-1 is read.

The reset transistor 527 is connected to a control line 585. A drive signal RST is applied to a gate electrode of the reset transistor 527 via the control line 585. The reset transistor 527 is operated in accordance with the drive signal RST to reset the FD unit 526.

(TGS and SEL Control Lines)

Figure 47:
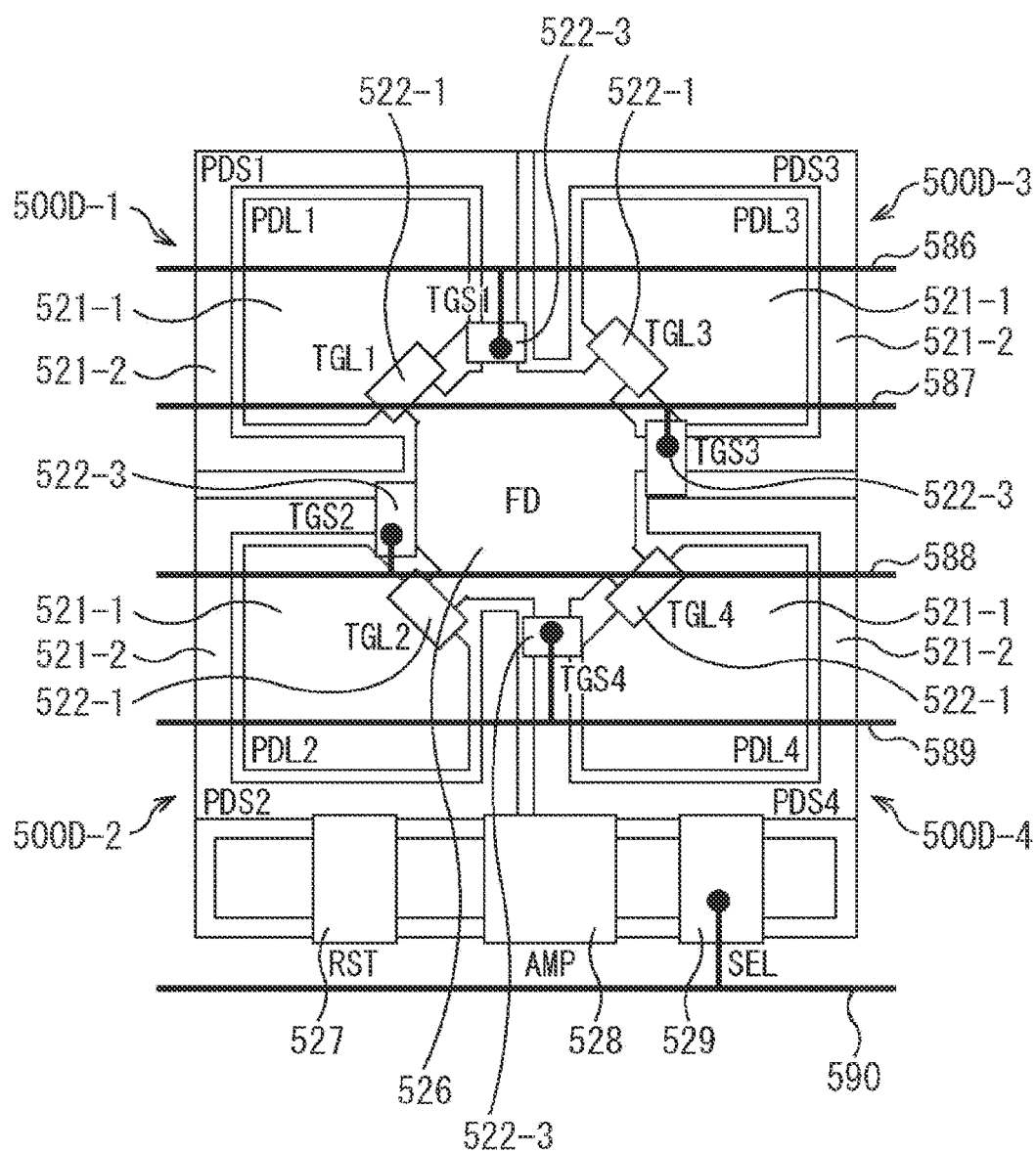
FIG. 47 is a plan view illustrating a structure using one wiring layer as control lines of TGS and SEL.

FIG. 47 illustrates a structure of a case where a certain wiring layer, among a plurality of wiring layers, is arranged as control lines of the transfer transistor 522-3 and the selection transistor 529.

In FIG. 47, the transfer transistor (TGS1) 522-3 of the pixel 500D-1 is connected to a control line 586. A drive signal TGS1 is applied to a transfer gate of the transfer transistor (TGS1) 522-3 via the control line 586, and the charge accumulated in the low-sensitivity photodiode (PDS1) 521-2 is read. The transfer transistor (TGS2) 522-3 of the pixel 500D-2 is connected to a control line 588, and when a drive signal TGS2 is applied to a transfer gate of the transfer transistor (TGS2) 522-3, the charge accumulated in the low-sensitivity photodiode (PDS2) 521-2 is read.

The transfer transistor (TGS3) 522-3 of the pixel 500D-3 is connected to a control line 587, and when a drive signal TGS3 is applied to a transfer gate of the transfer transistor (TGS3) 522-3, the charge accumulated in the low-sensitivity photodiode (PDS3) 521-2 is read. The transfer transistor (TGS4) 522-3 of the pixel 500D-4 is connected to a control line 589, and when a drive signal TGS4 is applied to a transfer gate of the transfer transistor (TGS4) 522-3, the charge accumulated in the low-sensitivity photodiode (PDS4) 521-2 is read.

The selection transistor 529 is connected to a control line 590. A drive signal SEL is applied to a gate electrode of the selection transistor 529 via the control line 590. The selection transistor 529 is operated according to the drive signal SEL to select the pixel 500D.

(FD Wiring)

Figure 48:
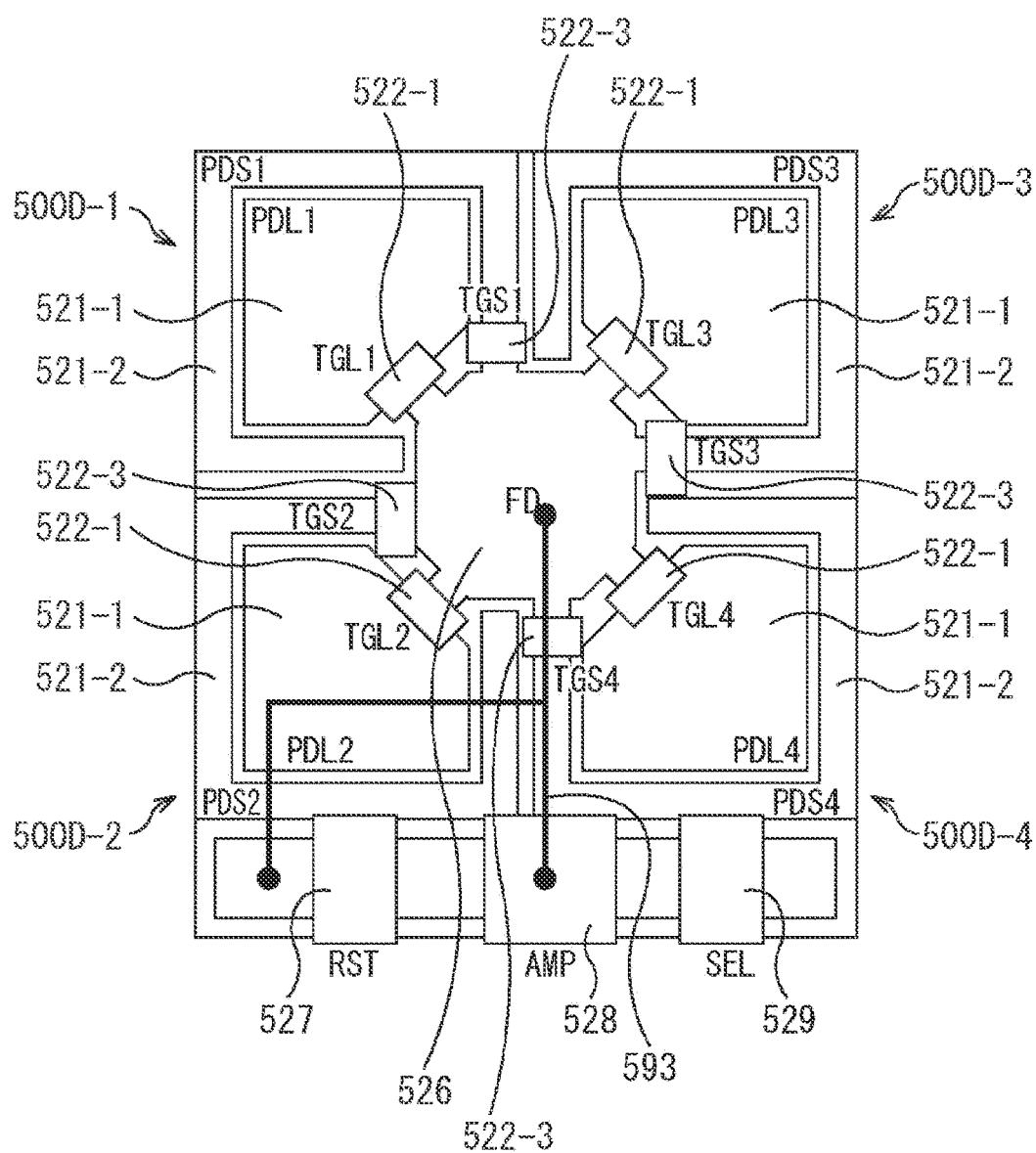
FIG. 48 is a plan view illustrating a structure using one wiring layer as FD wiring.

FIG. 48 illustrates a structure of a case where a certain wiring layer, among a plurality of wiring layers, is arranged as an FD wiring layer.

In FIG. 48, so-called FD wiring 593, which connects three points of the FD unit 526 serving as floating diffusion (FD), the gate electrode of the amplifier transistor 528, and the diffusion layer of the reset transistor 527, the diffusion layer being on a side connected to the FD unit 526, is arranged.

(Power Supply Line and Vertical Signal Line)

Figure 49:
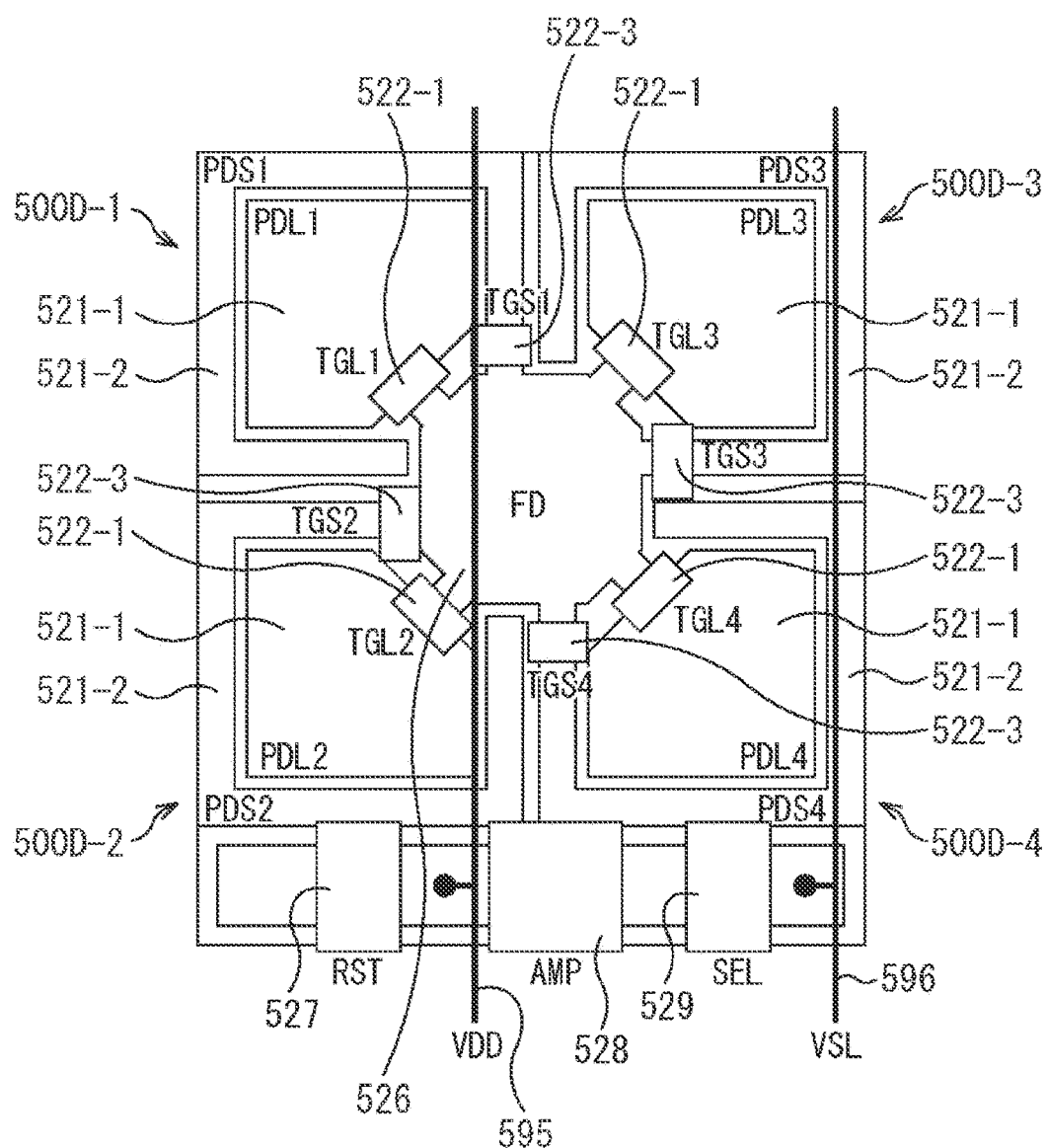
FIG. 49 is a plan view illustrating a structure using one wiring layer as a power supply line and a vertical signal line.

FIG. 49 illustrates a structure of a case where a certain wiring layer, among a plurality of wiring layers, is arranged a power supply line and a vertical signal line.

In FIG. 49, a power supply line (VDD) 595 is connected to the reset transistor 527 and the amplifier transistor 528. Furthermore, a vertical signal line (VSL) 596 is connected to the selection transistor 529. Note that the power supply line 595 corresponds to the power supply VDD in FIG. 2 and the vertical signal line 596 corresponds to the vertical signal line 22 in FIG. 1.

(Pixel Sharing Circuit Configuration)

Figure 50:
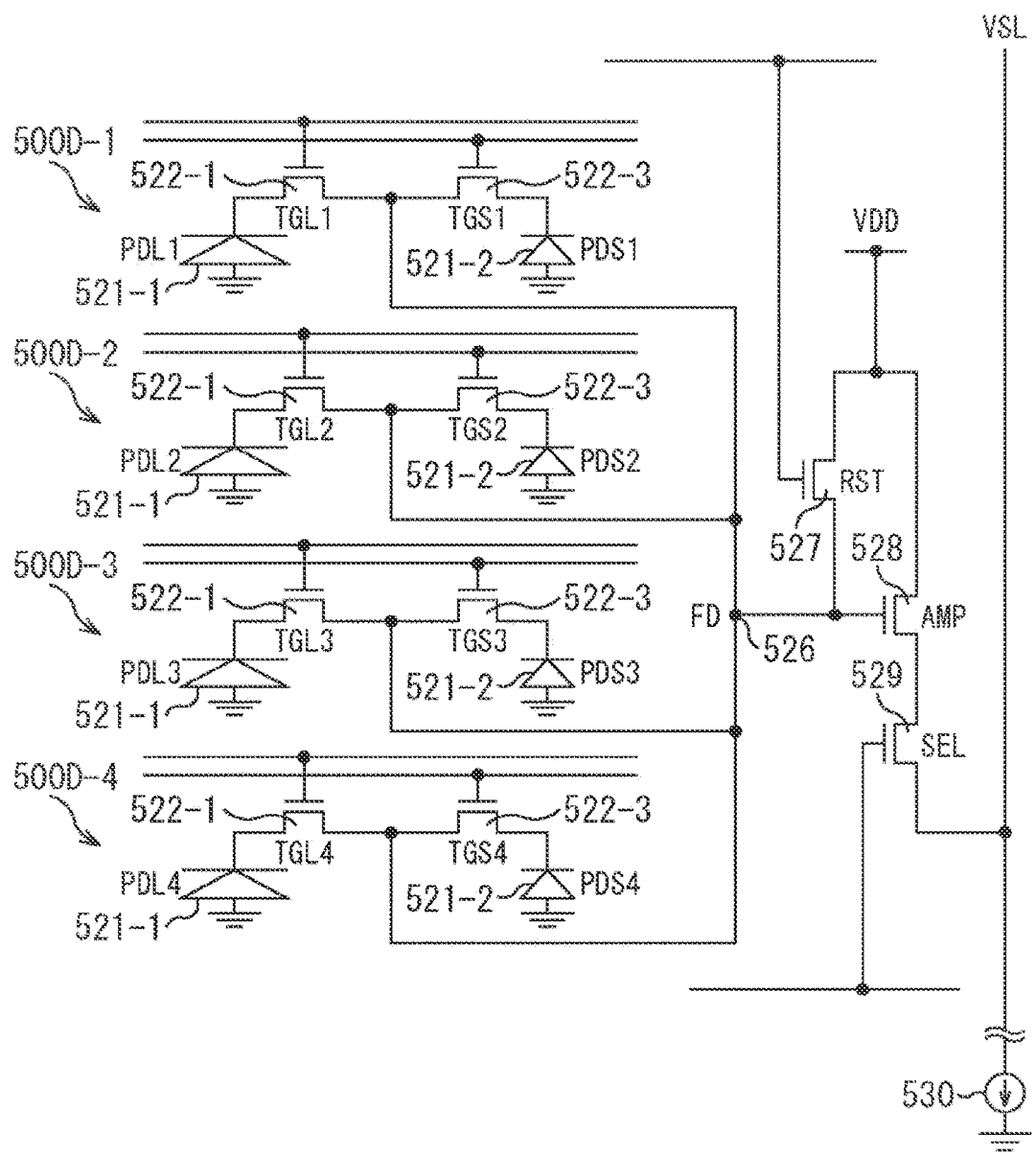
FIG. 50 is a diagram illustrating a circuit configuration example of the pixel 500D of the sixth embodiment.

FIG. 50 is a diagram illustrating a circuit configuration example in the case where four pixel sharing is performed by the pixels 500D-1 to 500D-4.

FIG. 50 illustrates a four-pixel-sharing pixel circuit, in which the FD unit (FD) 526, the reset transistor (RST) 527, the amplifier transistor (AMP) 528, and the selection transistor (SEL) 529 are provided for the pixels 500D-1 to 500D-4.

In the pixel 500D-1, when the drive signal TGL1 is applied to the transfer gate of the transfer transistor (TGL1) 522-1, the charge accumulated in the high-sensitivity photodiode (PDL1) 521-1 is transferred to the FD unit 526. Furthermore, in the pixel 500D-1, when the drive signal TGS1 is applied to the transfer gate of the transfer transistor (TGS1) 522-3, the charge accumulated in the low-sensitivity photodiode (PDS1) 521-2 is transferred to the FD unit 526.

In the pixel 500D-2, when the drive signal TGL2 is applied to the transfer gate of the transfer transistor (TGL2) 522-1, the charge accumulated in the high-sensitivity photodiode (PDL2) 521-1 is transferred to the FD unit 526. Furthermore, in the pixel 500D-2, when the drive signal TGS2 is applied to the transfer gate of the transfer transistor (TGS2) 522-3, the charge accumulated in the low-sensitivity photodiode (PDS2) 521-2 is transferred to the FD unit 526.

In the pixel 500D-3, when the drive signal TGL3 is applied to the transfer gate of the transfer transistor (TGL3) 522-1, the charge accumulated in the high-sensitivity photodiode (PDL3) 521-1 is transferred to the FD unit 526. Furthermore, in the pixel 500D-3, when the drive signal TGS3 is applied to the transfer gate of the transfer transistor (TGS3) 522-3, the charge accumulated in the low-sensitivity photodiode (PDS3) 521-2 is transferred to the FD unit 526.

In the pixel 500D-4, when the drive signal TGL4 is applied to the transfer gate of the transfer transistor (TGL4) 522-1, the charge accumulated in the high-sensitivity photodiode (PDL4) 521-1 is transferred to the FD unit 526. Furthermore, in the pixel 500D-4, when the drive signal TGS4 is applied to the transfer gate of the transfer transistor (TGS4) 522-3, the charge accumulated in the low-sensitivity photodiode (PDS4) 521-2 is transferred to the FD unit 526.

The FD unit 526 is connected to each of between the transfer transistor (TGL1) 522-1 and the transfer transistor (TGS1) 522-3 of the pixel 500D-1, between the transfer transistor (TGL2) 522-1 and the transfer transistor (TGS2) 522-3 of the pixel 500D-2, between the transfer transistor (TGL3) 522-1 and the transfer transistor (TGS3) 522-3 of the pixel 500D-3, and between the transfer transistor (TGL4) 522-1 and the transfer transistor (TGS4) 522-3 of the pixel 500D-4.

The FD unit 526 converts the charges read from the photodiodes (PDL1, PDS1, PDL2, PDS2, PDL3, PDS3, PDL4, and PDS4) of the pixels 500D-1 to 500D-4 into voltage signals and outputs the voltage signals in accordance with the operations of the transfer transistors.

The reset transistor 527 is connected between the power supply VDD and the FD unit 526. The drive signal RST is applied to a gate electrode of the reset transistor 527. When the drive signal RST becomes the active state, a reset gate of the reset transistor 527 becomes a conductive state, and the potential of the FD unit 526 is reset to the level of the power supply VDD.

The amplifier transistor 528 has a gate electrode connected to the FD unit 526 and a drain electrode connected to the power supply VDD, and serves as an input unit of a readout circuit for reading the voltage signal held in the FD unit 526, a so-called source follower circuit. In other words, the amplifier transistor 528 has the source electrode connected to the vertical signal line 22 (FIG. 1) via the selection transistor 529, thereby to constitute a source follower circuit with a constant current supply 530 connected to one end of the vertical signal line 22.

The selection transistor 529 is connected between a source electrode of the amplifier transistor 528 and the vertical signal line 22 (FIG. 1). The drive signal SEL is applied to a gate electrode of the selection transistor 529. When the drive signal SEL becomes the active state, the selection transistor 529 becomes a conductive state and becomes a selected state. As a result, the pixel signal output from the amplifier transistor 528 is output to the vertical signal line 22 (FIG. 1) via the selection transistor 529.

The pixels 500D-1 to 500D-4 configured by the four pixel sharing are configured as described above.

As described above, the pixels 500A to 500D have been described as the sixth embodiment. In the sixth embodiment, the sensitivity of the photodiode of the high-sensitivity pixel has been enhanced as compared with the sensitivity of the photodiode of the low-sensitivity pixel surrounding the periphery of the high-sensitivity photodiode, and such a layout has been adopted, whereby the formation of the on-chip lens and the pupil correction can be facilitated.

8. Modification

It goes without saying that each of the above-described six embodiments is established as an independent embodiment. A form in which parts or all of the plurality of embodiments are combined in a possible range may be adopted. For example, the second embodiment can be combined with the above-described fifth embodiment or sixth embodiment. Specifically, for example, the size in the depth direction of the low-sensitivity photodiode 421-2 can be limited in the low-sensitivity pixel 401A-2 of the pixel 400A (FIG. 32), or the size in the depth direction of the low-sensitivity photodiode 521-2 in the low-sensitivity pixel 501A-2 of the pixel 500A (FIGS. 38A and 38B) can be limited.

In the above description, the example provided with two photodiodes (photoelectric conversion units) having different sensitivity in one pixel has been described. However, three or more photodiodes can be provided in one pixel. In this case, an in-pixel capacitor (charge accumulation unit) may just be provided in at least a photodiode having lowest sensitivity without providing an in-pixel capacitor in a photodiode having highest sensitivity. Furthermore, two or more photodiodes having the same sensitivity can be provided as long as the above condition is satisfied.

Furthermore, in the above-described embodiment, an example in which the present technology is applied to the CMOS image sensor having pixels arranged in a matrix manner has been described. However, application of the present technology is not limited to a CMOS image sensor. In other words, the present technology can be applied to various solid-state imaging devices in an X-Y address system in which pixels are arranged in a two-dimensional matrix manner.

Moreover, the present technology is not limited to application to a solid-state imaging device that detects distribution of the amount of incident light of visible light and captures the light as an image, and can also be applied to various solid-state imaging devices that capture distribution of an incident amount of infrared rays, X-rays, particles, or the like as an image.

9. Configuration of Electronic Device

Figure 51:
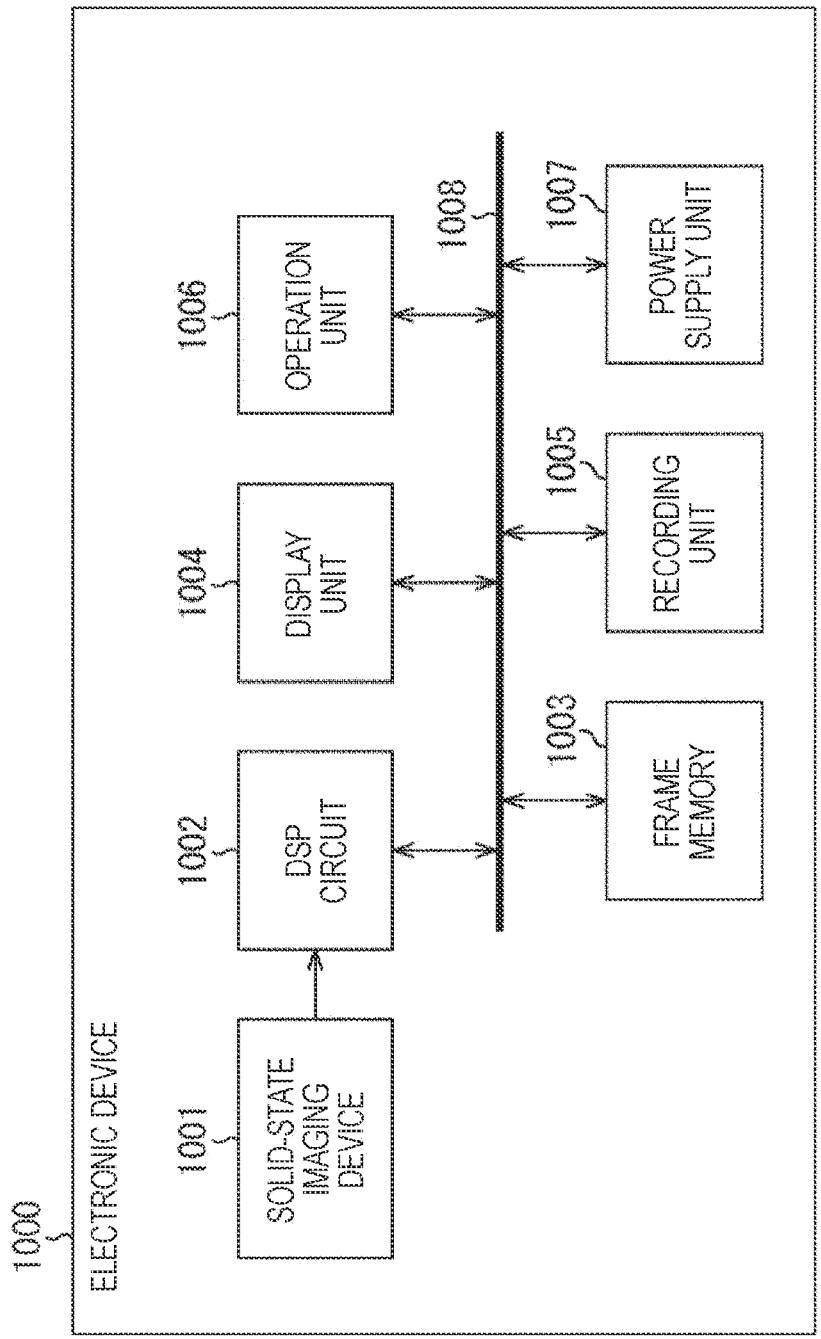
FIG. 51 is a diagram illustrating a configuration example of an electronic device including a solid-state imaging device.

FIG. 51 is a diagram illustrating a configuration example of an electronic device including a solid-state imaging device.

An electronic device 1000 in FIG. 51 is an electronic device such as an imaging device such as a digital still camera or a video camera, or a portable terminal device having an imaging function such as a smart phone or a tablet terminal, for example.

In FIG. 51, the electronic device 1000 includes a solid-state imaging device 1001, a digital signal processor (DSP) circuit 1002, a frame memory 1003, a display unit 1004, a recording unit 1005, an operation unit 1006, and a power supply unit 1007. Furthermore, in the electronic device 1000, the DSP circuit 1002, the frame memory 1003, the display unit 1004, the recording unit 1005, the operation unit 1006, and the power supply unit 1007 are connected to one another via a bus line 1008.

The solid-state imaging device 1001 corresponds to the CMOS image sensor 10 in FIG. 1, and a structure of a pixel corresponding to any of the above-described first to sixth embodiments is adopted as a structure of a pixel of the solid-state imaging device 1001, for example.

The DSP circuit 1002 is a signal processing circuit that processes a signal supplied from the solid-state imaging device 1001. The DSP circuit 1002 outputs image data obtained by processing the signal from the solid-state imaging device 1001. The frame memory 1003 temporarily holds the image data processed by the DSP circuit 1002 on a frame basis.

The display unit 1004 includes a panel-type display device such as a liquid crystal panel or an organic electro luminescence (EL) panel, for example, and displays a moving image or a still image captured by the solid-state imaging device 1001. The recording unit 1005 records image data of a moving image or a still image captured by the solid-state imaging device 1001 on a recording medium such as a semiconductor memory or a hard disk.

The operation unit 1006 outputs operation commands for various functions held by the electronic device 1000 in response to an operation by a user. The power supply unit 1007 appropriately supplies various power sources serving as operating power sources of the DSP circuit 1002, the frame memory 1003, the display unit 1004, the recording unit 1005, and the operation unit 1006 to these supply targets.

The electronic device 1000 is configured as described above.

10. Use Example of Solid-State Imaging Device

Figure 52:
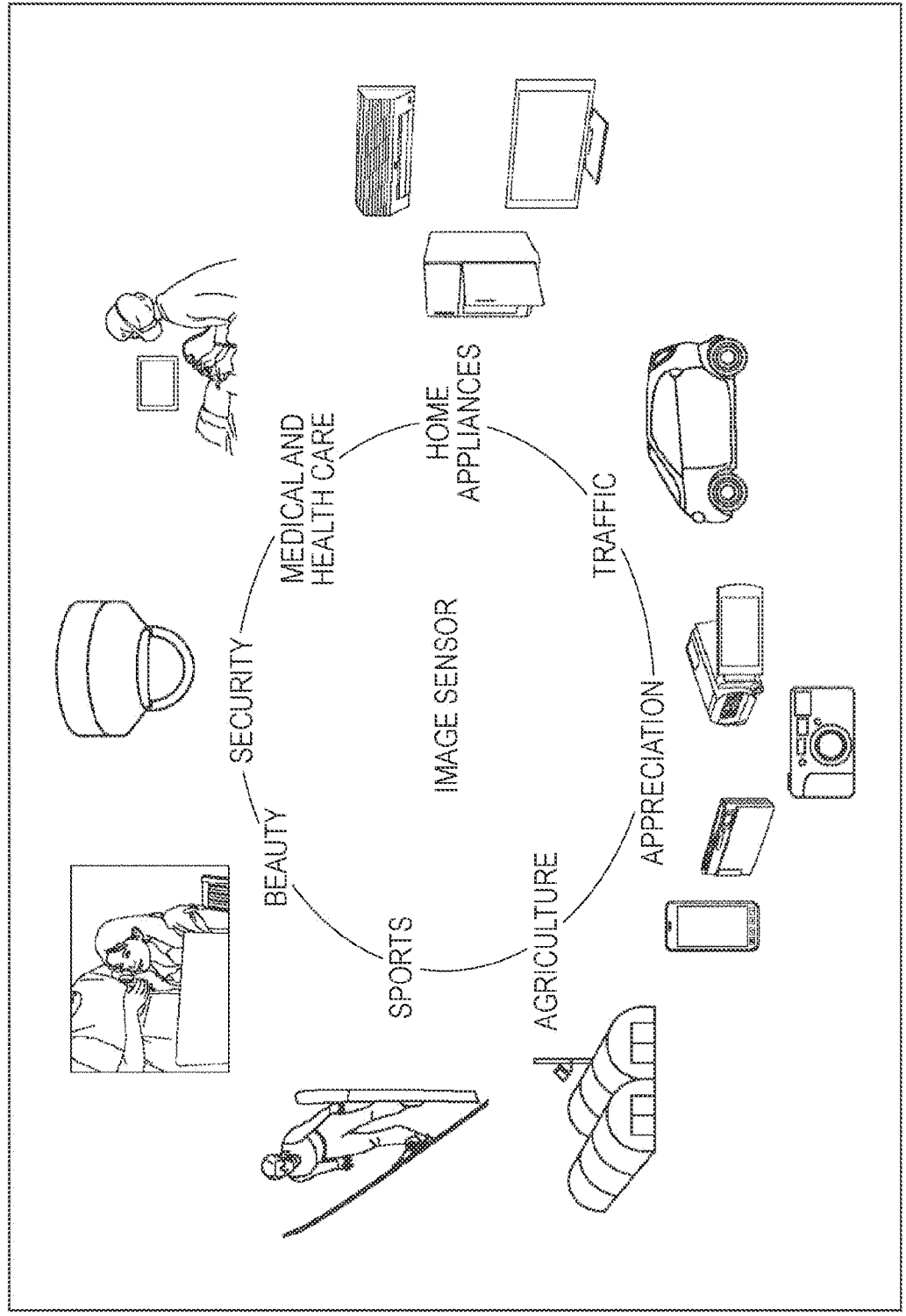
FIG. 52 is a diagram illustrating a use example of the solid-state imaging device.

FIG. 52 is a diagram illustrating use examples of a CMOS image sensor 10 as an image sensor.

The above-described CMOS image sensor 10 (FIG. 1) can be used in various cases of sensing light such as visible light, infrared light, ultraviolet light, or X-rays, as described below, for example. In other words, as illustrated in FIG. 52, the CMOS image sensor 10 can be used in devices in the field of traffic, the field of medical and healthcare, the field of home appliances, the field of security, the field of beauty, the field of sports, the field of agriculture, or the like, for example, in addition to the above-described field of appreciation in which images to be provided for use in appreciation are captured.

Specifically, as described above, in the field of appreciation, for example, the CMOS image sensor 10 can be used in a device (for example, the electronic device 1000 in FIG. 51) for capturing an image to be provided for appreciation, such as a digital camera, a smart phone, or a mobile phone device having a camera function.

In the field of traffic, for example, the CMOS image sensor 10 can be used in a device provided for use in traffic, such as an in-vehicle sensor that captures the front, rear, peripheries, an interior of the vehicle, etc. for safe driving such as automatic stop, recognition of a state of a driver, or the like, a monitoring camera that monitors traveling vehicles and roads, or a distance measuring sensor that measures a distance between vehicles or the like.

In the field of home appliances, for example, the CMOS image sensor 10 can be used in devices provided for home appliances such as TV receivers, refrigerators, and air conditioners to capture gestures of users and perform device operations according to the gestures. Furthermore, in the field of medical and healthcare, for example, the CMOS image sensor 10 can be used in a device provided for use in medical and healthcare, such as an endoscope or a device that performs angiography by receiving infrared light.

In the field of security, for example, the CMOS image sensor 10 can be used in a device provided for use in security, such as a monitoring camera for crime prevention or a camera for person authentication use. Furthermore, in the field of beauty, for example, the CMOS image sensor 10 can be used in a device provided for use in beauty, such as a skin measuring instrument that captures skin or a microscope that captures scalp.

In the field of sports, for example, the CMOS image sensor 10 can be used in a device provided for use in sports, such as an action camera or a wearable camera for sport use or the like. Furthermore, in the field of agriculture, for example, the CMOS image sensor 10 can be used in a device provided for use in agriculture, such as a camera for monitoring the condition of fields and crops Note that an embodiment of the present technology is not limited to the above-described embodiments and various modifications can be made without departing from the gist of the present technology.

Furthermore, the present technology can also have the following configurations.

(1)

A solid-state imaging device including:
a pixel array unit in which a plurality of pixels is arranged in a two-dimensional manner, in which
the pixel includes
a first photoelectric conversion unit, and
a second photoelectric conversion unit having lower sensitivity than the first photoelectric conversion unit, and
a size of the second photoelectric conversion unit in an optical axis direction in which light enters is smaller than a size of the first photoelectric conversion unit in the optical axis direction.

(2)

The solid-state imaging device according to (1), in which
a size of the second photoelectric conversion unit in a plane direction orthogonal to an optical axis is approximately the same as or larger than a size of the first photoelectric conversion unit in the plane direction.

(3)

The solid-state imaging device according to (1) or (2), in which
the pixel further includes an in-pixel capacitor that accumulates a charge overflowing from the second photoelectric conversion unit.

(4)

The solid-state imaging device according to any one of (1) to (3), in which
the second photoelectric conversion unit is formed at an arbitrary position in the optical axis direction in a semiconductor region of the pixel, and
a vertical transistor for reading a charge accumulated in the second photoelectric conversion unit is formed in the semiconductor region of the pixel.

(5)

The solid-state imaging device according to (1), in which
a size of the second photoelectric conversion unit in a plane direction orthogonal to an optical axis on an opposite side of a light incident side is larger than a size in the plane direction on the light incident side.

(6)

The solid-state imaging device according to (5), in which
a size of the first photoelectric conversion unit in the plane direction on an opposite side of the light incident side is smaller than a size in the plane direction on the light incident side.

(7)

The solid-state imaging device according to (6), in which
the first photoelectric conversion unit has a PN junction formed on the opposite side of the light incident side.

(8)

The solid-state imaging device according to (1), in which
the pixel further includes an in-pixel capacitor that accumulates a charge overflowing from the second photoelectric conversion unit,
the second photoelectric conversion unit and the in-pixel capacitor are stacked to cause the second photoelectric conversion unit to be on a light incident side, and
a region of the first photoelectric conversion unit is extended to a region securable by causing the second photoelectric conversion unit and the in-pixel capacitor to form a stacked structure.

(9)

The solid-state imaging device according to (1), in which
the pixel further includes an oxide film, and
the second photoelectric conversion unit and the oxide film are stacked to cause the second photoelectric conversion unit or the oxide film to be on a light incident side.

(10)

The solid-state imaging device according to (8) or (9), in which a light shielding film for shielding light between the first photoelectric conversion unit and the second photoelectric conversion unit is formed between the first photoelectric conversion unit and the second photoelectric conversion unit.

(11)

A solid-state imaging device including:

a pixel array unit in which a plurality of pixels is arranged in a two-dimensional manner, in which the pixel includes a first photoelectric conversion unit, and a second photoelectric conversion unit having lower sensitivity than the first photoelectric conversion unit, and a fine uneven structure is formed on a light incident side of the first photoelectric conversion unit.

(12)

The solid-state imaging device according to (11), in which an outer size of a first lens that allows light to enter the first photoelectric conversion unit is larger than an outer size of a second lens that allows light to enter the second photoelectric conversion unit.

(13)

The solid-state imaging device according to (11), in which a size of the first photoelectric conversion unit in a plane direction orthogonal to an optical axis is larger than a size of the second photoelectric conversion unit in the plane direction.

(14)

The solid-state imaging device according to (11), in which an outer size of a first lens that allows light to enter the first photoelectric conversion unit is larger than an outer size of a second lens that allows light to enter the second photoelectric conversion unit, and a size of the first photoelectric conversion unit in a plane direction orthogonal to an optical axis is larger than a size of the second photoelectric conversion unit in the plane direction.

(15)

A solid-state imaging device including:

a pixel array unit in which a plurality of pixels is arranged in a two-dimensional manner, in which the pixel includes a first photoelectric conversion unit, and a second photoelectric conversion unit having lower sensitivity than the first photoelectric conversion unit, and the second photoelectric conversion unit is formed to surround a periphery of the first photoelectric conversion unit.

(16)

The solid-state imaging device according to (15), in which the first photoelectric conversion unit and the second photoelectric conversion unit are element-isolated and formed in the pixel.

(17)

The solid-state imaging device according to (15), in which the second photoelectric conversion unit performs photoelectric conversion using light having entered the first photoelectric conversion unit.

(18)

The solid-state imaging device according to (15), in which the second photoelectric conversion unit is formed in a point-symmetrical region with respect to a center of the first photoelectric conversion unit as a symmetrical point.

(19)

The solid-state imaging device according to (18), in which a light incident side of a partial region, among a region where the second photoelectric conversion unit is formable, is shielded from light, and the region shielded from light is used as a memory unit that holds a charge.

(20)

An electronic device including:

a solid-state imaging device including a pixel array unit in which a plurality of pixels is arranged in a two-dimensional manner, in which the pixel includes a first photoelectric conversion unit, and a second photoelectric conversion unit having lower sensitivity than the first photoelectric conversion unit, and a size of the second photoelectric conversion unit in an optical axis direction in which light enters is smaller than a size of the first photoelectric conversion unit in the optical axis direction.

REFERENCE SIGNS LIST

10 CMOS image sensor
11 Pixel array unit
12 Vertical drive circuit
13 Column processing circuit
14 Horizontal drive circuit
15 Output circuit
16 Control circuit
17 Input/output terminal
100 and 100A to 100D Pixel
121-1 High-sensitivity photodiode
121-2 Low-sensitivity photodiode
122-1 First transfer transistor
122-3 Third transfer transistor
123 In-pixel capacitor (charge accumulation unit)
200 and 200A to 200F Pixel
221-1 High-sensitivity photodiode
221-2 Low-sensitivity photodiode
222-1 First transfer transistor
222-3 Third transfer transistor
223 In-pixel capacitor (charge accumulation unit)
300 and 300A to 300E Pixel
321-1 High-sensitivity photodiode
321-2 Low-sensitivity photodiode
322-1 First transfer transistor
322-3 Third transfer transistor
323, 323A, 323B In-pixel capacitor (charge accumulation unit)
341 Oxide film
400 and 400A to 400D Pixel
411-1, 411-2 On-chip lens
421-1 High-sensitivity photodiode
421-2 Low-sensitivity photodiode
500 and 500A to 500D Pixel
511, 511-1, 511-2 On-chip lens
521-1 High-sensitivity photodiode
521-2 Low-sensitivity photodiode
561 Memory unit
1000 Electronic device
1001 Solid-state imaging device

What is claimed is:

1. A solid-state imaging device, comprising:
a pixel array unit which comprises a plurality of pixels, wherein
each pixel of the plurality of pixels includes:

a first photoelectric conversion unit; and
a second photoelectric conversion unit having lower sensitivity than the first photoelectric conversion unit,
the second photoelectric conversion unit is in an outer periphery of the first photoelectric conversion unit,
the second photoelectric conversion unit is in a point-symmetrical region with respect to a center of the first photoelectric conversion unit as a symmetrical point,
a light incident side of a partial region of the second photoelectric conversion unit is shielded from light incident on the light incident side, and
the partial region is used as a memory unit to hold a charge.

2. The solid-state imaging device according to claim 1, wherein the first photoelectric conversion unit and the second photoelectric conversion unit are element-isolated by a light shielding film.

* * * * *